US008571236B2

(12) United States Patent
Yamada et al.

(10) Patent No.: US 8,571,236 B2
(45) Date of Patent: Oct. 29, 2013

(54) VOLUME CONTROL SYSTEM, CONTROLLER, AND AMPLIFYING APPARATUS

(75) Inventors: Takashi Yamada, Neyagawa (JP); Kazushige Otsu, Neyagawa (JP)

(73) Assignee: Onkyo Corporation, Neyagawa-shi (JP)

(*) Notice: Subject to any disclaimer, the term of this patent is extended or adjusted under 35 U.S.C. 154(b) by 549 days.

(21) Appl. No.: 12/861,956

(22) Filed: Aug. 24, 2010

(65) Prior Publication Data

US 2011/0211712 A1 Sep. 1, 2011

(30) Foreign Application Priority Data

Feb. 26, 2010 (JP) .................. 2010-042626
Jul. 7, 2010 (JP) .................. 2010-155141

(51) Int. Cl.
*H03G 3/00* (2006.01)

(52) U.S. Cl.
USPC ............ 381/109; 381/119; 381/98; 381/123; 381/77; 381/102; 381/103; 381/104; 381/105; 381/106; 381/107; 381/108; 709/203; 709/219; 709/224; 709/228; 709/229

(58) Field of Classification Search
USPC ................. 381/119, 98, 123, 77, 102–109; 709/203, 219, 224, 228–229
See application file for complete search history.

(56) References Cited

U.S. PATENT DOCUMENTS 7,224,811 B1 * 5/2007 Narusawa et al. ............ 381/119
7,457,424 B2 11/2008 Katayama et al.

(Continued)

FOREIGN PATENT DOCUMENTS

| EP | 1 061 657 A2 | 12/2000 |
|----|----|----|
| JP | 05-188981 | 7/1993 |
| JP | 09-149325 | 6/1997 |
| JP | 09-281982 | 10/1997 |

(Continued)

OTHER PUBLICATIONS

Avforums, onkyo webinterface programming, 2009.*

*Primary Examiner* — Davetta W. Goins
*Assistant Examiner* — Kuassi Ganmavo
(74) *Attorney, Agent, or Firm* — Renner, Otto, Boisselle & Sklar, LLP

(57) ABSTRACT

A volume control system comprises: an amplifying apparatus; and a controller connectable to the amplifying apparatus. The amplifying apparatus includes; a first receiving section for receiving a volume value from the controller, a first input section into which an instruction for changing the volume value is input by a user's operation, a first transmitting section for transmitting the volume value input into the first input section to the controller, and a volume control section for, when the first receiving section receives the volume value or the changed volume value is input into the first input section, controlling a volume value of the amplifying apparatus based on the volume value. The controller includes; a display section for displaying the volume value on a display device, a second receiving section for receiving the volume value from the amplifying apparatus, a changing section for changing the volume value to be displayed on the display device by the display section into the volume value received by the second receiving section; a second input section into which an instruction for changing the volume value to be displayed on the display device by the display section is input by a user's operation; and a second transmitting section for, when the instruction for changing the volume value to be displayed on the display device by the display section is input by the user's operation, transmitting the changed volume value to the amplifying apparatus.

10 Claims, 36 Drawing Sheets

(56) References Cited

U.S. PATENT DOCUMENTS

| | | | |
|---|---|---|---|
| 7,571,014 B1* | 8/2009 | Lambourne et al. | 700/94 |
| 7,634,532 B2* | 12/2009 | Kawamura et al. | 709/203 |
| 7,929,712 B2* | 4/2011 | Katayama | 381/104 |
| 8,064,827 B2 | 11/2011 | Hino et al. | |
| 2005/0010964 A1* | 1/2005 | Sano et al. | 725/134 |
| 2005/0276426 A1* | 12/2005 | Ono et al. | 381/104 |
| 2006/0193483 A1* | 8/2006 | Wood | 381/105 |
| 2007/0291955 A1 | 12/2007 | Yamashita et al. | |
| 2008/0292115 A1* | 11/2008 | Ding et al. | 381/104 |
| 2009/0138110 A1* | 5/2009 | Kohyama et al. | 700/94 |
| 2010/0054497 A1* | 3/2010 | Bull et al. | 381/104 |

FOREIGN PATENT DOCUMENTS

| | | |
|---|---|---|
| JP | 2000-356991 | 12/2000 |
| JP | 2001-044774 | 2/2001 |
| JP | 2001-237660 | 8/2001 |
| JP | 2002-157867 | 5/2002 |
| JP | 2002-218584 | 8/2002 |
| JP | 2002-223492 | 8/2002 |
| JP | 2005-031494 | 2/2005 |
| JP | 2006-350473 | 12/2006 |
| JP | 3902996 | 4/2007 |
| JP | 3902997 | 4/2007 |
| JP | 2007-324831 | 12/2007 |
| JP | 2009-100272 | 5/2009 |

* cited by examiner

VOLUME CONTROL SYSTEM, CONTROLLER, AND AMPLIFYING APPARATUS

BACKGROUND OF THE INVENTION

1. Field of the Invention

The present invention relates to a volume control system having an amplifying apparatus and a controller.

2. Description of the Related Art

AV amplifier is connected to PC via network such as LAN, and contents reproduction is controlled by control program (hereinafter, controllers) installed into the PC. Server program (hereinafter, servers) is also installed into the PC, and a plurality of audio files are recorded in HDD of the PC. When audio file recorded in the HDD is selected by users' operation, the controller transmits instruction for reproducing the selected audio files to the AV amplifier. The AV amplifier requests the server to transmit the selected audio files. The server reads the selected audio files from the HDD and transmits them to the AV amplifier. The AV amplifier decodes the audio files transmitted from the server, and amplifies them so as to output sounds through speaker.

When instruction for changing controller-side volumes value is input by users' mouse operation, the controller transmits the changed controller-side volume value to the AV amplifier. Accordingly, the AV amplifier controls the volume value at the time when the AV amplifier amplifies sound signals. Slide bar for changing the controller-side volume value by means of users' operation is provided to operation screen of the controller, and when the slide bar is moved, the controller-side volume value is changed so that the volume value of the AV amplifier is controlled. Therefore, it is demanded that the volume of the AV amplifier is suitably (namely, clearly for the users) is changed according to the changes in the controller-side volume values.

Further, when the user increases the controller-side volume value to maximum value (or around the maximum values) at a stroke, the volume value of the AV amplifier rises to the maximum values (or around the maximum values). As a result, amplifying circuit and speaker of the AV amplifier might be damaged.

With a volume control apparatus suggested in Japanese Patent Application 2009-281064 by the applicant of this application, as described above, a volume of an AV amplifier can be controlled according to a controller-side volume value transmitted from the controller. However, since the controller cannot recognize the volume value of the AV amplifier, when a user operates a volume knob or a remote controller of the AV amplifier to control the volume value of the AV amplifier, the controller-side volume value set in the controller becomes different from the actual volume value of the AV amplifier. As a result, the volume of the AV amplifier cannot be suitably changed according to a change in the controller-side volume value.

SUMMARY OF THE INVENTION

It is an object of the present invention to provide a volume control system that is capable of suitably changing a volume value of an amplifying apparatus according to a change in a controller-side volume value when the controller-side volume value is changed.

A volume control system according to the present invention includes an amplifying apparatus and a controller connectable to the amplifying apparatus. The amplifying apparatus comprises: a first receiving section for receiving a controller-side volume value from the controller; a first converting section for converting the controller-side volume value received by the first receiving section into an amplifier-side volume value; a first input section into which an instruction for changing the amplifier side-volume value is input by a user's operation; a second converting section for, when the instruction for changing the amplifier-side volume value is input by the user's operation, converting the changed amplifier-side volume value into the controller-side volume value; a first transmitting section for transmitting the controller-side volume value converted by the second converting section to the controller; and a volume control section for, when the first receiving section receives the controller-side volume value or the changed amplifier-side volume value is input into the first input section, controlling a volume of the amplifying apparatus based on the amplifier-side volume value. The controller comprises: a display section for displaying a controller-side volume value on a display device, a second receiving section for receiving a controller-side volume value from the amplifying apparatus, a changing section for changing the controller-side volume value to be displayed on the display device by the display section into the controller-side volume value received by the second receiving section, a second input section into which an instruction for changing the controller-side volume value to be displayed on the display device by the display section is input by a user's operation, and a second transmitting section for, when the instruction for changing the controller-side volume value to be displayed on the display device by the display section is input by the user's operation, transmitting the changed controller-side volume value to the amplifying apparatus.

In the amplifying apparatus, when the changed amplifier-side volume value is input, the volume value of the amplifying apparatus is controlled based on the amplifier-side input volume value, and the second converting section converts the amplifier-side volume value into the controller-side volume value. The first transmitting section transmits the controller-side volume value to the controller. In the controller, when the second receiving section receives the controller-side volume value, the changing section changes a controller-side volume value to be displayed on the display device by the display section into the received controller-side volume value. On the other hand, when the controller-side volume value is input into the second input section, the changing section changes a controller-side volume value to be displayed on the display device by the display section into the controller-side input volume value, and the second transmitting section transmits the controller-side volume value input into the second input section to the amplifying apparatus. In the amplifying apparatus, when the first receiving section receives the controller-side volume value from the controller, the first converting section converts the controller-side volume value into the amplifier-side volume value, so that the volume value of the amplifying apparatus is controlled based on the amplifier-side volume value. In such a manner, the controller-side volume value is posted between the amplifying apparatus and the controller, so that the controller-side volume value managed by both of them can be always set to the same value. Therefore, when the controller-side volume value is changed, the amplifier-side volume value can be changed into a suitable value.

In the preferred embodiment of the present invention, the first converting section converts the controller-side volume value into an amplifier-side volume value based on a controller-side maximum volume value, a controller-side minimum volume value, an amplifier-side maximum volume value as a maximum value of an amplifier-side volume value controllable by the first input section, and an amplifier-side minimum volume value as a minimum value of an amplifier-side volume value controllable by the first input section, the second converting section converts the amplifier-side volume value into the controller-side volume value based on the controller-side maximum volume value, the controller-side minimum volume value, the amplifier-side maximum volume value, and the amplifier-side minimum volume value.

In the preferred embodiment of the present invention, the first converting section converts the controller-side volume value into the amplifier-side volume value based on a controller-side maximum volume value, a controller-side minimum volume value, an amplifier-side setting maximum volume value that is a maximum value of an amplifier-side volume value controllable by the controller and is smaller than the amplifier-side maximum volume value as the maximum value of the amplifier-side volume value controllable by the first input section, and an amplifier-side setting minimum volume value (or the amplifier-side minimum volume value) that is a minimum value of an amplifier-side volume value controllable by the controller and is larger than the amplifier-side minimum volume value as the minimum value of the amplifier-side volume value controllable by the first input section, the second converting section converts the amplifier-side volume value into the controller-side volume value based on the controller-side maximum volume value, the controller-side minimum volume value, the amplifier-side setting maximum volume value, and the amplifier-side setting minimum volume value (or the amplifier-side minimum volume value).

In this case, even when the controller-side volume value is changed into a controller-side maximum volume value, the amplifier-side volume value does become an amplifier-side maximum volume value or more. For this reason, the amplifier and the speaker can be prevented from being damaged.

In the preferred embodiment of the present invention, the controller further comprises: a storage section for storing the controller-side volume value to be displayed on the display device by the display section at the time of disconnection between the controller and the amplifying apparatus in a storage device, wherein when the controller and the amplifying apparatus are connected to each other, the changing section changes a controller-side volume value to be displayed on the display device by the display section into the controller-side volume value stored by the storage section, and the second transmitting section transmits the controller-side volume value stored by the storage section to the amplifying apparatus.

A volume control system according to the present invention includes an amplifying apparatus and a controller connectable to the amplifying apparatus. The amplifying apparatus comprises: a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, and a volume control section for, when the first receiving section receives the amplifier-side volume value or the changed amplifier-side volume value is input into the first input section, controlling a volume value of the amplifying apparatus based on the amplifier-side volume value. The controller comprises: a display section for displaying a controller-side volume value on a display device; a second receiving section for receiving the amplifier-side volume value from the amplifying apparatus; a first changing section for converting the amplifier-side volume value received by the second receiving section into the controller-side volume value; a changing section for changing the controller-side volume value to be displayed on the display device by the display section into the controller-side volume value converted by the first converting section; a second input section into which an instruction for changing the controller-side volume value to be displayed on the display device by the display section is input by a user's operation; a second converting section for, when the instruction for changing the controller-side volume value to be displayed on the display device by the display section is input by the user's operation, converting the changed controller-side volume value into the amplifier-side volume value; and a second transmitting section for transmitting the amplifier-side volume value converted by the second converting section to the amplifying apparatus.

On the amplifying apparatus side, when the amplifier-side volume value is input into the first input section, the volume value of the amplifying apparatus is controlled based on the input amplifier-side volume value, and the first transmitting section transmits the amplifier-side volume value to the controller. On the controller side, when the second receiving section receives the amplifier-side volume value, the first converting section converts the amplifier-side volume value into the controller-side volume value, and the changing section changes the controller-side volume value to be displayed on the display device by the display section into the controller-side volume value converted by the first converting section. On the other hand, when the controller-side volume value is input into the second input section, the changing section changes the controller-side volume value to be displayed on the display device by the display section into the controller-side volume value input into the second input section. Further, the second converting section converts the controller-side volume value into the amplifier-side volume value, and the second transmitting section transmits the amplifier-side volume value converted by the second converting section to the amplifying apparatus. When the first receiving section receives the amplifier-side volume value from the controller, the amplifying apparatus controls the volume value of the amplifying apparatus based on the received amplifier-side volume value. In such a manner, the amplifier-side volume value is posted between the amplifying apparatus and the controller, so that the amplifier-side volume value managed by both of them can be always set to the same value. Therefore, when the controller-side volume value is changed, the amplifier-side volume value can be changed into a suitable value.

In the preferred embodiment of the present invention, the first converting section converts the amplifier-side volume value into the controller-side volume value based on a controller-side maximum volume value, a controller-side minimum volume value, an amplifier-side maximum volume value as a maximum value of an amplifier-side volume value controllable by the first input section, and an amplifier-side minimum volume value as a minimum value of an amplifier-side volume value controllable by the first input section, the second converting section converts the controller-side volume value into the amplifier-side volume value based on the controller-side maximum volume value, the controller-side minimum volume value, the amplifier-side maximum volume value, and the amplifier-side minimum volume value.

In the preferred embodiment of the present invention, the first converting section converts the amplifier-side volume value into the controller-side volume value based on a controller-side maximum volume value, a controller-side minimum volume value, an amplifier-side setting maximum volume value that is a maximum value of an amplifier-side volume value controllable by the controller and is smaller than an amplifier-side maximum volume value as a maximum value of an amplifier-side volume value controllable by the first input section, and an amplifier-side setting minimum volume value (or the amplifier-side minimum volume value) that is a minimum value of an amplifier-side volume value controllable by the controller and is larger than an amplifier-side minimum volume value as a minimum value of the amplifier-side volume value controllable by the first input section, the second converting section converts the controller-side volume value into the amplifier-side volume value based on the controller-side maximum volume value, the controller-side minimum volume value, the amplifier-side setting maximum volume value, and the amplifier-side setting minimum volume value (or the amplifier-side minimum volume value).

In this case, even when the controller-side volume value is changed into the controller-side maximum volume value, the amplifier-side volume value does not become the amplifier-side maximum volume value or more. For this reason, the amplifier and the speaker can be prevented from being damaged.

In the preferred embodiment of the present invention, the controller further comprising: a storage section for storing the controller-side volume value to be displayed on the display device by the display section at the time of disconnection between the controller and the amplifying apparatus in a storage device, wherein when the controller and the amplifying apparatus are connected to each other, the changing section changes a controller-side volume value to be displayed on the display device by the display section into the controller-side volume value stored by the storage section, the second converting section converts the controller-side volume value stored by the storage section into the amplifier-side volume value, and the second transmitting section transmits the amplifier-side volume value to the amplifying apparatus.

A volume control system according to the present invention includes an amplifying apparatus and a controller connectable to the amplifying apparatus. The amplifying apparatus comprises: a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, a volume control section for, when the first receiving section receives the amplifier-side volume value or the changed amplifier-side volume value is input into the first input section, controlling a volume value of the amplifying apparatus based on the amplifier-side volume value, and a second transmitting section for transmitting an amplifier-side maximum volume value as a maximum value of an amplifier-side volume value controllable by the first input section, and an amplifier-side minimum volume value as a minimum value of the amplifier-side volume value controllable by the first input section to the controller. The controller comprises: a storage section for storing a controller-side volume value in a storage device; a second receiving section for receiving the amplifier-side volume value, the amplifier-side maximum volume value, and the amplifier-side minimum volume value from the amplifying apparatus; a display section for changing a controller-side maximum volume value into the amplifier-side maximum volume value and changing a controller-side minimum volume value into the amplifier-side minimum volume value so as to display the amplifier-side volume value instead of the controller-side volume value on a display device; a changing section for changing the amplifier-side volume value to be displayed on the display device by the display section into the amplifier-side volume value received by the second receiving section; a second input section into which an instruction for changing the amplifier-side volume value to be displayed on the display device by the display section is input by a user's operation; and a second transmitting section for, when the instruction for changing the amplifier-side volume value to be displayed on the display device by the display section is input by the user's operation, transmitting the changed amplifier-side volume value to the amplifying apparatus.

In this case, not the controller-side volume value but the amplifier-side volume value can be input into the controller by a user's operation, the amplifier-side volume value and the controller-side volume value do not have to be converted, and processes of the controller and the amplifier apparatus are simplified. Further, since the controller displays the amplifier-side volume value, the user operates the second input section so that the user can easily understand how much the amplifier-side volume value is changed.

In the preferred embodiment of the present invention, the controller further comprising: a second storage section for storing the amplifier-side volume value to be displayed on the display device by the display section at the time of disconnection between the controller and the amplifying apparatus in a storage device, wherein when the controller and the amplifying apparatus are connected to each other, the changing section changes the amplifier-side volume value to be displayed on the display device by the display section into the amplifier-side volume value stored by the second storage section, and the second transmitting section transmits the amplifier-side volume value stored by the second storage section to the amplifying apparatus.

A volume control system according to the present invention includes an amplifying apparatus and a controller connectable to the amplifying apparatus. The amplifying apparatus comprises: a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, a volume control section for, when the first receiving section receives the amplifier-side volume value or the changed amplifier-side volume value is input into the first input section, controlling a volume value of the amplifying apparatus based on the amplifier-side volume value, and a second transmitting section for transmitting an amplifier-side setting maximum volume value that is a maximum value of an amplifier-side volume value controllable by the controller and is smaller than an amplifier-side maximum volume value as a maximum value of an amplifier-side volume value controllable by the first input section, and an amplifier-side setting minimum volume value (or the amplifier-side minimum volume value) that is a minimum value of an amplifier-side volume value controllable by the controller and is larger than an amplifier-side minimum volume value as a minimum value of an amplifier-side volume value controllable by the first input section to the controller. The controller comprises: a storage section for storing a controller-side volume value in a storage device; a second receiving section for receiving the amplifier-side volume value, the amplifier-side setting maximum volume value, and the amplifier-side setting minimum volume value (or the amplifier-side minimum volume value) from the amplifying apparatus; a display section for changing a controller-side maximum volume value into the amplifier-side setting maximum volume value and changing a controller-side minimum volume value into the amplifier-side setting minimum volume value (or the amplifier-side minimum volume value) so as to display the amplifier-side volume value instead of the controller-side volume value on a display device; a changing section for changing the amplifier-side volume value to be displayed on the display device by the display section into the amplifier-side volume value received by the second receiving section; a second input section into which an instruction for changing the amplifier-side volume value to be displayed on the display device by the display section is input by a user's operation; and a second transmitting section for, when the instruction for changing the amplifier-side volume value to be displayed on the display device by the display section is input by the user's operation, transmitting the changed amplifier-side volume value to the amplifying apparatus.

In this case, not the controller-side volume value but the amplifier-side volume value can be input into the controller by a user's operation. For this reason, the amplifier-side volume value and the controller-side volume value do not have to be converted, and the processes of the controller and the amplifying apparatus are simplified. Further, since the controller displays the amplifier-side volume value, the user operates the second input section and easily understands how much the amplifier-side volume value is changed. Further, since the amplifier-side volume value is not changed into more than an amplifier-side setting maximum volume value by the controller, the amplifier and the speaker can be prevented from being damaged.

In the preferred embodiment of the present invention, the controller further comprising: a second storage section for storing the amplifier-side volume value to be displayed on the display device by the display section at the time of disconnection between the controller and the amplifying apparatus in a storage device, wherein when the controller and the amplifying apparatus are connected to each other, the changing section changes the amplifier-side volume value to be displayed on the display device by the display section into the amplifier-side volume value stored by the second storage section, and the second transmitting section transmits the amplifier-side volume value stored by the second storage section to the amplifying apparatus.

A volume control system according to the present invention includes an amplifying apparatus and a controller connectable to the amplifying apparatus. The amplifying apparatus includes; a first receiving section for receiving a volume value from the controller, a first input section into which an instruction for changing the volume value is input by a user's operation, a first transmitting section for transmitting the volume value input into the first input section to the controller, and a volume control section for, when the first receiving section receives the volume value or the changed volume value is input into the first input section, controlling a volume value of the amplifying apparatus based on the volume value. The controller includes; a display section for displaying the volume value on a display device, a second receiving section for receiving the volume value from the amplifying apparatus, a changing section for changing the volume value to be displayed on the display device by the display section into the volume value received by the second receiving section; a second input section into which an instruction for changing the volume value to be displayed on the display device by the display section is input by a user's operation; and a second transmitting section for, when the instruction for changing the volume value to be displayed on the display device by the display section is input by the user's operation, transmitting the changed volume value to the amplifying apparatus.

On the amplifying apparatus side, when a volume value is input into the first input section, the volume value of the amplified apparatus is controlled based on the input volume value, and the first transmitting section transmits the volume value to the controller. On the controller side, when the second receiving section receives the volume value, the changing section changes the volume value to be displayed on the display device by the display section into the received volume value. On the other hand, when the volume value is input into the second input section, the changing section changes the volume value to be displayed on the display device by the display section into the volume value input into the second input section. The second transmitting section transmits the volume value input into the second input section to the amplifying apparatus. On the amplifying apparatus, when the first receiving section receives the volume value from the controller, the volume value of the amplifying apparatus is controlled based on the received volume value. In such a manner, the volume value is posted between the amplifying apparatus and the controller, so that the volume value managed by both of them can be set to the same value. Therefore, when the volume value is changed, the amplifier-side volume value can be changed into a suitable value.

In the preferred embodiment of the present invention, a plurality of amplifying apparatuses can be connected to the controller, the first transmitting section of a first amplifying apparatus in the plurality of amplifying apparatuses transmits the volume value input into the first input section to the controller, the changing section changes the volume value to be displayed on the display device by the display section into the volume value received from the first amplifying apparatus, and the second transmitting section transmits the changed volume value to the amplifying apparatuses other than the first amplifying apparatus, the volume control sections of the amplifying apparatuses other than the first amplifying apparatus control the volume values of the amplifying apparatuses based on the received volume value.

In the preferred embodiment of the present invention, a plurality of amplifying apparatuses can be connected to the controller, the first transmitting sections of the respective amplifying apparatuses transmit the self volume values at the time of the connection to the controller, the controller select one of the volume values of the amplifying apparatuses, the changing section changes the volume value to be displayed on the display device by the display section into the selected volume value, and the second transmitting section transmits the changed volume value to the amplifying apparatuses having the volume values being not selected, the volume control sections of the amplifying apparatuses whose volume values are not selected control the volume values based on the received volume value.

In the preferred embodiment of the present invention, a plurality of controllers can be connected to the amplifying apparatus, in one of the controllers, when an instruction for changing the volume value to be displayed on the display device by the display section is input by a user's operation, the changed volume value is transmitted to the amplifying apparatus, in the amplifying apparatus, the volume control section controls the volume value of the amplifying apparatus based on the received volume value, and the first transmitting section transmits the volume value to the controllers other than the controller that transmits the volume value, in the controllers other than the controller that transmits the volume value, the changing section changes the volume value to be displayed on the display device by the display section into the volume value received from the amplifying apparatus.

In the preferred embodiment of the present invention, a plurality of controllers can be connected to the amplifying apparatus, in one of the controllers, when an instruction for changing the volume value to be displayed on the display device by the display section is input by a user's operation, the changed volume value is transmitted to the amplifying apparatus and the other controllers, in the amplifying apparatus, the volume control section controls the volume value of the amplifying apparatus based on the received volume value, in the controllers other than the controller whose volume value is transmitted, the changing section changes the volume value to be displayed on the display device by the display section into the volume value received from the controller.

In the preferred embodiment of the present invention, when the amplifying apparatus is connected to the controller, the first transmitting section transmits the volume value of the amplifying apparatus to the controller.

Therefore, when the amplifying apparatus and the controller are connected to each other, the volume value managed by both of them can be set to the same value. Therefore, when the volume value is changed, the amplifier-side volume value can be changed into a suitable value.

In the preferred embodiment of the present invention, the controller further comprising: a storage section for storing the volume value to be displayed on the display device by the display section at the time of disconnection between the controller and the amplifying apparatus in a storage device, wherein when the controller and the amplifying apparatus are connected to each other, the changing section changes the volume value to be displayed on the display device by the display section into the volume value stored by the storage section, and the second transmitting section transmits the volume value stored by the storage section to the amplifying apparatus.

When the controller and the amplifying apparatus are disconnected, the controller stores the volume value displayed on the display section. When the controller and the amplifying apparatus are connected to each other, the changing section changes the volume value to be displayed on the display section into the stored volume value, and the second transmitting section transmits the stored volume value to the amplifying apparatus. On the amplifying apparatus side, when the first receiving section receives the volume value from the controller, the volume control section controls the volume value based on the received volume value. Therefore, even when the volume value of the amplifying apparatus is changed with the controller and the amplifying apparatus not being connected to each other, the volume value can be reset to the volume value stored at the time of disconnecting the controller and the amplifying apparatus.

In the preferred embodiment of the present invention, a plurality of amplifying apparatuses can be connected to the controller, the storage section stores the volume value to be displayed on the display device by the display section at the time of disconnection between the controller and the amplifying apparatus in each of the plurality of the amplifying apparatuses, when the controller and the amplifying apparatus are connected to each other, the changing section changes the volume value to be displayed on the display device by the display section into the volume value stored by the storage section in association with the connected amplifying apparatus, when the controller and the amplifying apparatus are connected to each other, the second transmitting section transmits the volume value stored by the storage section in association with the connected amplifying apparatus to the amplifying apparatus.

A volume control system according to the present invention includes an amplifying apparatus and a controller connectable to the amplifying apparatus. The amplifying apparatus comprises a first receiving section for receiving a controller-side volume value from the controller, a first converting section for converting the controller-side volume value received by the first receiving section into an amplifier-side volume value, a first input section into which an instruction for changing the amplifier-side volume value is input by a user's operation, a first transmitting section for, when the instruction for changing the amplifier-side volume value is input by the user's operation, transmitting the amplifier-side volume value to the controller, and a volume control section for, when the first receiving section receives the controller-side volume value or the changed amplifier-side volume value is input into the first input section, controlling a volume value of the amplifying apparatus based on the amplifier-side volume value. The controller comprises: a display section for displaying the controller-side volume value on a display device; a second receiving section for receiving the amplifier-side volume value from the amplifying apparatus; a second converting section for converting the amplifier-side volume value received by the second receiving section into the controller-side volume value; a changing section for changing the controller-side volume value to be displayed on the display device by the display section into the controller-side volume value converted by the second converting section; a second input section into which an instruction for changing the controller-side volume value to be displayed on the display device by the display section is input by a user's operation; and a second transmitting section for, when the instruction for changing the controller-side volume value to be displayed on the display device by the display section is input by the user's operation, transmitting the changed controller-side volume value to the amplifying apparatus.

In the preferred embodiment of the present invention, the controller according to claim 39, further comprises: a storage section for storing the controller-side volume value to be displayed on the display device by the display section at the time of disconnection between the controller and the amplifying apparatus in a storage device, wherein when the controller and the amplifying apparatus are connected to each other, the changing section changes the controller-side volume value to be displayed on the display device by the display section into the controller-side volume value stored by the storage section, and the second transmitting section transmits the controller-side volume value stored by the storage section to the amplifying apparatus.

A volume control system according to the present invention includes an amplifying apparatus and a controller connectable to the amplifying apparatus. The amplifying apparatus comprises a first receiving section for receiving an amplifier-side volume value from the controller, a first input section into which an instruction for changing the amplifier-side volume value is input by a user's operation, a first converting section for, when the instruction for changing the amplifier-side volume value is input by the user's operation, converting the changed amplifier-side volume value into the controller-side volume value, a first transmitting section for transmitting the controller-side volume value converted by the first converting section to the controller, and a volume control section for, when the first receiving section receives the amplifier-side volume value or the changed amplifier-side volume value is input into the first input section, controlling a volume value of the amplifying apparatus based on the amplifier-side volume value. The controller comprises: a display section for displaying the controller-side volume value on a display device; a second receiving section for receiving the controller-side volume value from the amplifying apparatus; a changing section for changing the controller-side volume value to be displayed on the display device by the display section into the controller-side volume value received by the second receiving section; a second input section into which an instruction for changing the controller-side volume value to be displayed on the display device by the display section is input by a user's operation; a second converting section for, when the instruction for changing the controller-side volume value to be displayed on the display device by the display section is input by the user's operation, converting the changed controller-side volume value into the amplifier-side volume value; and a second transmitting section for transmitting the amplifier-side volume value converted by the second converting section to the amplifying apparatus.

In the preferred embodiment of the present invention, the controller according to claim 44, further comprises: a storage section for storing the controller-side volume value to be displayed on the display device by the display section at the time of disconnection between the controller and the amplifying apparatus in a storage device, wherein when the controller and the amplifying apparatus are connected to each other, the changing section changes the controller-side volume value to be displayed on the display device by the display section into the controller-side volume value stored by the storage section, the second converting section converts the controller-side volume value stored by the storage section into the amplifier-side volume value, and the second transmitting section transmits the amplifier-side volume value converted by the second converting section to the amplifying apparatus.

DETAILED DESCRIPTION OF THE PREFERRED EMBODIMENTS

Preferred embodiments of the present invention are described concretely below with reference to the drawings, but the present invention is not limited to these embodiments.

First Embodiment

Figure 1:
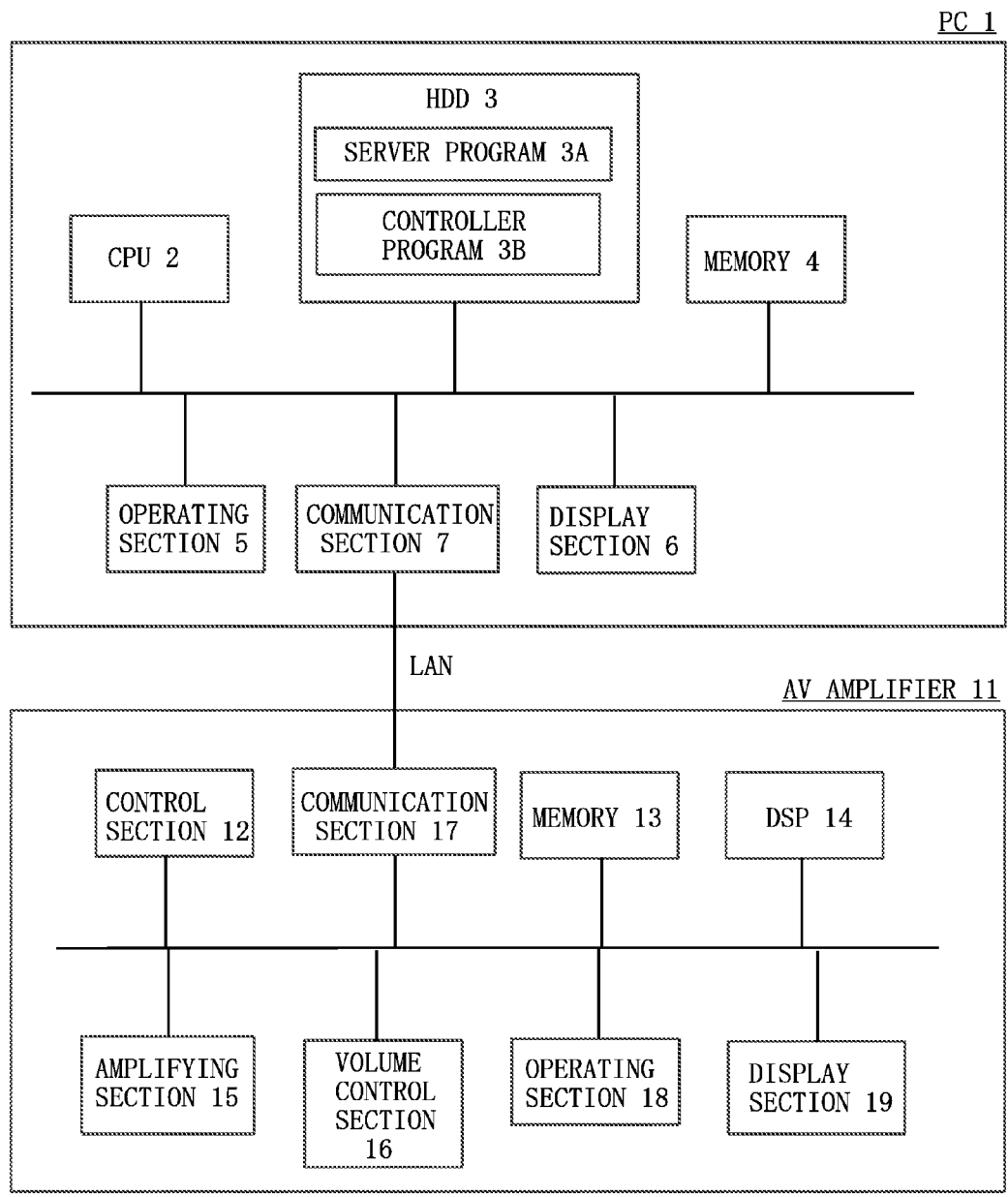
FIG. 1 is a block diagram illustrating PC and an AV amplifier according to a preferred embodiment of the present invention.

As shown in FIG. 1, a volume control system of the present invention has a PC 1 and an amplifying apparatus 11 such as an AV amplifier (referred to also as an AV receiver). They can be connected to each other via a network such as LAN. Further, they may be connected to each other via an electric communication line such as HDMI, IEEE394, USB or Internet.

The PC 1 includes a CPU 2, an HDD 3, a memory (ROM, RAM etc.) 4, an operating section 5, a display section 6, and a communication section 7. The CPU 2 controls the respective sections of the PC 1 based on OS or another program recorded in the HDD 3. The HDD 3 installs a server program (hereinafter, a server) 3A and a controller program (hereinafter, a controller) 3B. These programs are developed in the memory 4 so as to be executed by the CPU 2. A plurality of contents data are recorded in the HDD 3. The contents data are audio data, and in this example, they are audio files. When the server 3A receives a request for transmitting an audio file from the AV amplifier 11, the server 3A reads the audio file from the HDD so as to transmit it to the AV amplifier 11 via LAN.

The controller 3B controls reproduction of contents in the AV amplifier 11. When an audio file to be reproduced is selected from the audio files recorded in the HDD 3 by a user's operation, the controller 3B transmits an instruction for reproducing the selected audio file to the AV amplifier 11 via LAN.

The controller 3B stores a controller-side volume value in the memory 4. The controller-side volume value is a volume value managed by the controller 3B in order to control a volume value of the AV amplifier 11 on the controller 3B side. When an instruction for changing the controller-side volume value is input by a user's operation, the controller 3B transmits the changed controller-side volume value to the AV amplifier 11 so as to change the volume value of the AV amplifier 11.

Figure 2:
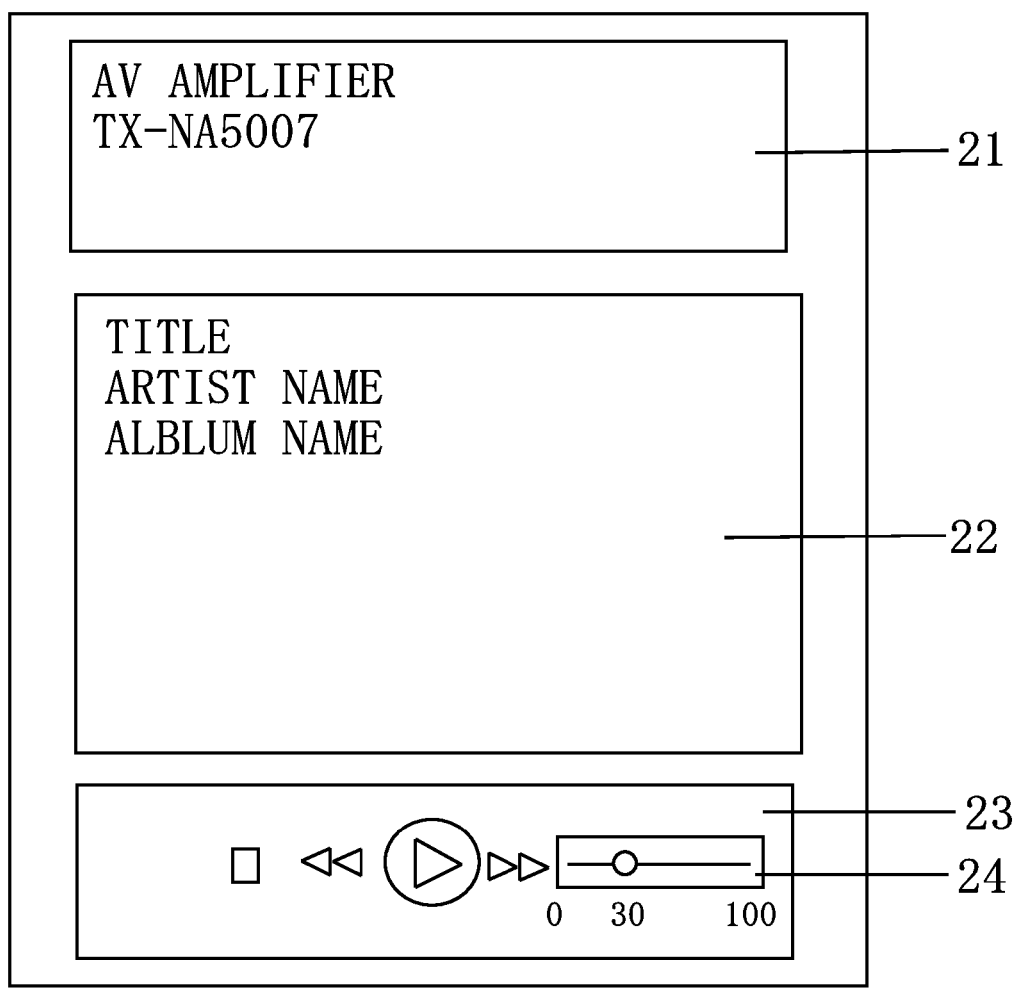
FIG. 2 is a diagram illustrating an operation screen of a controller.

FIG. 2 is a diagram illustrating an operation screen of the controller 3B. The operation screen includes an area 21 showing the AV amplifier 11 to be controlled, an area 22 showing an audio file to be reproduced by the AV amplifier 11, and an area 23 showing various operating buttons. The area 23 includes a slide bar 24 showing a controller-side volume value. The controller-side volume value can be changed within a range from a controller-side minimum volume value to a controller-side maximum volume value (not particularly limited, but for example, 0 to 100) by moving the slide bar. The controller-side minimum volume value and the controller-side maximum volume value are registered in the memory 4 in advance.

User's operations are input into the operating section 5, and the operating section 5 is, for example, a mouse, a keyboard, and a remote controller. The display section 6 displays the operation screen of the controller 3B, and is, for example, LCD. The communication section 7 communicates with the AV amplifier 11 via LAN, and is, for example, a LAN interface.

The AV amplifier 11 includes a control section 12, a memory (ROM, RAM. etc.) 13, a DSP 14, an amplifying section 15, a volume control section 16, a communication section 17, an operating section 18, and a display section 19. The control section 12 executes respective processes, described later, based on operating programs of the AV amplifier stored in the memory 13, and is, for example, a microcomputer. When the control section 12 receives the instruction for reproducing an audio file from the controller 3B, the control section 12 requests the server 3A to transmit the audio file.

The communication section 17 communicates with the PC 1 via LAN, and is, for example, a LAN interface. When the communication section 17 receives the audio file from the server 3B, the DSP 14 decodes and D/A-converts the audio file, so as to generate an analog audio signal. The volume control section 16 controls a volume value of the audio signal, and the amplifying section 15 amplifies the audio signal so as to output a sound from a speaker connected to the outside. User's operations are input into the operating section 18, and the operating section 18 is, for example, an operating button or a remote controller. The operating section 18 includes a volume control knob for changing a volume value of the volume control section 16 (an amplifier-side volume value VA). The display section 19 displays the amplifier-side volume value VA, and is, for example, an FL tube.

When the control section 12 receives the controller-side volume value VC from the controller 3B, the control section 12 converts the controller-side volume value VC into the amplifier-side volume value VA, and allows the volume control section 16 to change the volume. Further, when the amplifier-side volume value is changed by a user's operation of the volume control knob or the remote controller, the control section 12 changes the changed amplifier-side volume value into the controller-side volume value so as to transmit it to the controller 3B. When the controller 3B receives the controller-side volume value, the controller 3B changes the controller-side volume value stored in the memory 4 into the received value, and the slide bar is moved to the controller-side volume value. As a result, also when the amplifier-side volume value is changed by the user's operation of the volume control knob or the remote controller, the controller-side volume value managed by the controller 3B can be changed. As a result, the controller-side volume value is changed by the user's operation, so that the amplifier-side volume value can be suitably changed.

Figure 3:
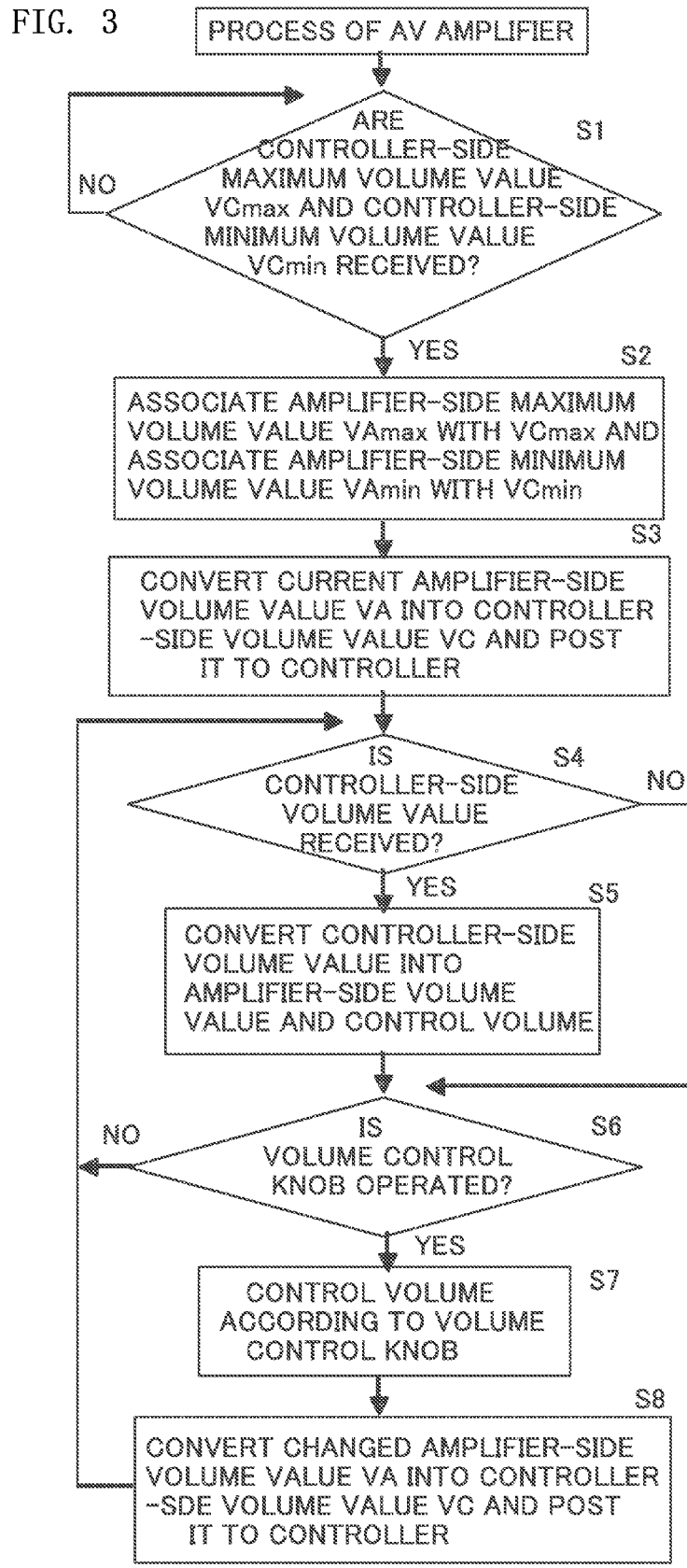
FIG. 3 is a flowchart illustrating a process of a control section of the AV amplifier.
Figure 4:
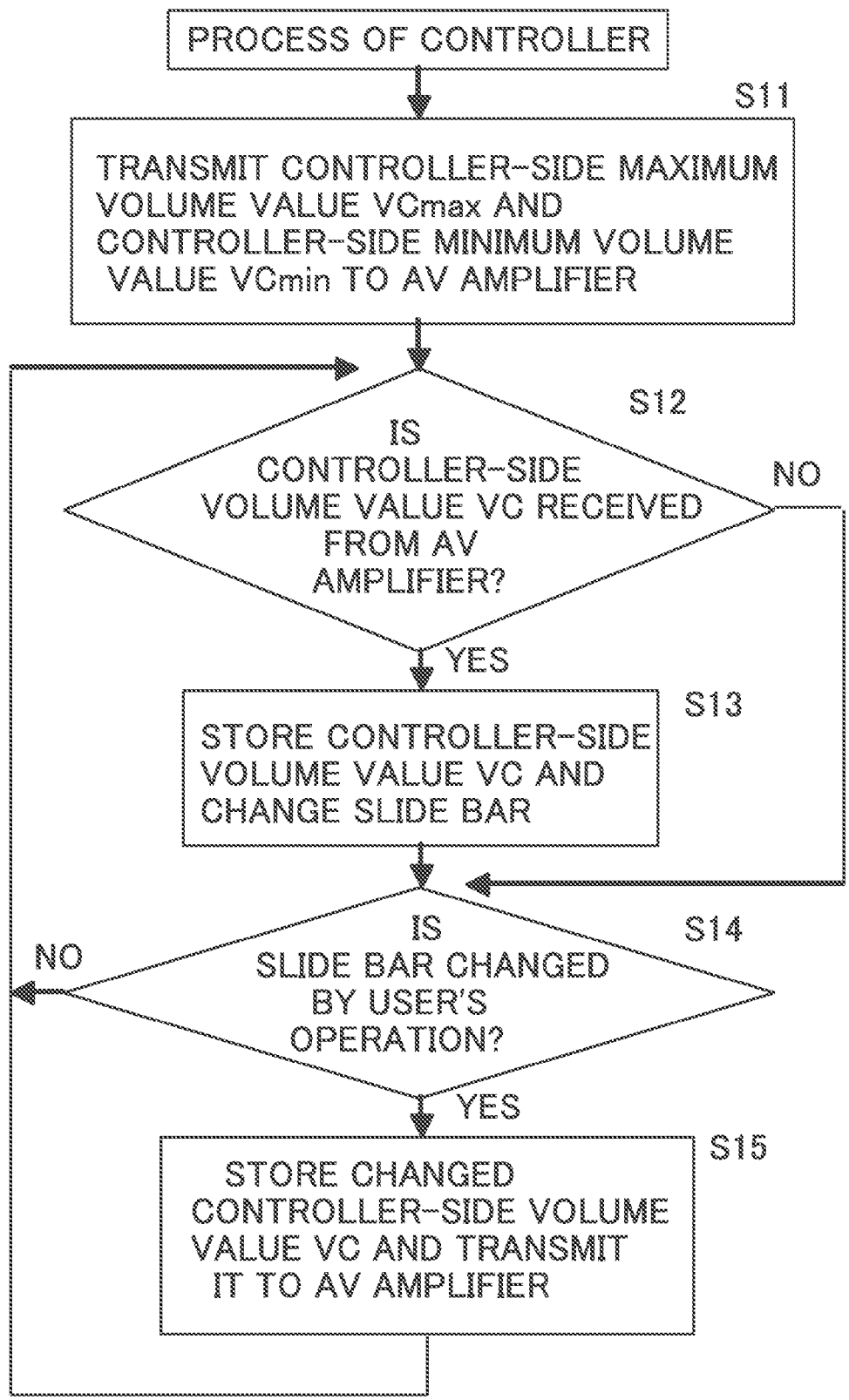
FIG. 4 is a flowchart illustrating a process of the controller.

An operation in this example is described below. FIG. 3 is a flowchart illustrating a process of the control section 12 of the AV amplifier 11, and FIG. 4 is a flowchart illustrating a process of the controller 3B. As shown in FIG. 4, when the AV amplifier 11 is selected from devices connected to LAN, for example, by the user's operation and the AV amplifier 11 is connected, the controller 3B transmits a controller-side maximum volume value VCmax (in this example, 100) and a controller-side minimum volume value VCmin (in this example, 0) to the AV amplifier 11 (S11).

The control section 12 of the AV amplifier 11 determines whether or not the controller-side maximum volume value VCmax and the controller-side minimum volume value VCmin are received as shown in FIG. 3 (S1). When they are received (YES in S1), the control section 12 associates an amplifier-side maximum volume value VAmax with the controller-side maximum volume value VCmax and associates an amplifier-side minimum volume value VAmin with the controller-side minimum volume value VCmin so as to store them in the memory 13 (S2). The amplifier-side maximum volume value VAmax is a maximum volume value of the volume control section 16 that can be changed according to a user's operation of the operating section 18, and not particularly limited but is 0 (dB) in this example. The amplifier-side minimum volume value VAmin is a minimum volume value of the volume control section 16 that can be changed according to a user's operation of the operating section 18, and not particularly limited but is −50 (dB). These values are registered in the memory 13 in advance.

The control section 12 converts a current amplifier-side volume value VA into a controller-side volume value VC, and posts it to the controller 3B (S3). In detail, the control section 12 calculates the controller-side volume value VC based on the following formula 1. For example, when the amplifier-side volume value VA is −20 (dB), the controller-side volume value VC becomes 60.

$$VC = \{(VA - VAmin)(VCmax - VCmin)/(VAmax - VAmin)\} + VCmin \quad \text{[Mathematical Formula 1]}$$

As shown in FIG. 4, the controller 3B determines whether or not the controller-side volume value is received from the AV amplifier 11 (S12). When it is not received (NO in S12), the sequence goes to S14. When it is received (YES in S12), the controller 3B stores the received controller-side volume value VC in the memory 4, and then changes the slide bar based on the received controller-side volume value VC (S13). When the received controller-side volume value VC is 60, the slide bar is moved to 60.

The controller 3B determines whether or not the slide bar is moved by a user's operation (S14). When it is not moved (NO in S14), the sequence returns to S12. When it is moved (YES in S14), the controller 3B stores the controller-side volume value VC determined by the position of the moved slide bar into the memory 4, and transmits the controller-side volume value VC to the AV amplifier 11 (S15).

As shown in FIG. 3, the control section 12 of the AV amplifier 11 determines whether or not the controller-side volume value VC is received (S4). When it is not received (NO in S4), the sequence goes to S6. When it is received (YES in S4), the control section 12 converts the received controller-side volume value VC into the amplifier-side volume value, and allows the volume control section 16 to change the volume (S5). Concretely, the control section 12 calculates the amplifier-side volume value based on the following formula 2. For example, when the controller-side volume value VC is 80, the amplifier-side volume value VA becomes −10 (dB).

$$VA=\{(VC-VC\min)(VA\max-VA\min)/(VC\max-VC\min)\}+VA\min \quad \text{[Mathematical Formula 2]}$$

Thereafter, the control section 12 determines whether or not the volume control knob (or the volume control button of the remote controller) is operated by the user (S6). That is to say, the determination is made whether or not an instruction for changing the amplifier-side volume value VA is input by the user's operation. When it is not operated (NO in S6), the sequence returns to S4. When it is operated (YES in S6), the control section 12 changes the volume of the volume control section 16 into the amplifier-side volume value VA according to an operating position of the volume control knob (S7). The control section 12 changes the changed amplifier side volume value VA into the controller-side volume value VC based on the above formula 1, and posts it to the controller 3B (S8).

Similarly to the above, the controller 3B determines whether or not the controller-side volume value is received from the AV amplifier 11 (S12). When it is received (YES in S12), the controller 3B stores the received controller-side volume value VC into the memory 4, and changes the slide bar based on the received controller-side volume value VC (S13).

When the controller-side volume value is posted between the control section 12 of the AV amplifier 11 and the controller 3B, the controller-side volume value VC managed by both of them can be always set to be the same value. Therefore, when the controller-side volume value is changed, the amplifier-side volume value VA can be changed into a suitable value. When the controller 3B and the AV amplifier 11 are connected to each other, the controller-side volume value of the controller 3B is transmitted to the AV amplifier 11, and the amplifier-side volume value of the AV amplifier 11 may be matched with the controller-side volume value. The same holds for the following other embodiments.

Second Embodiment

Figure 5:
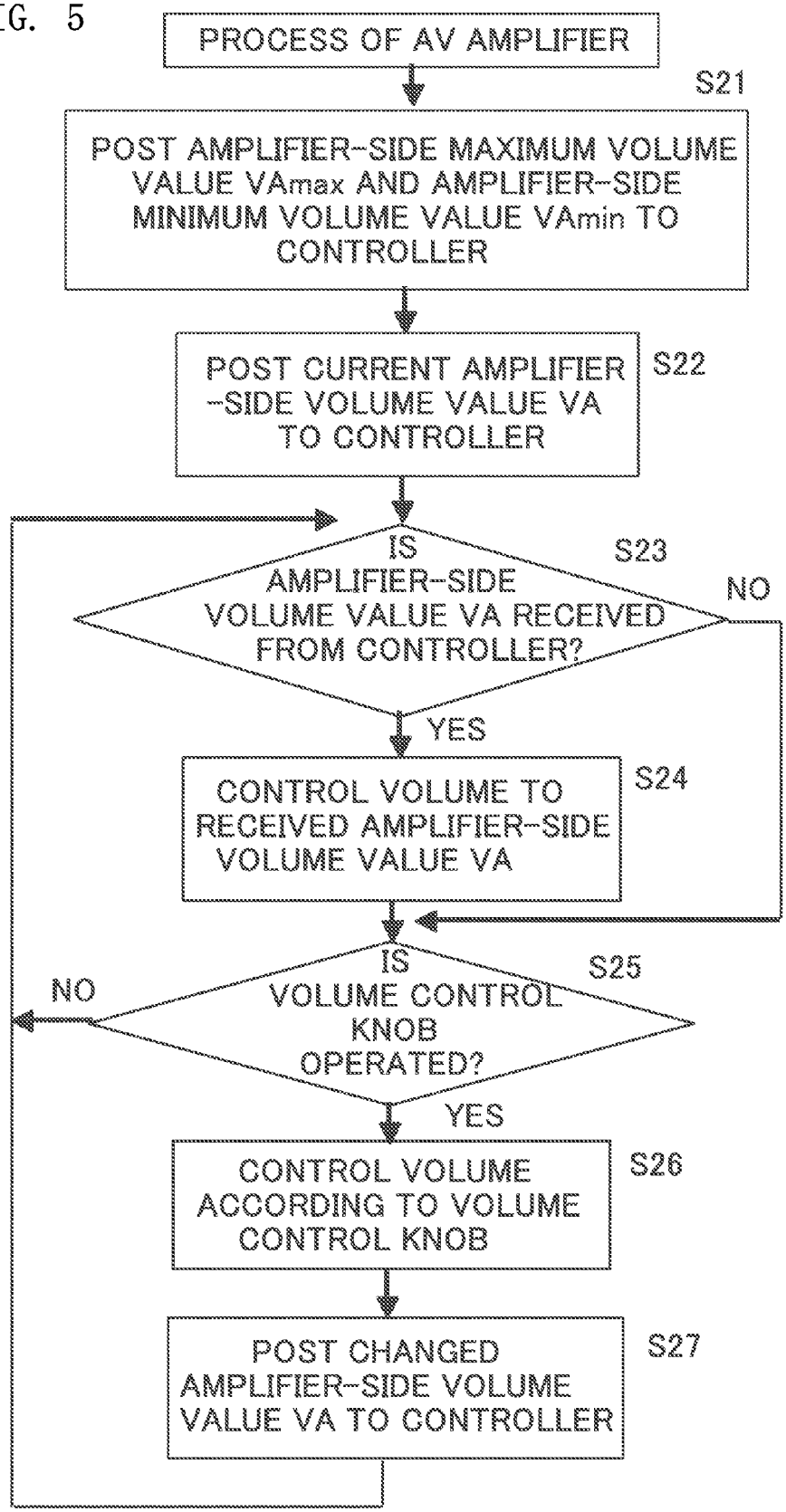
FIG. 5 is a flowchart illustrating a process of a control section of the AV amplifier.
Figure 6:
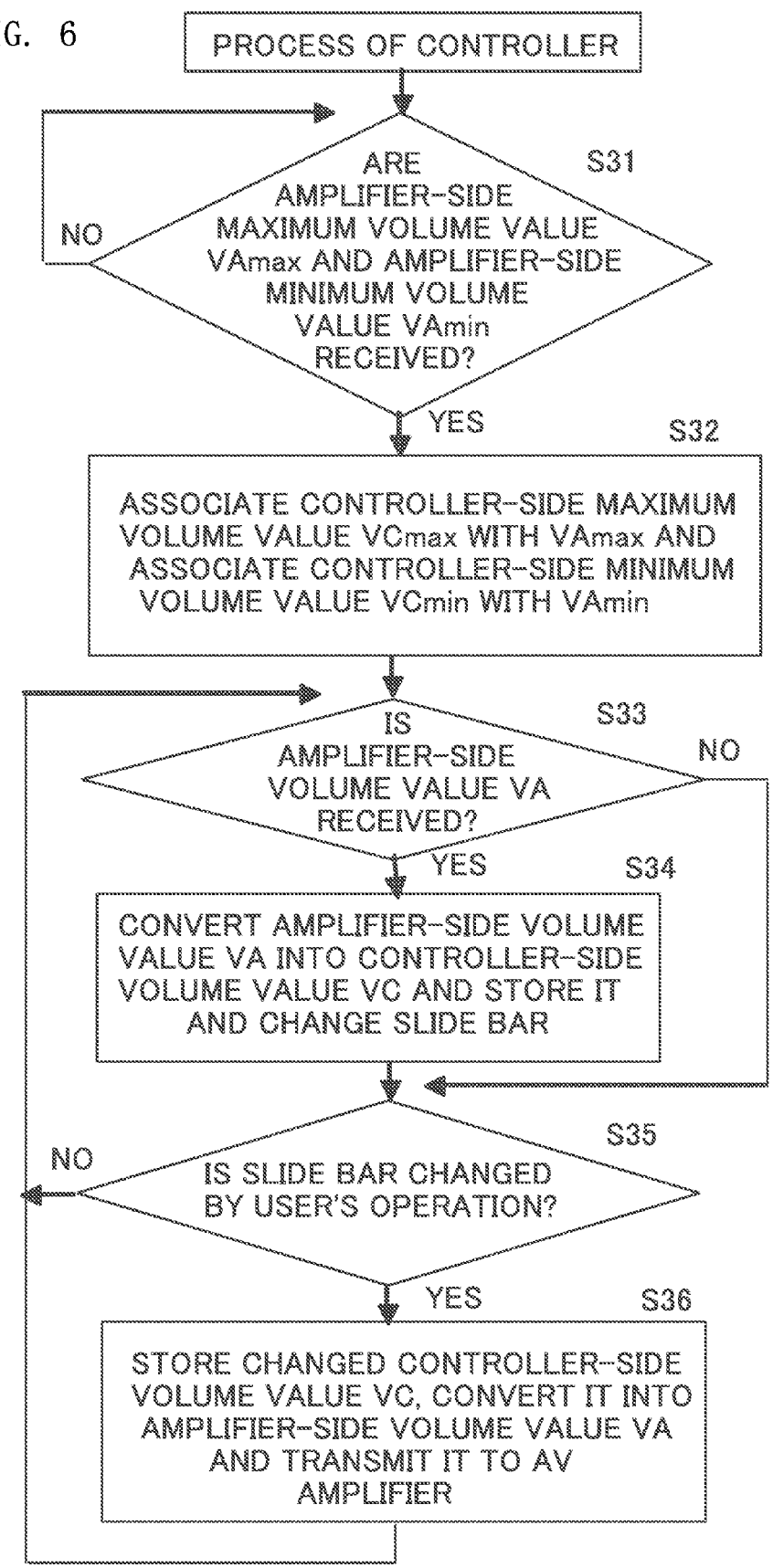
FIG. 6 is a flowchart illustrating a process of the controller.

Another preferred embodiment of the present invention is described below. In comparison with the first embodiment, the controller 3B converts the controller-side volume value VC and the amplifier-side volume value VA in this example. Therefore, the amplifier-side volume value is posted between the controller 3B and the control section 12. FIG. 5 is a flowchart illustrating a process of the control section 12 of the AV amplifier 11, and FIG. 6 is a flowchart illustrating a process of the controller 3B. For example, when the AV amplifier 11 is selected from devices connected to LAN by a user's operation and the controller 3B is connected to the AV amplifier 11, the control section 12 of the AV amplifier 11 reads the amplifier-side maximum volume value VAmax (in this example, 0 dB) and the amplifier-side minimum volume value VAmin (in this example, −50 dB) from the memory 13 and transmits them to the controller 3B (S21) as shown in FIG. 5.

The controller 3B determines whether or not the amplifier-side maximum volume value VAmax and the amplifier-side minimum volume value VAmin are received as shown in FIG. 6 (S31). When they are received (YES in S31), the controller 3B associates the amplifier-side maximum volume value VAmax with the controller-side maximum volume value VCmax and associates the amplifier-side minimum volume value VAmin with the controller-side minimum volume value VCmin, so as to store them in the memory 4 (S32).

As shown in FIG. 5, the control section 12 of the AV amplifier 11 posts the current amplifier-side volume value VA to the controller 3B (S22). As shown in FIG. 6, the controller 3B determines whether the amplifier-side volume value VA is received from the AV amplifier 11 (S33). When it is not received (NO in S33), the sequence goes to S35. When it is received (YES in S33), the controller 3B converts the received amplifier-side volume value VA into the controller-side volume value VC based on the formula 1, stores it in the memory 4, and changes the slide bar based on the controller-side volume value VC (S34).

Thereafter, the controller 3B determines whether or not the slide bar is moved by the user's operation (S35). When it is not moved (NO in S35), the sequence returns to S33. When it is moved (YES in S35), the controller 3B stores the controller-side volume value VC determined by the position of the moved slide bar into the memory 4, and converts the controller-side volume value VC into the amplifier-side volume value VA based on the formula 2 so as to transmit it to the AV amplifier 11 (S36).

As shown in FIG. 5, the control section 12 of the AV amplifier 11 determines whether or not the amplifier-side volume value VA is received (S23). When it is no received (NO in S23), the sequence goes to S25. When it is received (YES at 23), the control section 12 changes the volume of the volume control section 16 into the received amplifier-side volume value VA (S24). Thereafter, the control section 12 determines whether or not the volume control knob (or the volume control button of the remote controller) is operated by the user (S25). That is to say, the determination is made whether or not the instruction for changing the amplifier-side volume value VA is input by the user's operation. When it is not operated (NO in S25), the sequence returns to S23. When it is operated (YES in S25), the control section 12 changes the volume of the volume control section 16 into the amplifier-side volume value VA determined according to the operating position of the volume control knob (S26). The control section 12 posts the changed amplifier-side volume value VA to the controller 3B (S27).

Similarly to the above, the controller 3B determines whether or not the amplifier-side volume value VA is received from the AV amplifier 11 (S33). When it is received (YES in S33), the controller 3B converts the received amplifiers-side volume value VA into the controller-side volume value VC based on the formula 1, stores it in the memory 4, and changes the slide bar based on the controller-side volume value VC (S34).

The amplifier-side volume value is posted between the control section 12 of the AV amplifier 11 and the controller 3B, so that the amplifier-side volume value VA managed by both of them can be set to the same value. Therefore, when the controller-side volume value is changed, the amplifier-side volume value VA can be changed into a suitable value.

Third Embodiment

Figure 7:
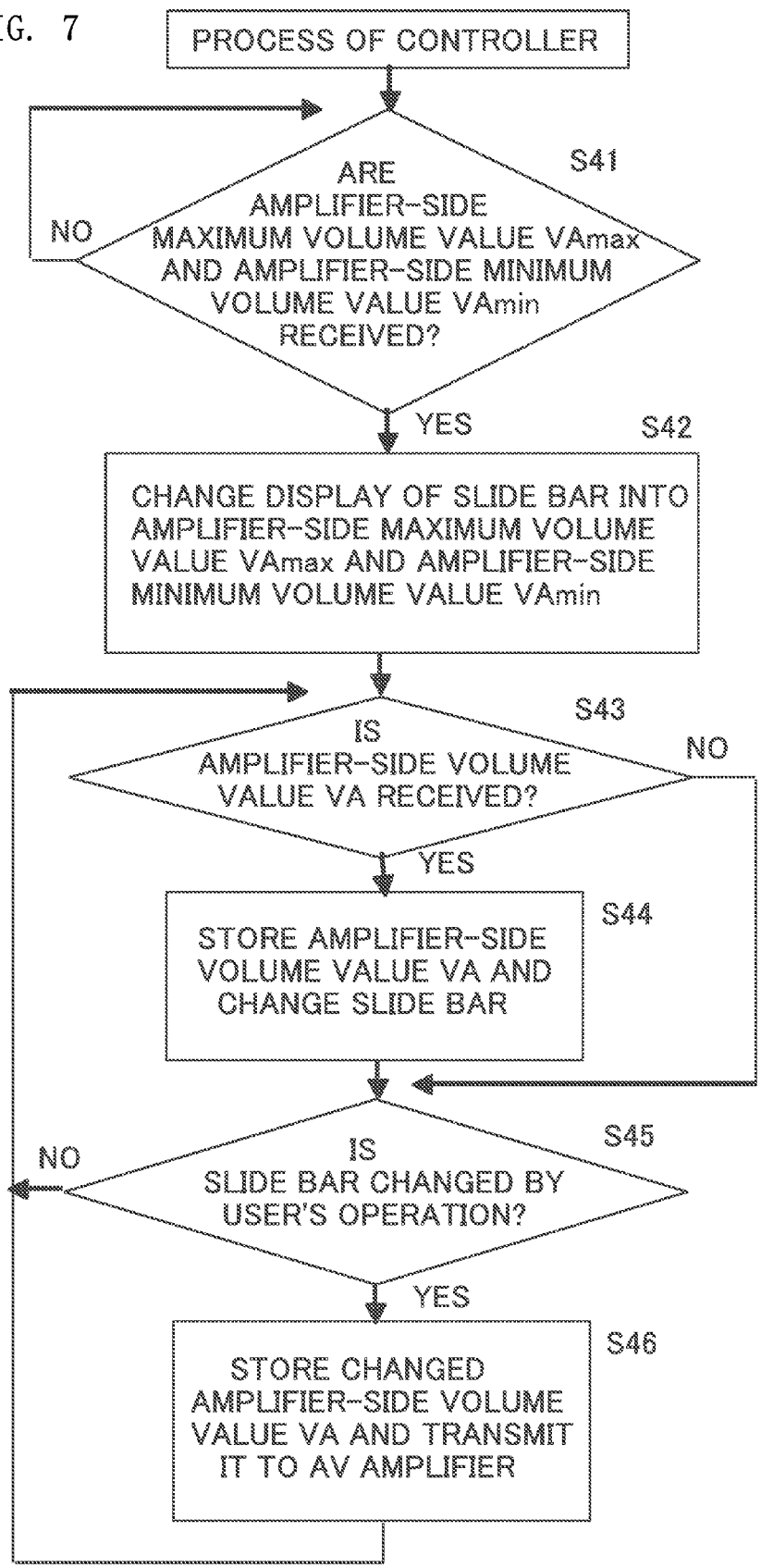
FIG. 7 is a flowchart illustrating a process of the controller.

Still another preferred embodiment of the present invention is described below. In comparison with the second embodiment, the controller 3B displays not the controller-side volume value VC (the controller-side maximum volume value VCmax and the controller-side minimum volume value VCmin) but the amplifier-side volume value VA (the amplifier-side maximum volume value VAmax and the amplifier-side minimum volume value VAmin) on the slide bar in this example. FIG. 7 is a flowchart illustrating a process of the controller 3B. The process of the control section 12 of the AV amplifier 11 is the same as that in FIG. 5, and thus the description thereof is employed.

Figure 8:
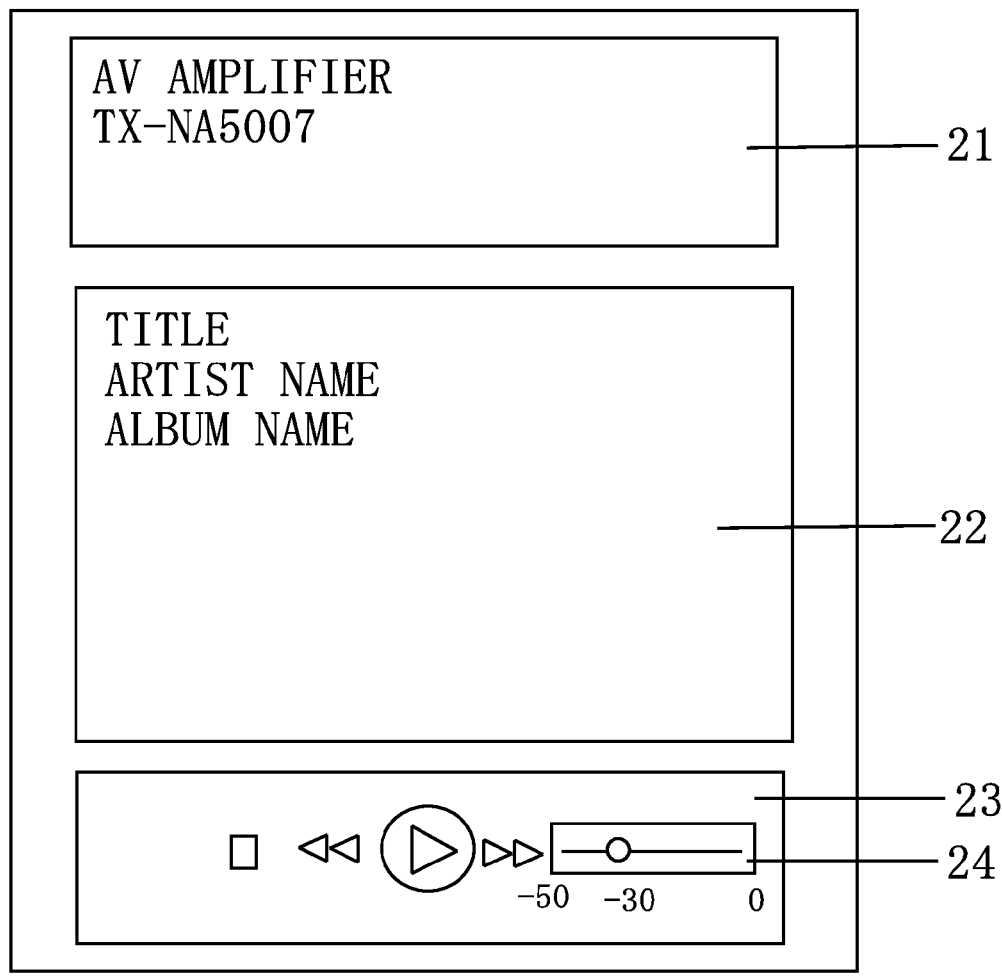
FIG. 8 is a diagram illustrating an operation screen of a controller.

As shown in FIG. 7, the controller 3B determines whether or not the amplifier-side maximum volume value VAmax and the amplifier-side minimum volume value VAmin are received (S41). When they are received (YES in S41), the controller 3B associates the amplifier-side maximum volume value VAmax with the controller-side maximum volume value VCmax and associates the amplifier-side minimum volume value VAmin with the controller-side minimum volume value VCmin, so as to store them in the memory 4. As shown in FIG. 8, the controller 3B changes the display of the slide bar from the controller-side volume value VC into the amplifier-side volume value VA (S42). Further, the controller 3B changes the controller-side maximum volume value VCmax to be displayed on the slide bar into the amplifier-side maximum volume value VAmax, and changes the controller-side minimum volume value VCmin into the amplifier side minimum volume value VAmin. For example, when the amplifier-side maximum volume value VAmax is 0 dB and the amplifier side minimum volume value VAmin is −50 dB, the movable range of the slide bar is changed to −50 to 0.

The controller 3B determines whether or not the amplifier-side volume value VA is received (S43). When it is received (YES S43), the controller 3B stores the amplifier-side volume value VA in the memory 4, and the position of the slide bar is moved based on the amplifier-side volume value VA (S44). Further, the controller 3B determines whether or not the slide bar is moved by the user's operation (S45). When it is moved (YES in S45), the controller 3B stores the amplifier-side volume value VA specified by the position of the slide bar into the memory 4, and posts it to the AV amplifier 11 (S46).

In this example, the controller 3B changes the display of the slide bar into the amplifier-side volume value VA based on the amplifier-side maximum volume value VAmax and the amplifier-side minimum volume value VAmin received from the AV amplifier 11. The user's operation is accepted not by the controller-side volume value VC but the amplifier-side volume value VA. Therefore, the converting process between the amplifier-side volume value VA and the controller-side volume value VC is not necessary.

Fourth Embodiment

Still another preferred embodiment of the present invention is described below. In comparison with the first embodiment, an amplifier-side setting maximum volume value VASmax as a maximum value of the amplifier-side volume value VA controllable by the controller 3B (namely, by the controller-side volume value) and an amplifier-side setting minimum volume value VASmin as a minimum value of the amplifier-side volume value VA controllable by the controller 3B (namely, by the controller-side volume value) are set in the memory 13 in this example. In other words, the range of the amplifier-side volume value VA controllable by the controller 3B is different from the range of the amplifier-side volume value VA controllable by the operating section 18. The amplifier-side setting maximum volume value VASmax is set to a value that is smaller than the amplifier-side maximum volume value VAmax and is at a level where the amplifying section 15 and the speaker are not damaged. The amplifier-side setting minimum volume value VASmin is set to a value that is larger than the amplifier-side minimum volume value VAmin. For example, the amplifier-side setting maximum volume value VASmax is −10 dB and the amplifier-side setting minimum volume value VASmin is −40 dB. The amplifier-side setting maximum volume value VASmax and the amplifier-side setting minimum volume value VASmin may be changed by the user's operation or may be unchangeable.

Figure 9:
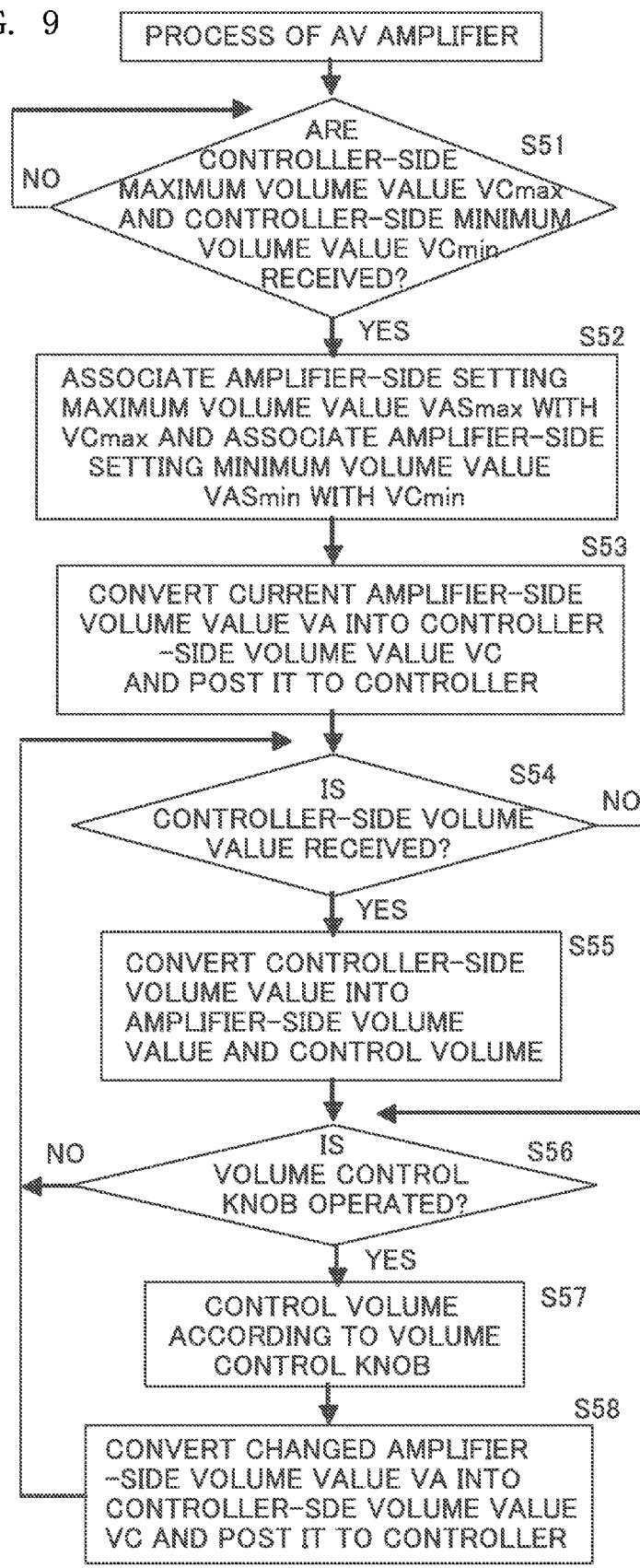
FIG. 9 is a flowchart illustrating a process of a control section of the AV amplifier.

FIG. 9 is a flowchart illustrating a process of the control section 12 of the AV amplifier 11. The process of the controller 3B is the same as that in FIG. 4, and the description thereof is employed. The control section 12 of the AV amplifier 11 determines whether or not the controller-side maximum volume value VCmax and the controller-side minimum volume value VCmin are received (S51). When they are received (YES in S51), the control section 12 associates the amplifier-side setting maximum volume value VASmax with the controller-side maximum volume value VCmax and associates the amplifier-side setting minimum volume value VASmin with the controller-side minimum volume value VCmin so as to store them in the memory 13 (S52).

The control section 12 converts a current amplifier-side volume value VA into the controller-side volume value VC, and posts it to the controller 3B (S53). More concretely, the control section 12 calculates the controller-side volume value VC based on the following formula 3 (namely, the amplifier-side setting maximum volume value VASmax, the amplifier-side setting minimum volume value VASmin, the controller-side maximum volume value Vcmax, and the controller-side minimum volume value VCmin). For example, when the amplifier-side volume value VA is −25 (dB), the controller-side volume value VC becomes 50.

$$VC=\{(VA-VASmin)(VCmax-VCmin)/(VASmax-VASmin)\}+VCmin \quad \text{[Mathematical Formula 3]}$$

However, when the amplifier-side volume value VA is the amplifier side setting maximum volume value VASmax or more, the amplifier-side volume value VA is calculated as the amplifier-side setting maximum volume value VASmax. That is to say, when the amplifier-side volume value VA is the amplifier-side setting maximum volume value VASmax or more, the controller-side volume value VC to be calculated becomes the controller-side maximum volume value VCmax. Similarly, when the amplifier-side volume value VA is the amplifier-side setting minimum volume value VASmin or less, the amplifier-side volume value VA is calculated as the amplifier-side setting minimum volume value VASmin. That is to say, when the amplifier-side volume value VA is the amplifier-side setting minimum volume value VASmin or less, the controller-side volume value VC to be calculated becomes the controller-side minimum volume value VCmin.

Further, the control section 12 determines whether or not the controller-side volume value VC is received (S54). When it is not received (NO in S54), the sequence goes to S56. When it is received (YES in S54), the control section 12 converts the received controller-side volume value VC into the amplifier-side volume value VA, and allows the volume control section 16 to change the volume (S55). In detail, the control section 12 calculates the amplifier-side volume value VA based on the following formula 4 (namely, based on the amplifier-side setting maximum volume value VASmax, the amplifier-side setting minimum volume value VASmin, the controller-side maximum volume value Vcmax, and the controller-side minimum volume value VCmin). For example, when the controller-side volume value VC is 80, the amplifier-side volume value VA becomes −16 (dB).

$$VA = \{(VC-VCmin)(VASmax-VASmin)/(VCmax-VCmin)\} + VASmin \quad \text{[Mathematical Formula 4]}$$

Thereafter, the control section 12 determines whether or not the volume control knob (or the volume control button of the remote controller) is operated by the user (S56). That is to say, the determination is made whether or not the instruction for changing the amplifier-side volume value VA is input by the user's operation. When it is not operated (NO in S56), the sequence returns to S54. When it is operated (YES in S56), the control section 12 changes the volume of the volume control section 16 into the amplifier-side volume value VA determined according to the operating position of the volume control knob (S57). The control section 12 changes the changed amplifier-side volume value VA into the controller-side volume value VC based on the formula 3, and posts it to the controller 3B (S58).

The controller-side volume value is posted between the control section 12 of the AV amplifier 11 and the controller 3B, so that the controller-side volume value VC managed by both of them can be set to the same value. Therefore, when the controller-side volume value is changed, the amplifier-side volume value VA can be changed into a suitable value. Further, the controller-side volume value VC and the amplifier-side volume value VA are converted based on the amplifier-side setting maximum volume value VASmax and the amplifier-side setting minimum volume value VSAmin. For this reason, even when the controller-side volume value VC is changed into the controller side maximum volume value VCmax, the amplifier-side volume value increases only up to the amplifier-side setting maximum volume value VASmax. Therefore, the amplifying section 15 and the speaker are prevented from being damaged. The amplifier-side setting minimum volume value VASmin is not provided, but only the amplifier-side setting maximum volume value VASmax may be provided. In this case, the controller-side volume value VC and the amplifier-side volume value VA are converted based on the amplifier-side setting maximum volume value VASmax and the amplifier-side minimum volume value VAmin.

Fifth Embodiment

Still another preferred embodiment of the present invention is described below. In comparison with the second embodiment, an amplifier-side setting maximum volume value VASmax as a maximum value of the amplifier-side volume value VA controllable by the controller 3B (namely, the controller-side volume value VC) and an amplifier-side setting minimum volume value VASmin as a minimum value of the amplifier-side volume value VA controllable by the controller 3B (namely, the controller-side volume value VC) are set in the memory 13 in this example. The amplifier-side setting maximum volume value VASmax is set to a value that is smaller than the amplifier-side maximum volume value VAmax and is at a level where the amplifying section 15 and the speaker are not damaged. The amplifier-side setting minimum volume value VASmin is set to a value larger than the amplifier-side minimum volume value VAmin. For example, the amplifier-side setting maximum volume value VASmax is −10 dB, and the amplifier-side setting minimum volume value VASmin is −40 dB. The amplifier-side setting maximum volume value VASmax and the amplifier-side setting minimum volume value VASmin may be changeable by the user's operation or may be unchangeable.

Figure 10:
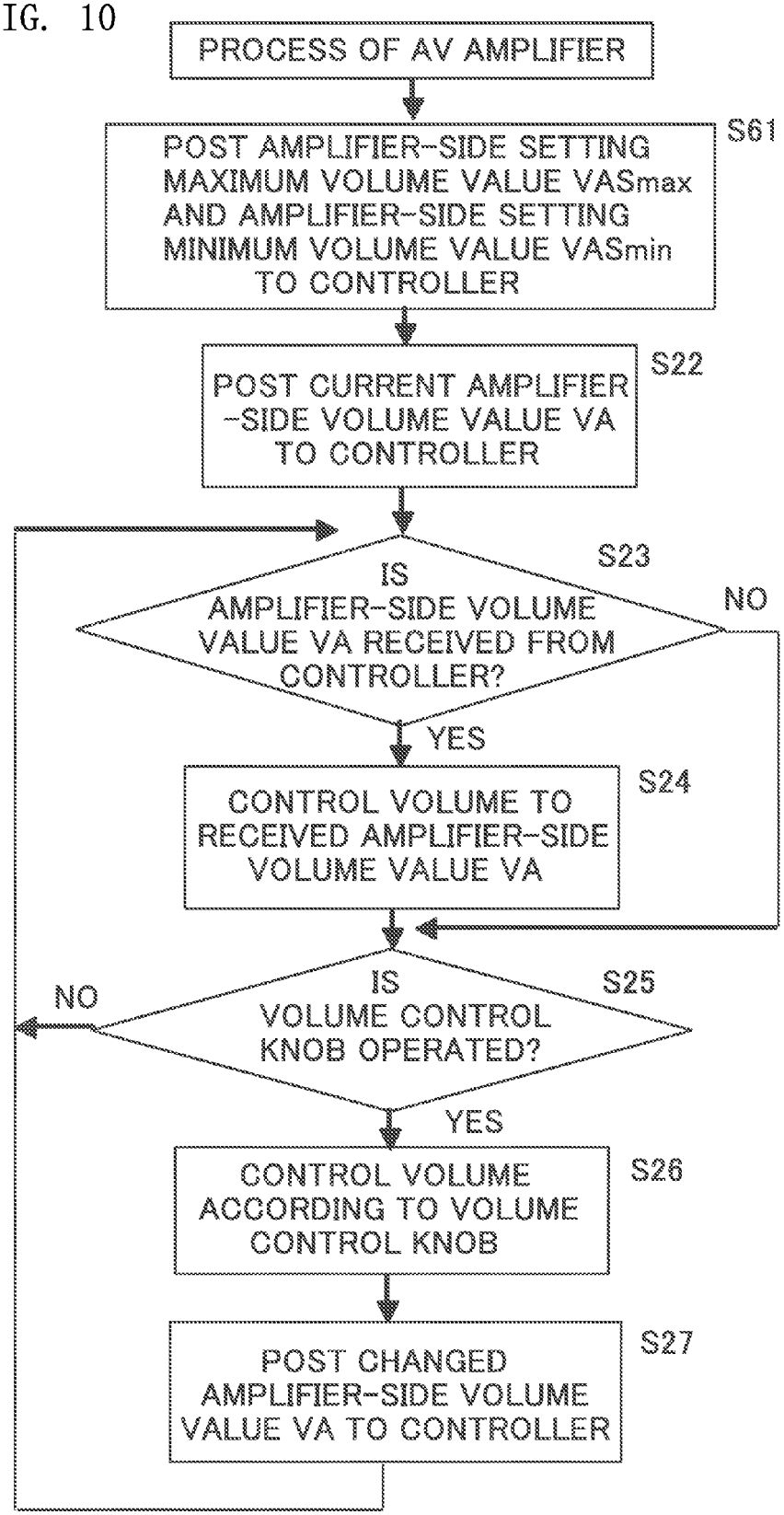
FIG. 10 is a flowchart illustrating a process of a control section of the AV amplifier.
Figure 11:
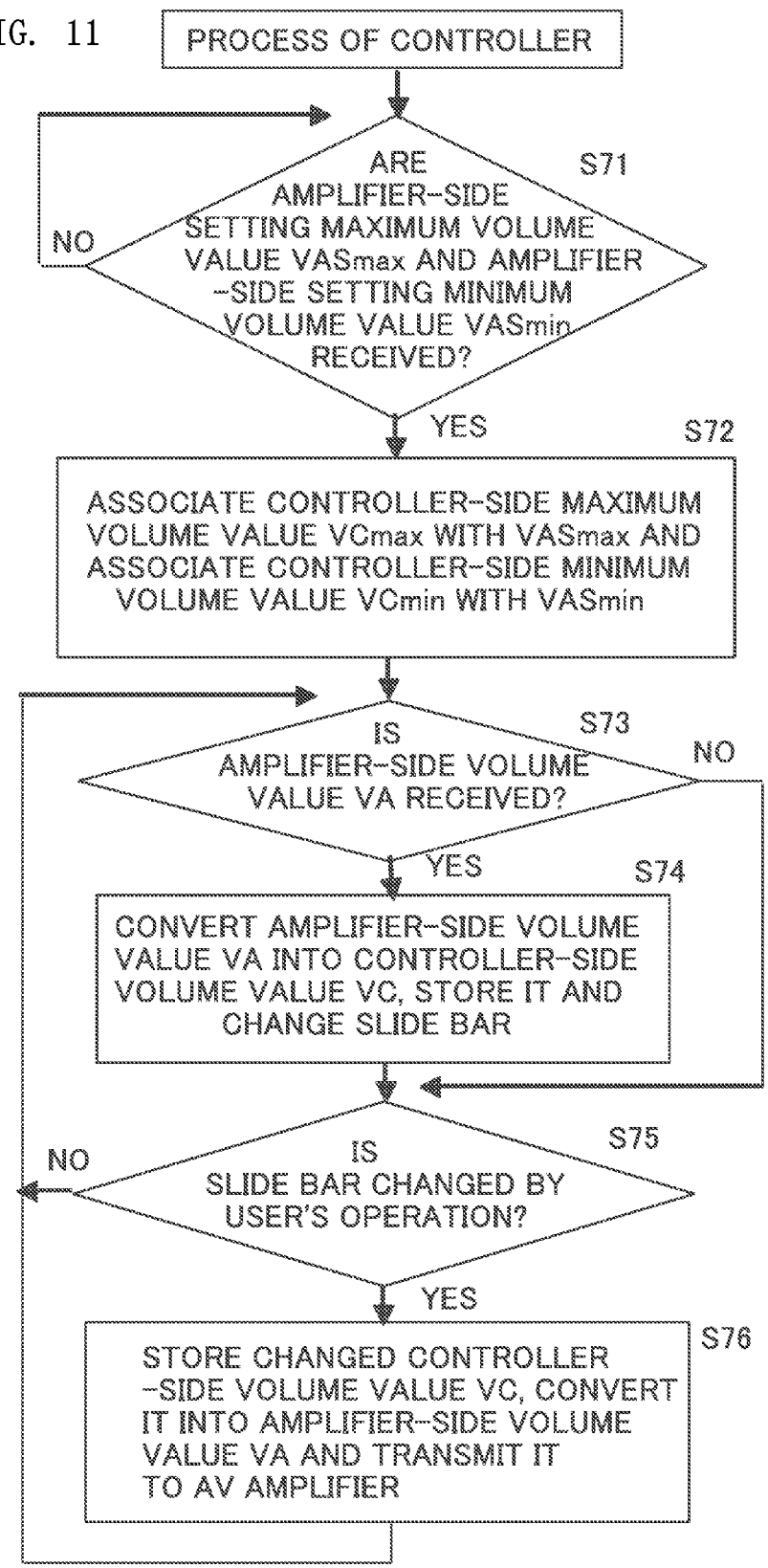
FIG. 11 is a diagram illustrating an operation screen of a controller.

FIG. 10 is a flowchart illustrating a process of the control section 12 of the AV amplifier 11, and FIG. 11 is a flowchart illustrating a process of the controller 3B. For example, the AV amplifier 11 is selected by the user from devices connected to LAN. When this AV amplifier 11 is connected to the controller 3B, as shown in FIG. 10, the control section 12 of the AV amplifier 11 reads the amplifier-side setting maximum volume value VASmax (in this example, −10 dB) and the amplifier-side setting minimum volume value VASmin (in this example, −40 dB) from the memory 13 so as to transmit them to the controller 3B (S61). Since the process subsequent to the control section 12 is the same as that in FIG. 5, the description thereof is employed (the same symbols are used).

As shown in FIG. 11, the controller 3B determines whether the amplifier-side setting maximum volume value VASmax and the amplifier-side setting minimum volume value VASmin are received (S71). When they are received (YES in S71), the controller 3B associates the amplifier-side setting maximum volume value VASmax with the controller-side maximum volume value VCmax and associates the amplifier-side setting minimum volume value VASmin with the controller-side minimum volume value VCmin so as to store them into the memory 4 (S72).

The controller 3B determines whether or not the amplifier-side volume value VA is received from the AV amplifier 11 (S73). When it is not received (NO in S73), the sequence goes to S75. When it is received (YES in S73), the controller 3B converts the received amplifier-side volume value VA into the controller-side volume value VC based on the formula 3, and stores it to the memory 4. The controller 3B changes slide bar based on the controller-side volume value VC (S74).

The controller 3B determines whether the slide bar is moved by the user's operation (S75). When it is not moved (NO in S75), the sequence returns to S73. When it is moved (YES in S75), the controller 3B stores the controller-side volume value VC determined by the position of the moved slide bar into the memory 4. The controller 3B converts the controller-side volume value VC into the amplifier-side volume value VA based on the formula 4, and transmits it to the AV amplifier 11 (S76).

The amplifier-side volume value is posted between the control section 12 of the AV amplifier 11 and the controller 3B, so that the amplifier-side volume value VA managed by both of them can be set to the same value. Therefore, when the controller-side volume value is changed, the amplifier-side volume value VA can be changed into a suitable value. The controller-side volume value VC and the amplifier-side volume value VA are converted based on the amplifier-side setting maximum volume value VASmax and the amplifier-side setting minimum volume value VASmin. For this reason, even when the controller-side volume value VC is changed into the controller-side maximum volume value VCmax, the amplifier-side volume value increases only up to the amplifier-side setting maximum volume value VASmax. Therefore, the amplifying section 15 and the speaker are prevented from being damaged. The amplifier-side setting minimum volume value VASmin is not provided but only the amplifier-side setting maximum volume value VASmax may be provided.

Sixth Embodiment

Figure 12:
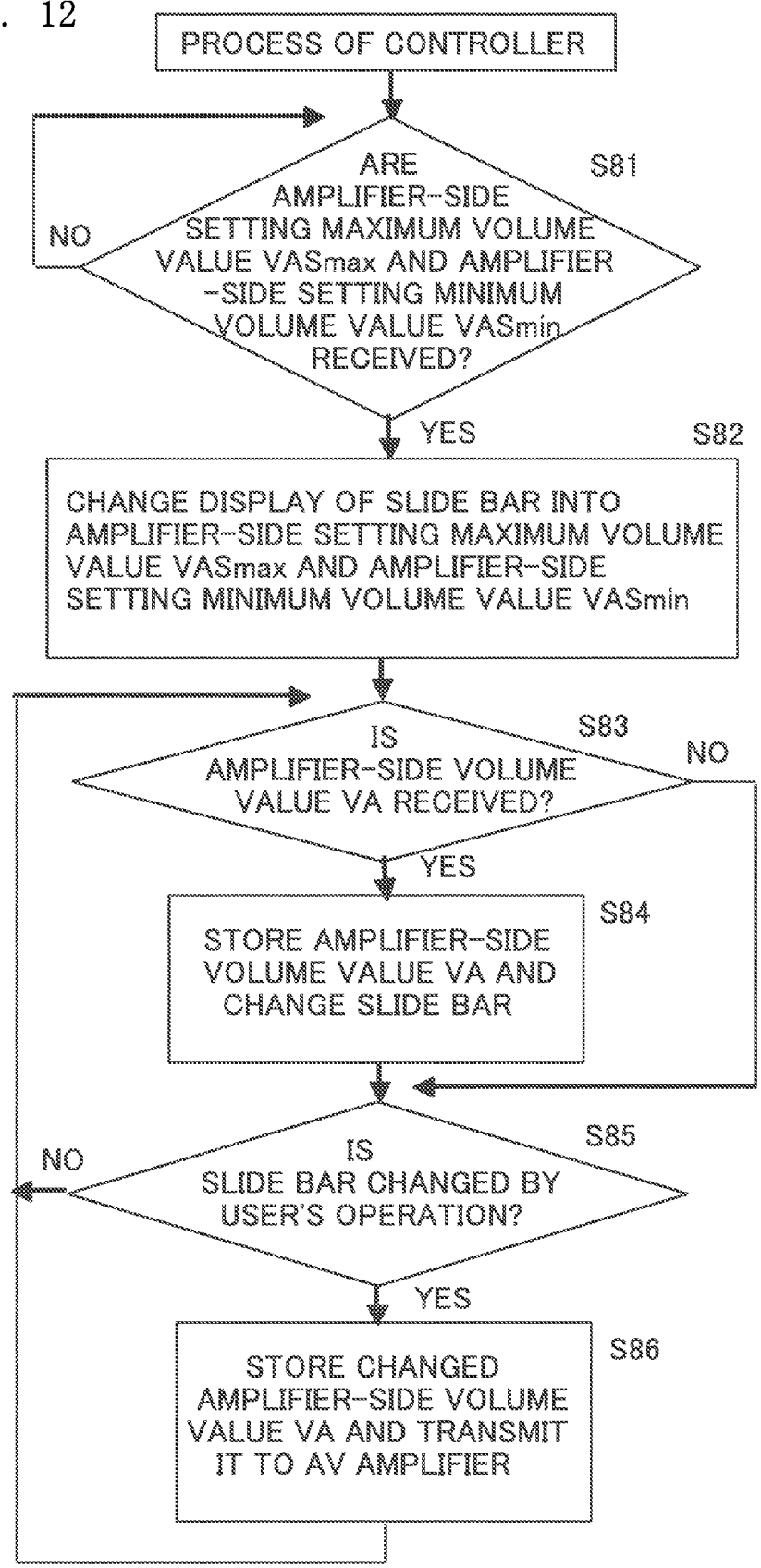
FIG. 12 is a flowchart illustrating a process of the controller.

Still another preferred embodiment of the present invention is described below. In comparison with the fifth embodiment, the controller 3B displays not the controller-side volume value but the amplifier-side volume value on the slide bar in this example. FIG. 12 is a flowchart illustrating a process of the controller 3B. Since the process of the control section 12 of the AV amplifier 11 is the same as that in FIG. 10, and the description thereof is employed.

Figure 13:
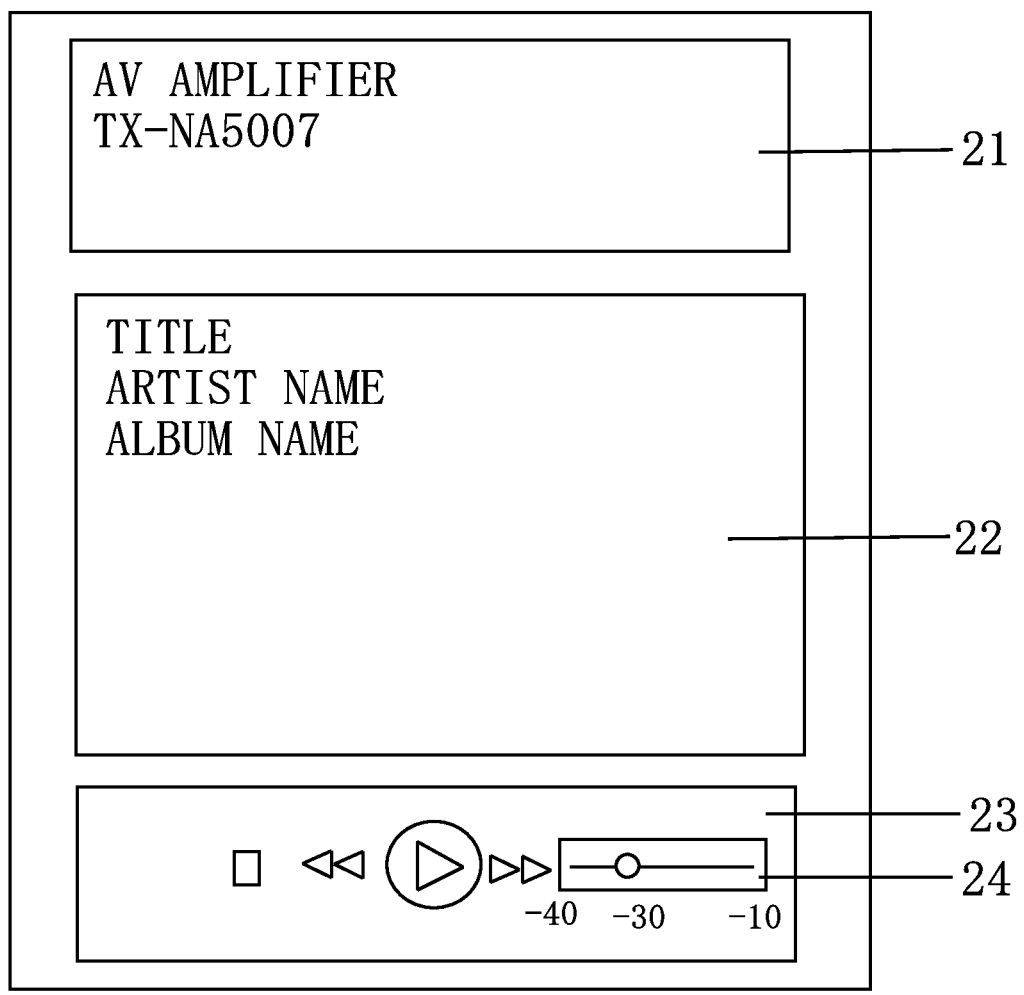
FIG. 13 is a diagram illustrating an operation screen of a controller.

As shown in FIG. 12, the controller 3B determines whether or not the amplifier-side setting maximum volume value VASmax and the amplifier-side setting minimum volume value VASmin are received (S81). When they are received (YES in S81), the controller 3B associates the amplifier-side setting maximum volume value VASmax with the controller-side maximum volume value VCmax and associates the amplifier-side setting minimum volume value VASmin with the controller-side minimum volume value VCmin so as to store them into the memory 4. As shown in FIG. 13, the controller 3B changes the display of the slide bar from the controller-side volume value VC into the amplifier-side volume value VA (S82). That is to say, the controller 3B changes the controller-side maximum volume value VCmax displayed on the slide bar into the amplifier-side setting maximum volume value VASmax, and changes the controller-side minimum volume value VCmin into the amplifier-side setting minimum volume value VASmin. For example, when the amplifier-side setting maximum volume value VASmax is −10 dB and the amplifier-side setting minimum volume value VASmin is −40 dB, the movable range of the slide bar is changed into −40 to −10.

The controller 3B determines whether or not the amplifier-side volume value VA is received (S83). When it is received (YES in S83), the controller 3B stores the amplifier-side volume value VA in the memory 4, and moves the position of the slide bar based on the amplifier-side volume value VA (S84). Further, the controller 3B determines whether or not the slide bar is moved by the user's operation (S85). When it is moved (YES in S85), the controller 3B stores the amplifier-side volume value VA specified by the position of the slide bar into the memory 4, and posts it to the AV amplifier 11 (S86).

According to this example, the controller 3B changes the display of the slide bar into the amplifier-side volume value VA based on the amplifier-side setting maximum volume value VASmax and the amplifier-side setting minimum volume value VASmin received from the AV amplifier 11. The controller 3B accepts the user's operation by means of not the controller-side volume value VC but the amplifier-side volume value VA. Therefore, the process for converting the amplifier-side volume value VA and the controller-side volume value VC is not necessary.

Seventh Embodiment

Figure 14:
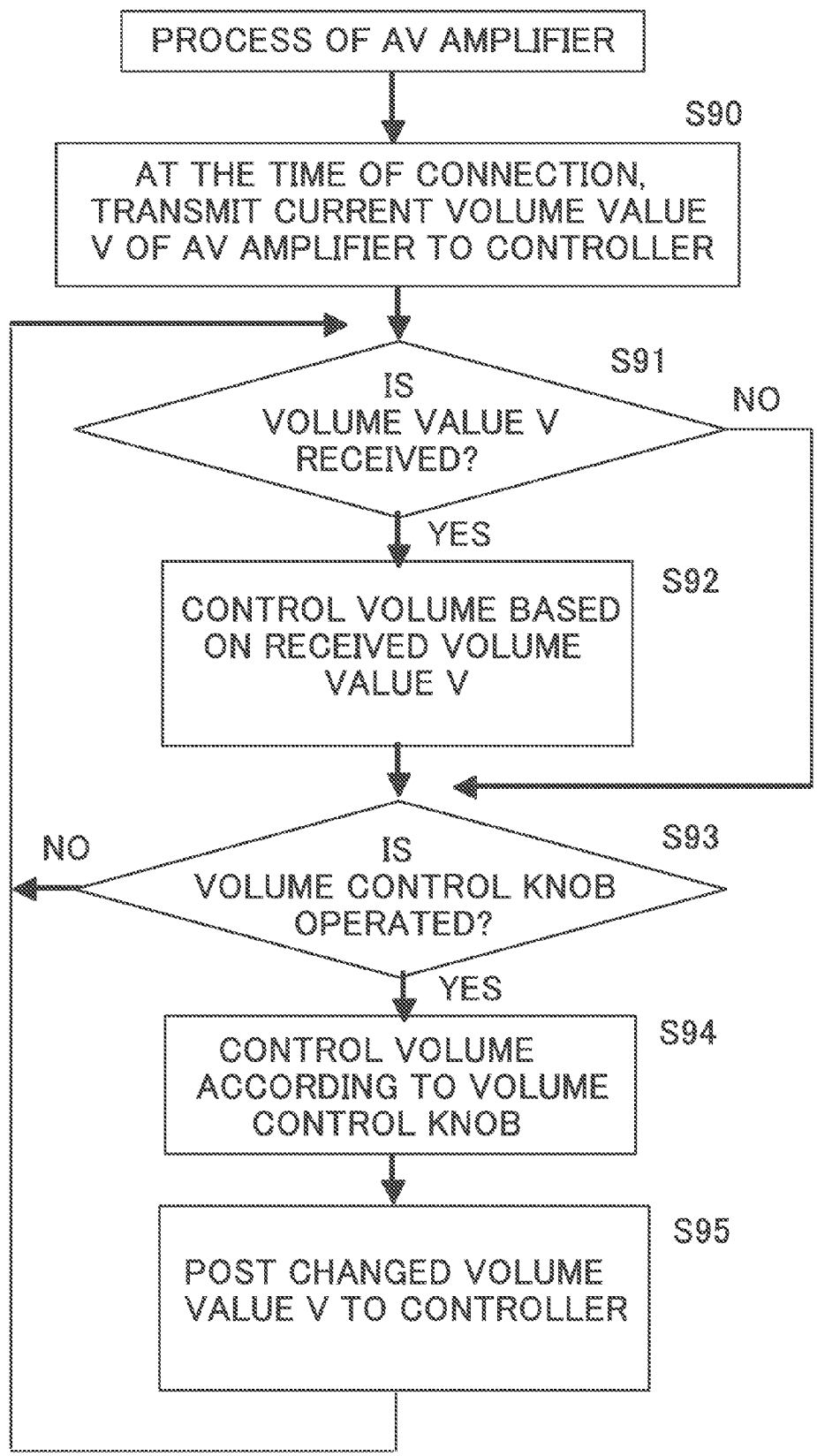
FIG. 14 is a flowchart illustrating a process of a control section of the AV amplifier.

Still another preferred embodiment of the present invention is described below. In comparison with the above respective embodiments, the controller-side volume value VC and the amplifier-side volume value VA are used as originally common volume values V in this example. Therefore, the converting process between the controller-side volume value VC and the amplifier-side volume value VA by means of the control section 12 or the controller 3B is not necessary. FIG. 14 is a flowchart illustrating a process of the control section 12 of the AV amplifier 11, and FIG. 15 is a flowchart illustrating a process of the controller 3B.

When the controller 3B is connected to the AV amplifier 11, as shown in FIG. 14, the control section 12 of the AV amplifier 11 reads a current volume value V of the AV amplifier 11 from the memory, and transmits it to the controller 3B (S90). As shown in FIG. 15, when the controller 3B receives the volume value V from the AV amplifier 11 (YES in S101), the controller 3B stores the received volume value V in the memory 4 (S101), and the slide bar is moved based on the received volume value V (S102).

Figure 15:
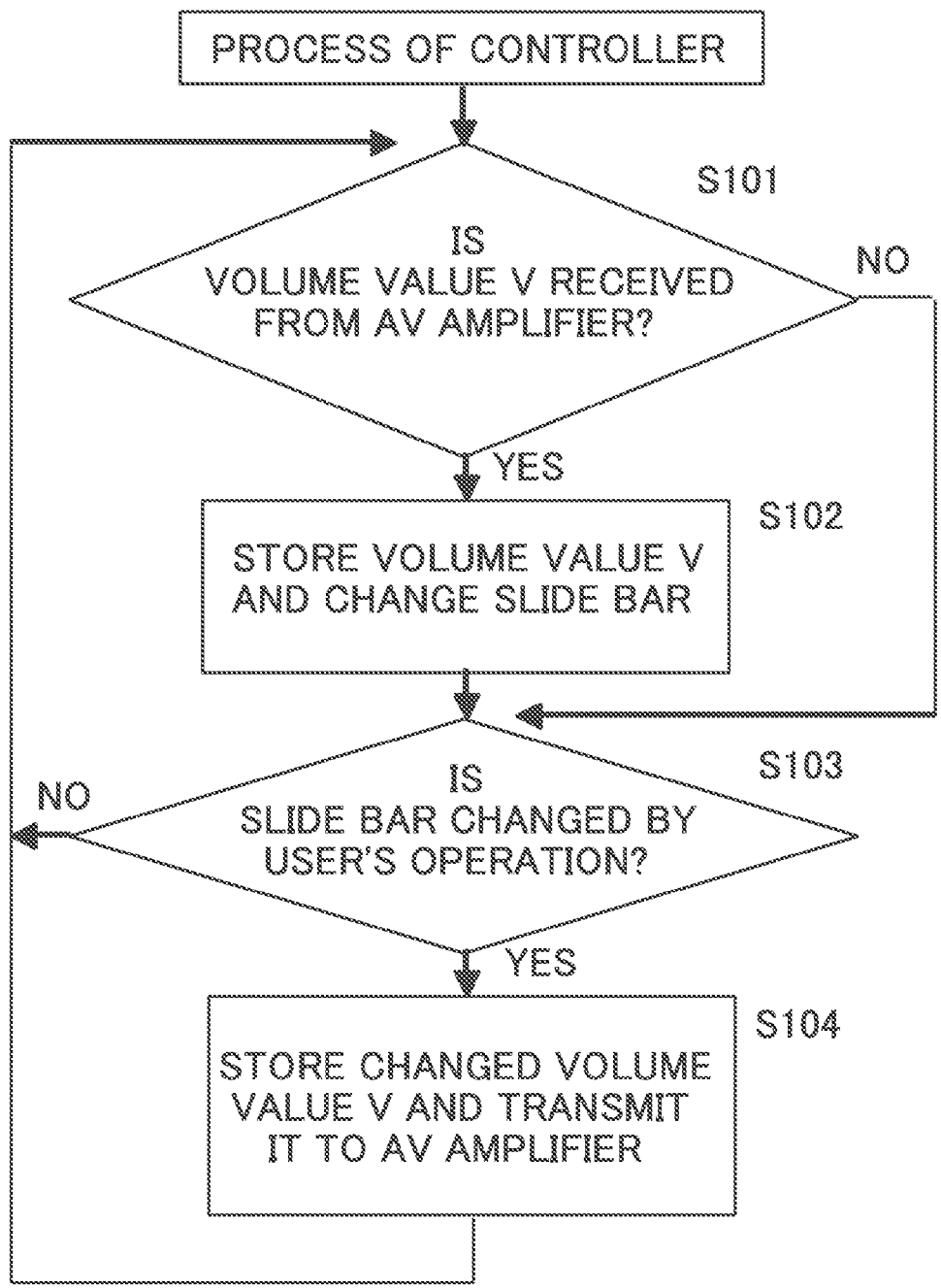
FIG. 15 is a flowchart illustrating a process of the controller.

As shown in FIG. 15, when the slide bar is moved by the user's operation (YES in S103), the controller 3B stores the volume value V determined by the position of the moved slide bar into the memory 4, and transmits the changed volume value V to the AV amplifier 11 (S104). As shown in FIG. 14, when the control section 12 of the AV amplifier 11 receives the volume value from the controller 3B (YES in S91), the control section 12 changes the volume of the volume control section 16 based on the received volume value V (S92).

When the volume control knob is operated (YES in S93), the control section 12 changes the volume of the volume control section 16 into the volume value V determined by the position of the volume control knob (S94), and transmits the changed volume value V to the controller 3B (S95). As shown in FIG. 15, when the controller 3B receives the volume value V from the control section 12 (YES in S101), the controller 3B stores the received volume value V in the memory 4 (S101), and the slide bar is moved based on the received volume value V (S102).

Eighth Embodiment

Still another preferred embodiment of the present invention is described below. In comparison with the above respective embodiments, when the controller 3B and the AV amplifier 11 are disconnected to each other, the controller 3B stores the controller-side volume value VC (or the amplifier-side volume value VA, the volume value V) at that time in the memory 4 in this example. When the controller 3B is connected to the AV amplifier 11 next time, the controller 3B reads the controller-side volume value VC (or the amplifier-side volume value VA, the volume value V) from the memory 4. The controller 3B moves the slide bar (changes the controller-side volume value VC (or the amplifier-side volume value VA, the volume value V)) and transmits it to the AV amplifier 11. As a result, when the AV amplifier 11 is not connected to the controller 3B and the user operates the operating section of the AV amplifier 11 so as to change the amplifier-side volume value, the AV amplifier 11 can be restored to the amplifier-side volume value at the time when being connected to the controller 3B last time when the controller 3B is again connected.

Figure 16:
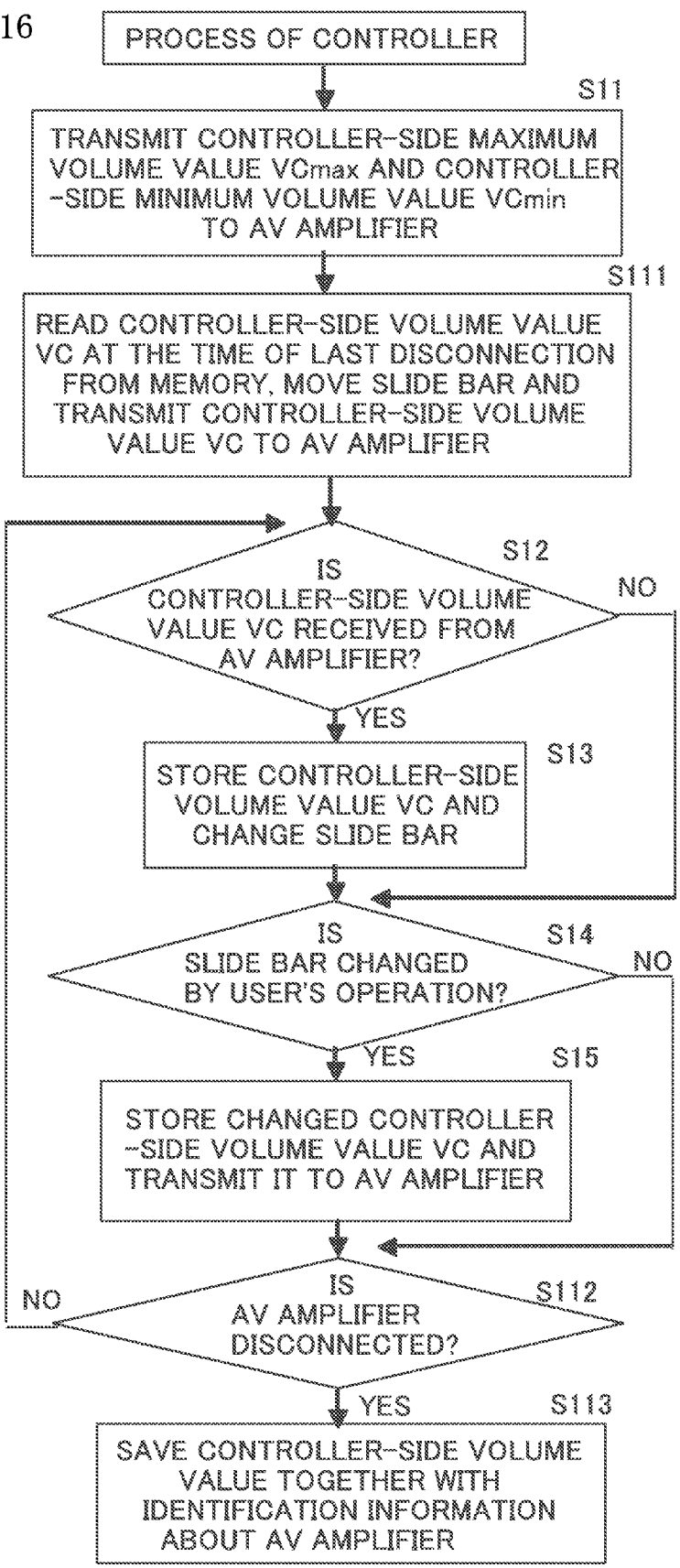
FIG. 16 is a diagram illustrating an operation screen of a controller.

FIG. 16 is a flowchart illustrating a process of the controller 3 in the example corresponding to the first embodiment (FIGS. 3 and 4), and the process in S3 in FIG. 3 is omitted in the process of the AV amplifier 11. When the controller 3B determines disconnection from the AV amplifier 11 (YES in S112), the controller 3B associates the controller-side volume value VC currently stored in the memory 4 with identification information about the AV amplifier 11 (not particularly limited but, information such as a device number and a serial number that can uniquely specify the AV amplifier 11) so as to store it in the memory 4 (S113). The identification information about the AV amplifier 11 can be acquired from the AV amplifier 1 at the time of connection.

When the controller 3B is connected to the AV amplifier 11 next time, the controller 3B acquires the identification information from the AV amplifier 11, and reads the controller-side volume value VC at the time of the last disconnection stored in the memory 4 in association with the acquired identification information from the memory 4. The controller 3B changes the position of the slide bar, and transmits the controller-side volume value VC to the AV amplifier 11 (S111). When the control section 12 of the AV amplifier 11 receives the controller-side volume value VC (YES in S4), the control section 12 converts the controller-side volume value VC into the amplifier-side volume value, and changes the volume of the volume control section 16 (S5).

When a plurality of AV amplifiers 11 can be connected to the controller 3B, with respect to each of the plurality of AV amplifiers, the controller 3B associates the controller-side volume value VC at the time when the controller 3B disconnects from the each AV amplifier 11 with identification information about the each AV amplifier 11 so as to store them in the memory 4. When the controller 3B is connected to the AV amplifier 11 next time, the controller 3B reads the controller-side volume value VC stored in the memory 4 in association with the identification information about the connected AV amplifier 11. The controller 3B moves the slide bar, and transmits the controller-side volume value VC to the connected AV amplifier 11.

Figure 17:
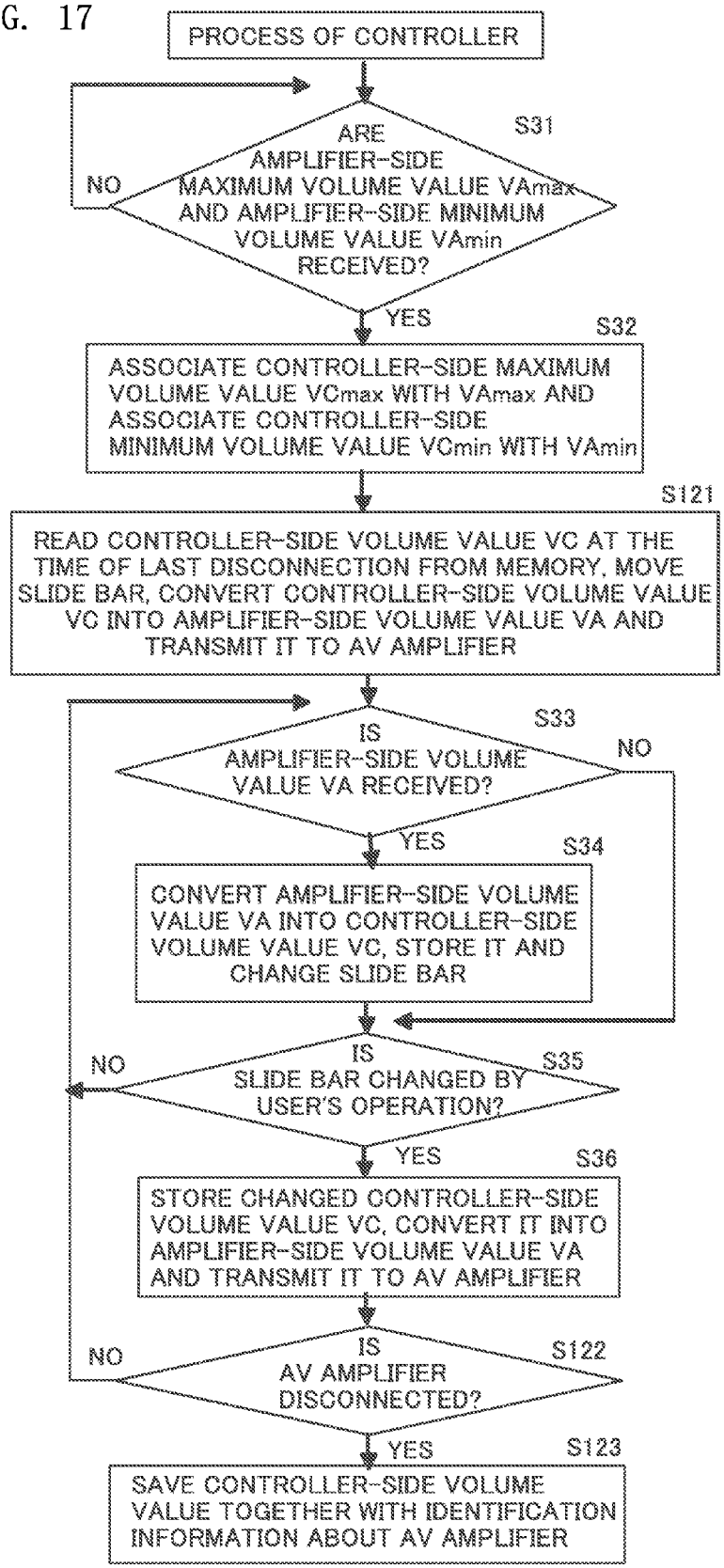
FIG. 17 is a flowchart illustrating a process of the controller.

FIG. 17 is a flowchart illustrating a process of the controller 3B in this example corresponding to the second embodiment (FIGS. 5 and 6), and the process in S22 is omitted from the process of the AV amplifier 11 in FIG. 5. When the controller 3B determines the disconnection from the AV amplifier 11 (YES in S122), the controller 3B associates the controller-side volume value VC currently stored in the memory 4 with the identification information about the AV amplifier 11 so as to store it in the memory 4 (S123).

When the controller 3B is connected to the AV amplifier 11 next time, the controller 3B acquires the identification information from the AV amplifier 11, and reads the controller-side volume value VC at the time of the last disconnection stored in the memory 4 in association with the acquired identification information from the memory 4. The controller 3B changes the position of the slide bar, and converts the controller-side volume value VC into the amplifier-side volume value VA so as to transmit it to the AV amplifier 11 (S121). When the control section 12 of the AV amplifier 11 receives the amplifier-side volume value VA (YES in S23), the control section 12 allows the volume control section 16 to change the volume (S24).

Figure 18:
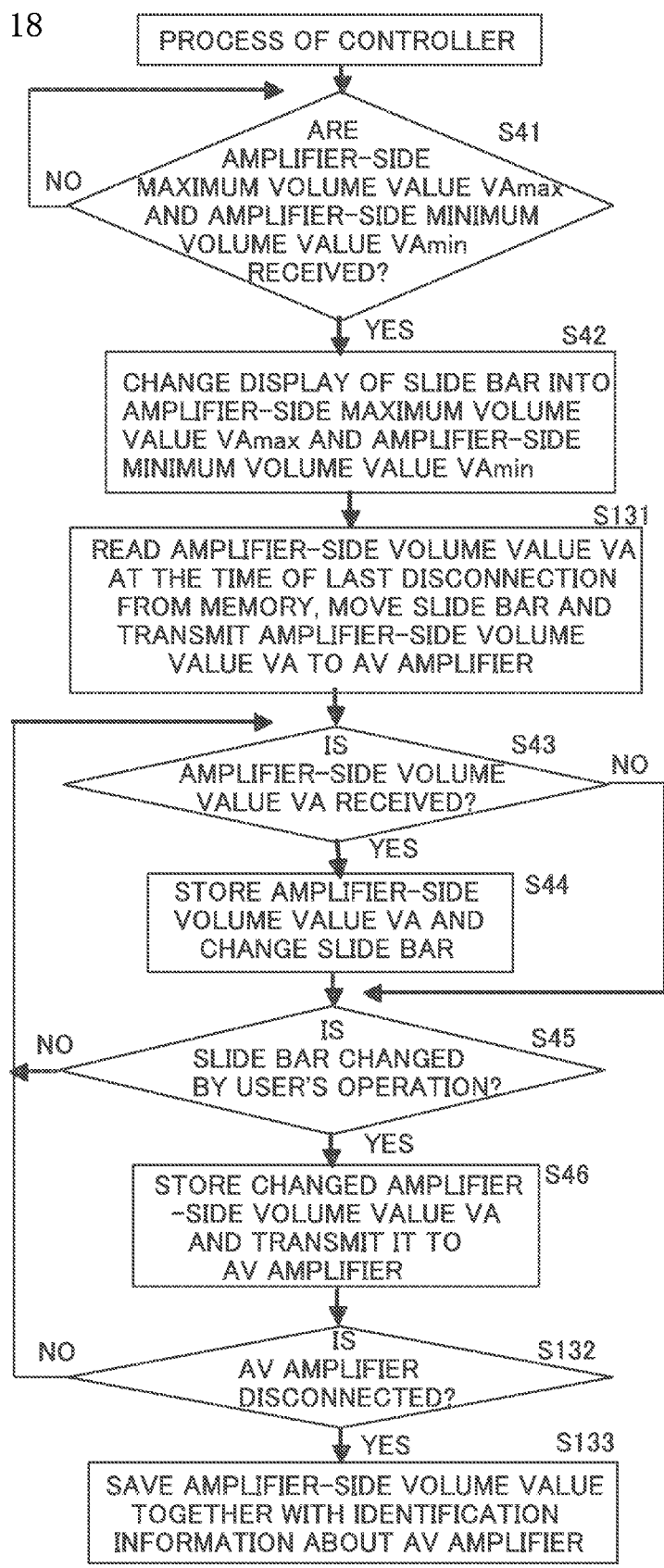
FIG. 18 is a diagram illustrating an operation screen of a controller.

FIG. 18 is a flowchart illustrating a process of the controller 3B in this example corresponding to the third embodiment (FIG. 7). When the controller 3B determines the disconnection from the AV amplifier 11 (YES in S132), the controller 3B associates the amplifier-side volume value VA currently stored in the memory 4 with the identification information about the AV amplifier 11 so as to store it in the memory 4 (S133).

When the controller 3B is connected to the AV amplifier 11 next time, the controller 3B acquires the identification information from the AV amplifier 11, and reads the amplifier-side volume value VA at the time of the last disconnection stored in the memory 4 in association with the acquired identification information from the memory 4. The controller 3B changes the position of the slide bar, and transmits the amplifier-side volume value VA to the AV amplifier 11 (S131). When the control section 12 of the AV amplifier 11 receives the amplifier-side volume value VA, the control section 12 allows the volume control section 16 to change the volume.

Figure 19:
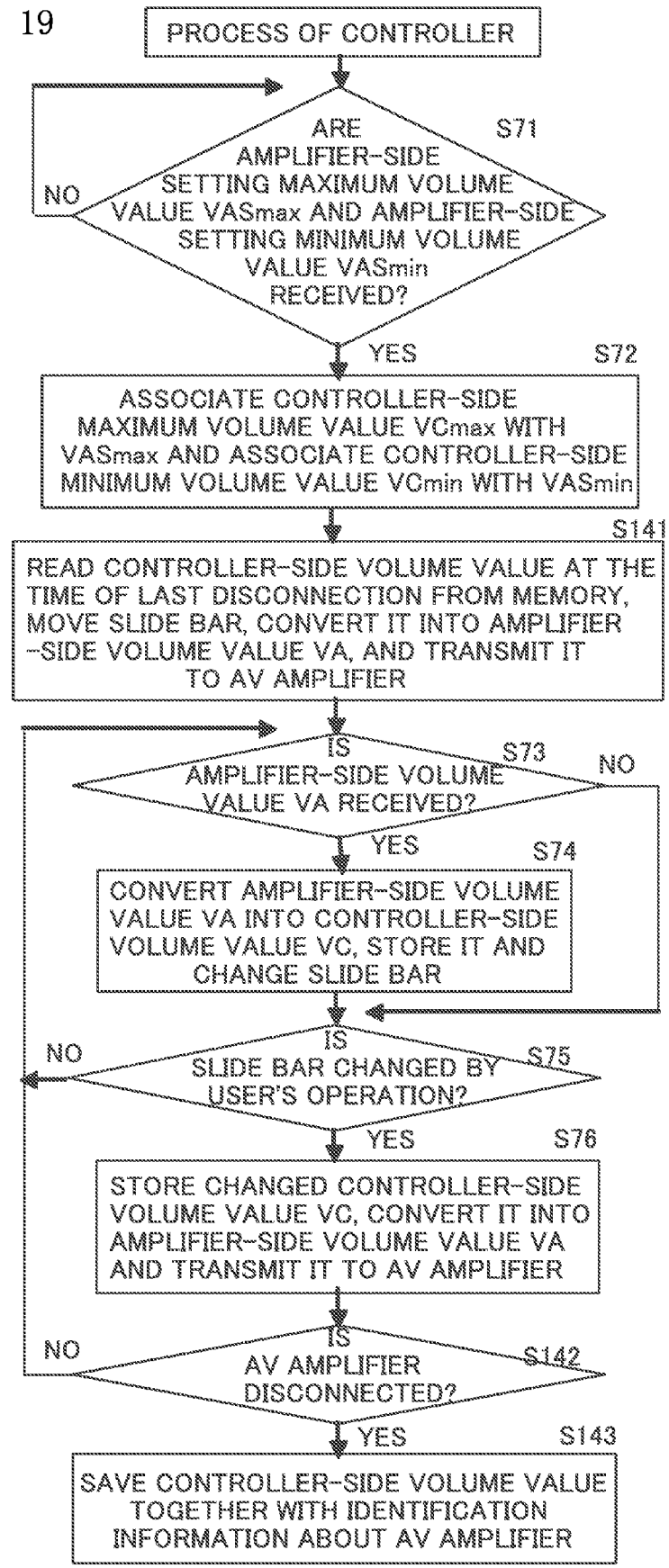
FIG. 19 is a flowchart illustrating a process of the controller.

FIG. 19 is a flowchart illustrating a process of the controller 3B in this example corresponding to the fifth embodiment (FIGS. 10 and 11), and the process in S22 is omitted in the process of the AV amplifier 11 in FIG. 10. When the controller 3B determines the disconnection from the AV amplifier 11 (YES in S142), the controller 3B associates the controller-side volume value VC currently stored in the memory 4 with the identification information about the AV amplifier 11 so as to store them in the memory 4 (S143).

When the controller 3B is connected to the AV amplifier 11 next time, the controller 3B acquires the identification information from the AV amplifier 11, and reads the controller-side volume value VC at the time of the last disconnection stored in the memory 4 in association with the acquired identification information from the memory 4. The controller 3B changes the position of the slide bar, and converts the controller-side volume value VC into the amplifier-side volume value VA so as to transmit it to the AV amplifier 11 (S141). When the control section 12 of the AV amplifier 11 receives the amplifier-side volume value VA (YES in S23), the control section 12 allows the volume control section 16 to changes the volume (S24).

Figure 20:
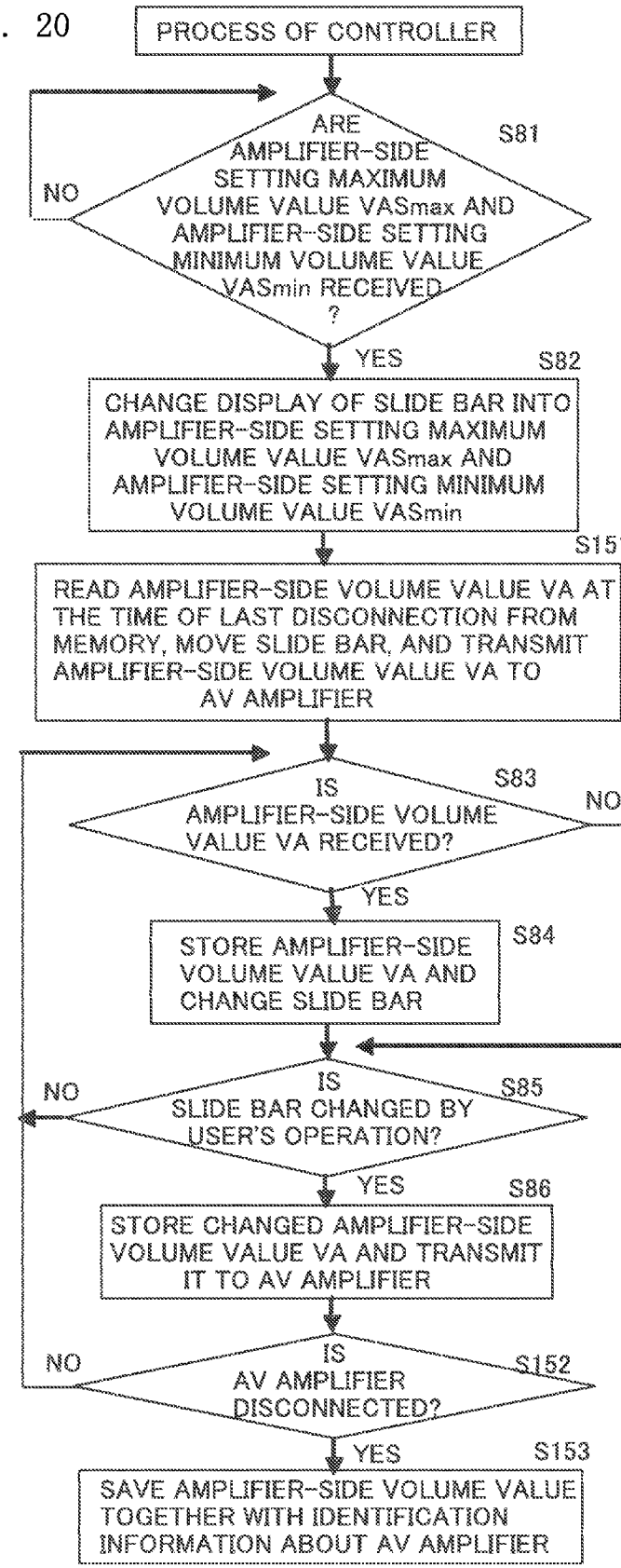
FIG. 20 is a diagram illustrating an operation screen of a controller.

FIG. 20 is a flowchart illustrating a process of the controller 3B in this example corresponding to the sixth embodiment (FIG. 12). When the controller 3B determines that the disconnection from the AV amplifier 11 (YES in S152), the controller 3B associates the amplifier-side volume value VA currently stored in the memory 4 with the identification about the AV amplifier 11 so as to store them in the memory 4 (S153).

When the controller 3B is connected to the AV amplifier 11 next time, the controller 3B acquires the identification information from the AV amplifier 11, and reads the amplifier-side volume value VA at the time of the last disconnection stored in the memory 4 in association with the acquired identification information from the memory 4. The controller 3B changes the position of the slide bar, and transmits the amplifier-side volume value VA to the AV amplifier 11 (S151). When the control section 12 of the AV amplifier 11 receives the amplifier-side volume value VA, the control section 12 allows the volume control section 16 to change the volume.

Figure 21:
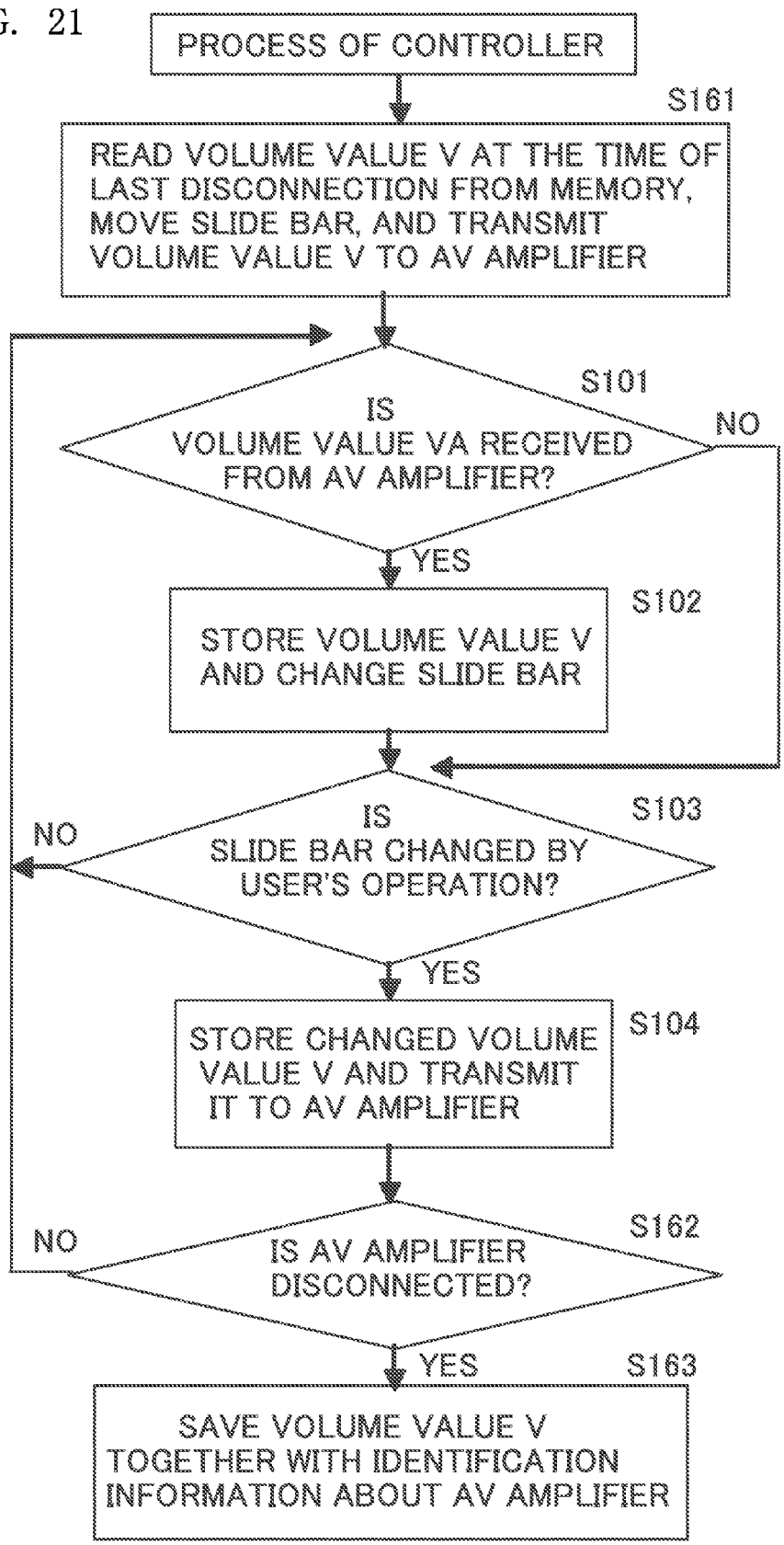
FIG. 21 is a flowchart illustrating a process of the controller.

FIG. 21 is a flowchart illustrating a process of the controller 3B in this example corresponding to the seventh embodiment (FIGS. 14 and 15), and the process in S90 is omitted in the process of the AV amplifier 11 in FIG. 14. When the controller 3B determines the disconnection from the AV amplifier 11 (YES in S162), the controller 3B associates the volume value V currently stored in the memory 4 with the identification information about the AV amplifier 11 so as to store them in the memory 4 (S163).

When the controller 3B is connected to the AV amplifier 11 next time, the controller 3B acquires the identification information from the AV amplifier 11, and reads the volume value V at the time of the last disconnection stored in the memory 4 in association with the acquired identification information from the memory 4. The controller 3B changes the position of the slide bar, and transmits the volume value V to the AV amplifier 11 (S161). When the control section 12 of the AV amplifier 11 receives the volume value V (YES in S91), the control section 12 allows the volume control section 16 to change the volume (S92).

As the need arises, the controller 3B associates the amplifier-side maximum volume value VAmax (or the amplifier-side setting maximum volume value VASmax) and the amplifier-side minimum volume value VAmin (or the amplifier-side setting minimum volume value VASmin) with the identification information about the AV amplifier 11 and stores them in the memory 4 at the time of the disconnection from the AV amplifier 11. The controller 3B reads these pieces of information from the memory at the time of next connection, and thus the AV amplifier 11 does not have to again transmit these pieces of information to the controller 3B at the next connection.

Ninth Embodiment

Figure 22:
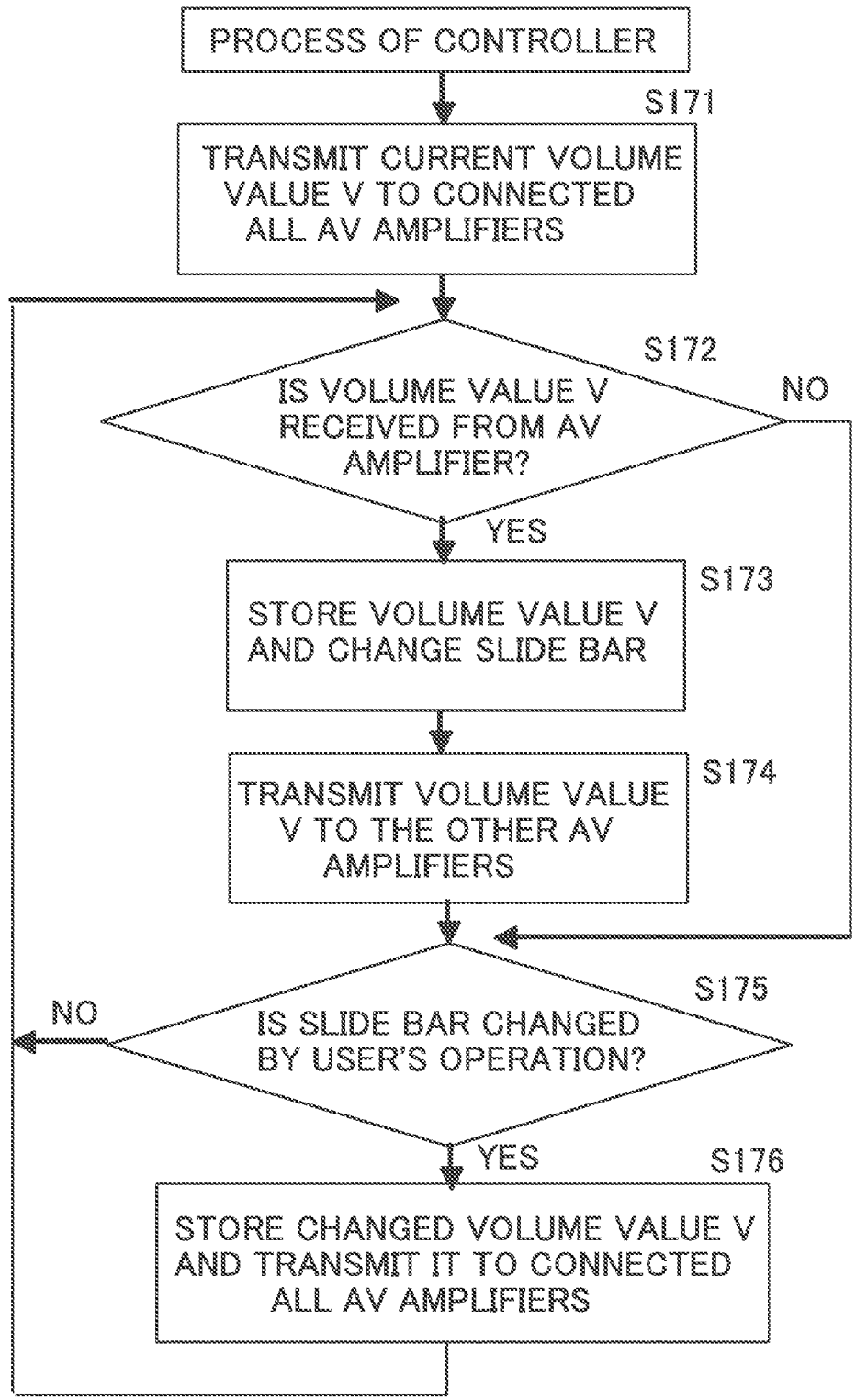
FIG. 22 is a flowchart illustrating a process of the controller.
Figure 23:
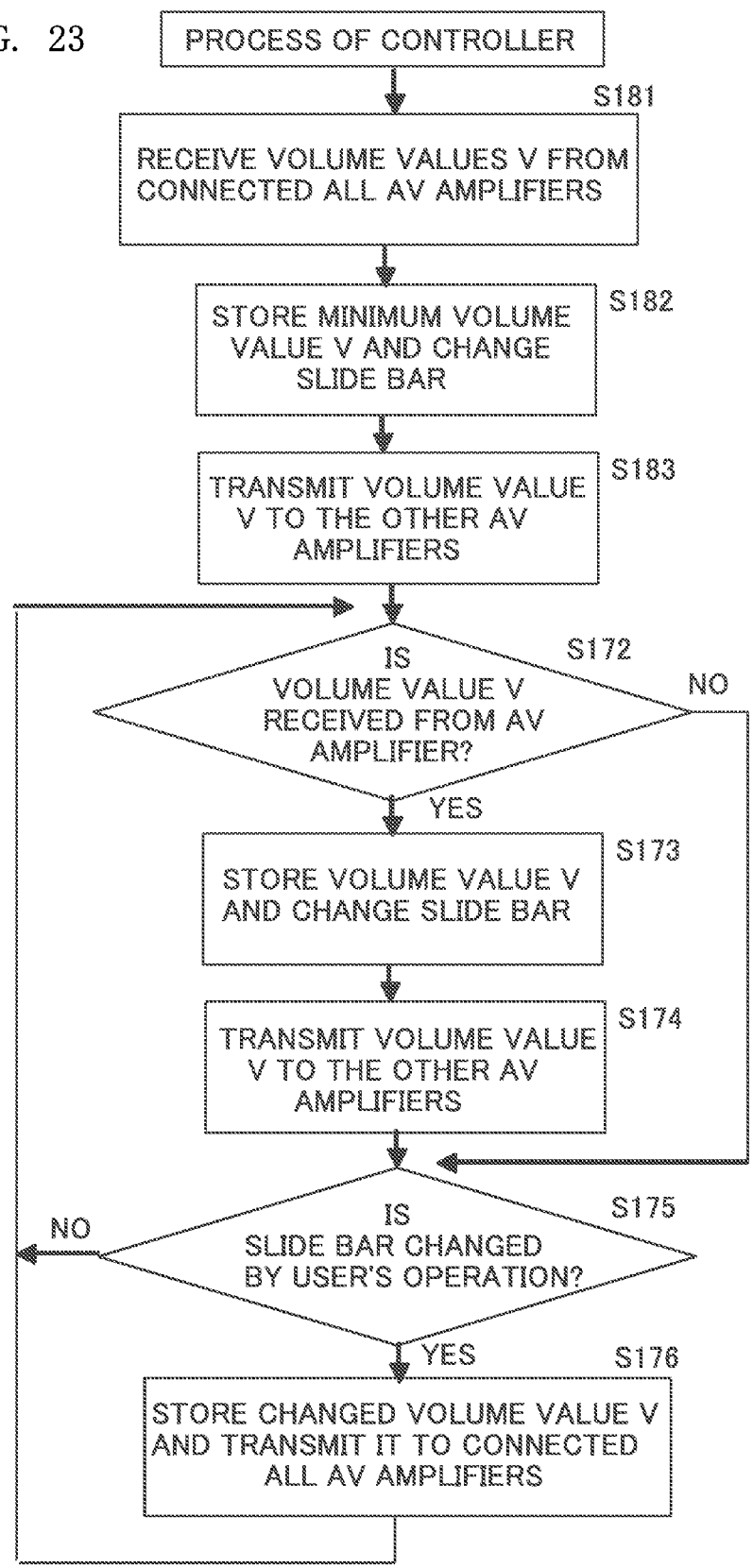
FIG. 23 is a flowchart illustrating a process of the controller.

In general, when a plurality of AV amplifiers 11 can be connected to the controller 3B, the controller screen in FIG. 2 is generated for each AV amplifier, and the volume of each AV amplifier 11 is controlled independently. In the above embodiments, however, only one controller screen including one slide bar is generated for the plurality of AV amplifiers 11, and the volumes of the plurality of AV amplifiers 11 may be controlled to the same value all at once. The description is given below based on the seventh embodiment, but may be based on the other embodiments. FIGS. 22 and 23 illustrate a process of the controller 3B. A process of the AV amplifier 11 is schematically the same as that in FIG. 14. FIGS. 24 to 27 are pattern diagrams describing transmission/reception of commands in this example.

Figure 24:
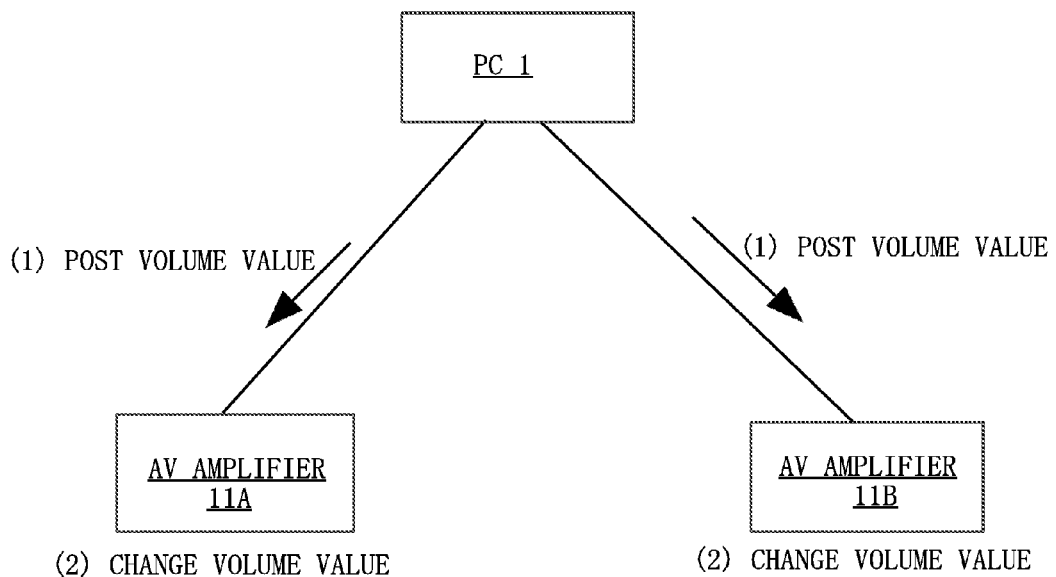
FIG. 24 is a diagram illustrating an operation in the case where a plurality of AV amplifiers are connected to the controller.

An initial operation is described first. As shown in FIGS. 22 and 24, when a plurality of AV amplifiers 11A and 11B are connected to the controller 3B, (1) the controller 3B transmits the volume value V (or the controller-side volume value, the amplifier-side volume value, the same holds for hereinafter) corresponding to the current position of the slide bar to the AV amplifiers 11A and 11B (S171 in FIG. 22). (2) When the AV amplifiers 11A and 11B receive the volume value from the controller 3B, the AV amplifiers 11A and 11B change self volume values (S91 and S92 in FIG. 14). As a result, the volume values V of the controller 3B and the AV amplifiers 11A and 11B can be matched with one another.

Figure 25:
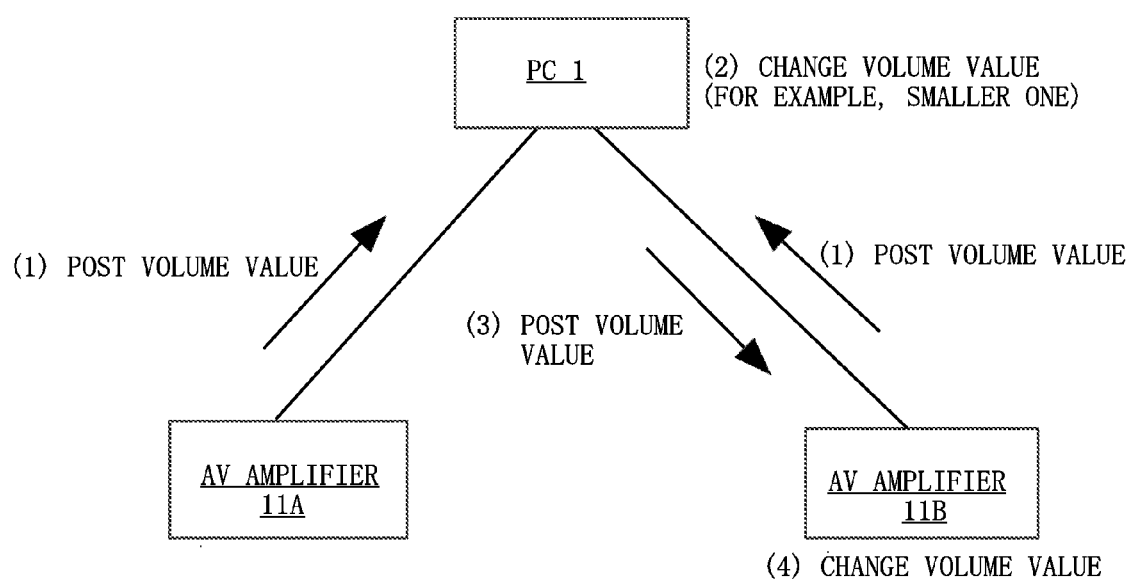
FIG. 25 is a diagram illustrating an operation in the case where a plurality of AV amplifiers are connected to the controller.

In another manner, as shown in FIGS. 23 and 25, when the plurality of AV amplifiers 11A and 11B are connected to the controller 3B, (1) the AV amplifiers 11A and 11B transmit the current volume values V to the controller 3B (S90 in FIG. 14). (2) The controller 3B selects one volume value (not particularly limited, but the minimum volume value, for example) from the volume values V received from the AV amplifiers 11A and 11B, and changes the position of the slide bar (S181 and S182 in FIG. 23). For example, when the volume value V of the AV amplifier 11A is smaller than the volume value V of the AV amplifier 11B, the volume value V of the AV amplifier 11 is selected, and the position of the slide bar of the controller 3B is changed. (3) The controller 3B transmits the selected volume value V (of the AV amplifier 11A) to the AV amplifiers that are connected to the controller 3B and having the volume values being not selected (here, the amplifier 11B) (S183 in FIG. 23). (4) When the AV amplifier 11B receives the volume value from the controller 3B, the AV amplifier 11B changes the volume value of the AV amplifier 11B (S91 and S92 in FIG. 14). As a result, the volume values V of the controller 3B and the AV amplifiers 11A and 11B can be matched with one another. The selection of the smaller volume value can prevent an abrupt increase in the volume value of the other AV amplifiers 11 against a user's will.

Figure 26:
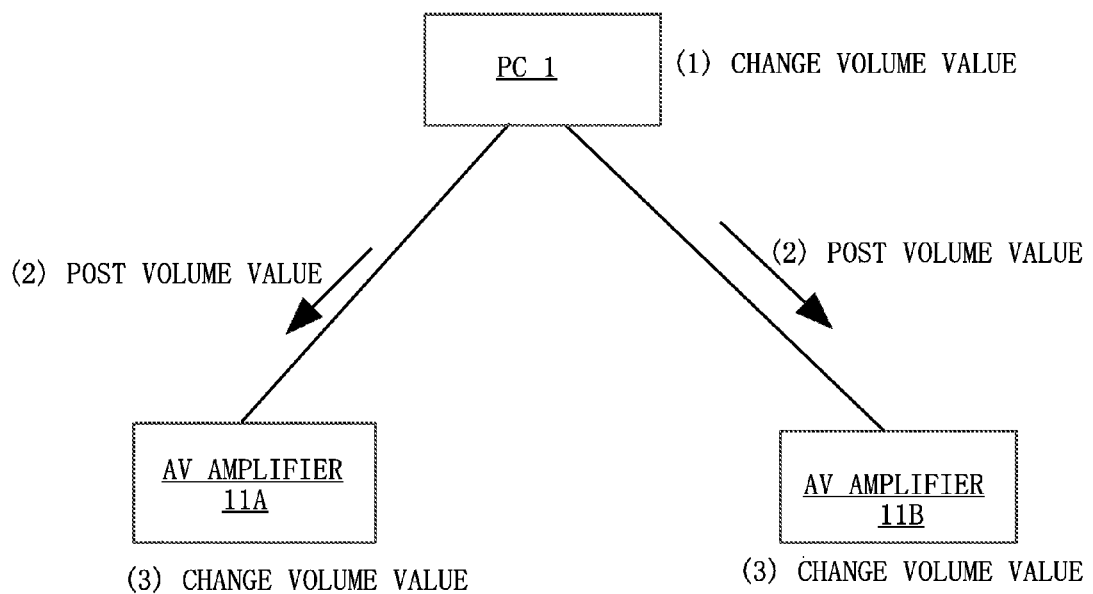
FIG. 26 is a diagram illustrating an operation in the case where a plurality of AV amplifiers are connected to the controller.

Thereafter, as shown in FIG. 26, (1) when the user changes the slide bar of the controller 3B (S175 in FIGS. 22 and 23), the controller 3B stores the changed volume value V in the memory, moves the slide bar and transmits the changed volume value V to all the AV amplifiers 11 (S176). (3) When the AV amplifiers 11A and 11B receive the volume value from the controller 3B, the AV amplifiers 11A and 11B change their own volume values (S91 and S92 in FIG. 14).

Figure 27:
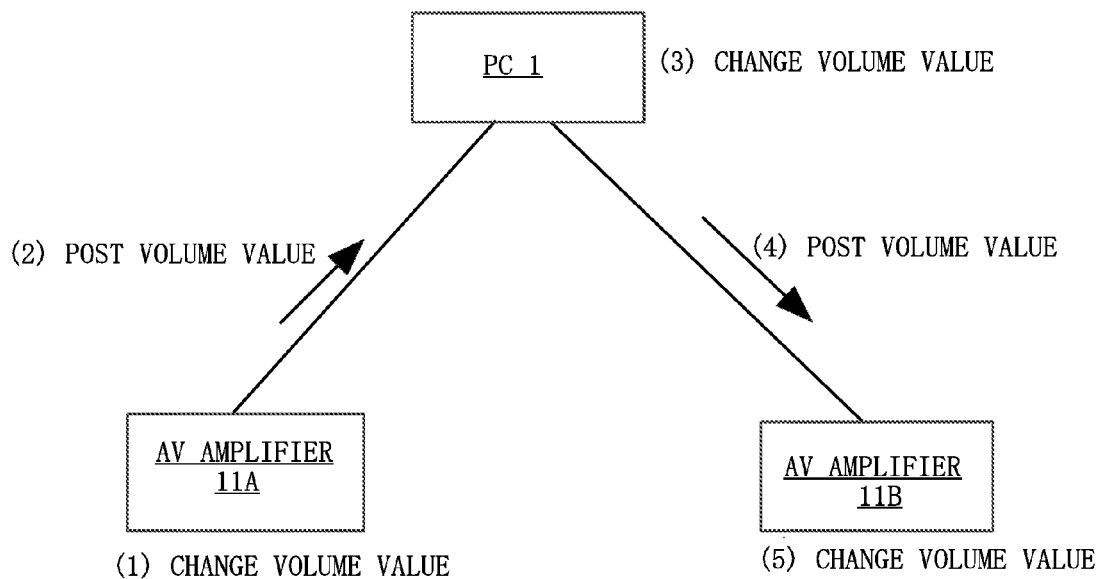
FIG. 27 is a diagram illustrating an operation in the case where a plurality of AV amplifiers are connected to the controller.

On the other hand, as shown in FIG. 27, (1) when the volume value V of one AV amplifier (here, the AV amplifier 11A) is changed by a user's operation of the volume control knob (S93 and S94 in FIG. 14), (2) the AV amplifier 11A transmits the changed volume value V to the controller 3B (S95). (3) When the controller 3B receives the volume value V from the AV amplifier 11A (S172 in FIGS. 22 and 23), the controller 3B changes the position of the slide bar to the received volume value V (S173). (4) The controller 3B transmits the changed volume value V to all the AV amplifiers 11 (herein, the AV amplifier 11B) that are connected to the controller 3B other than the AV amplifier 11A that transmits the volume value V (S174). (5) When the AV amplifier 11B receives the volume value from the controller 3B, the AV amplifier 11B changes the volume value of the AV amplifier 11B (S91 and S92 in FIG. 14).

Tenth Embodiment

Figure 28:
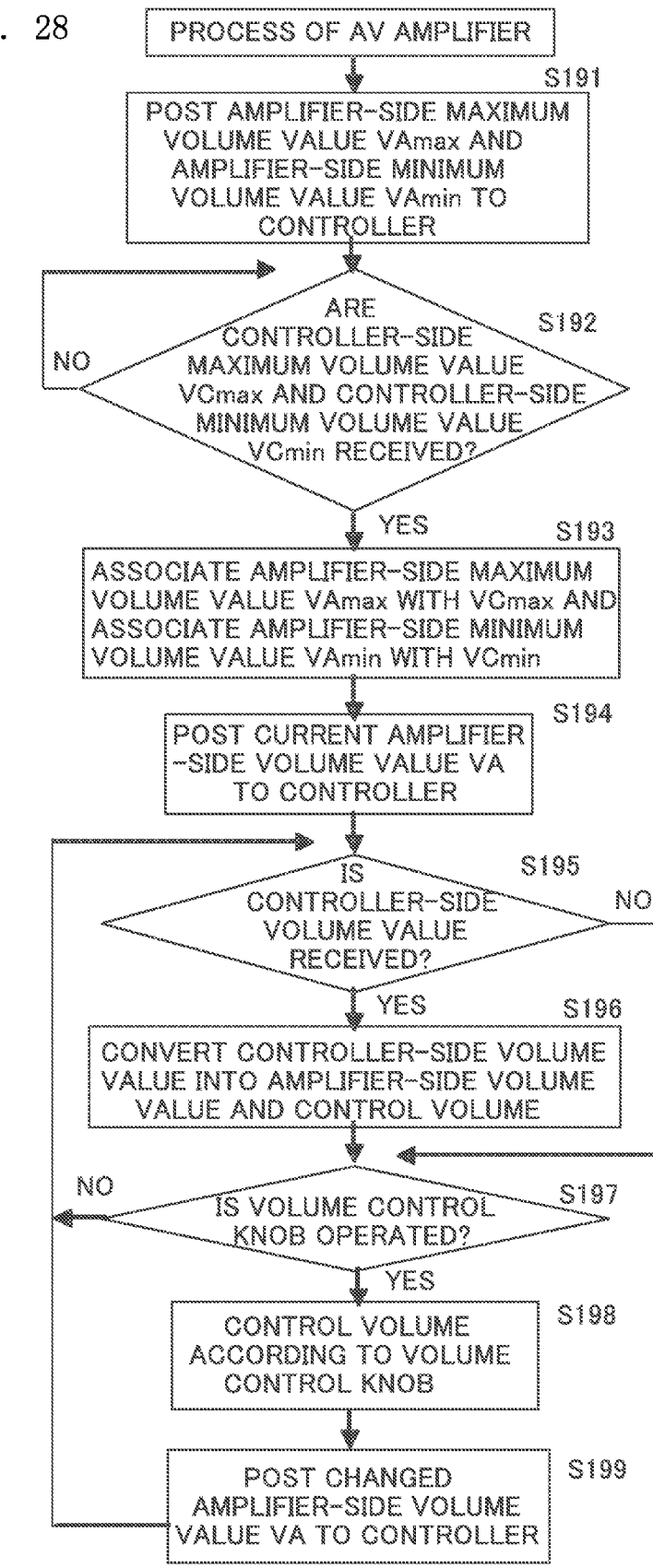
FIG. 28 is a flowchart illustrating a process of a control section of the AV amplifier.
Figure 29:
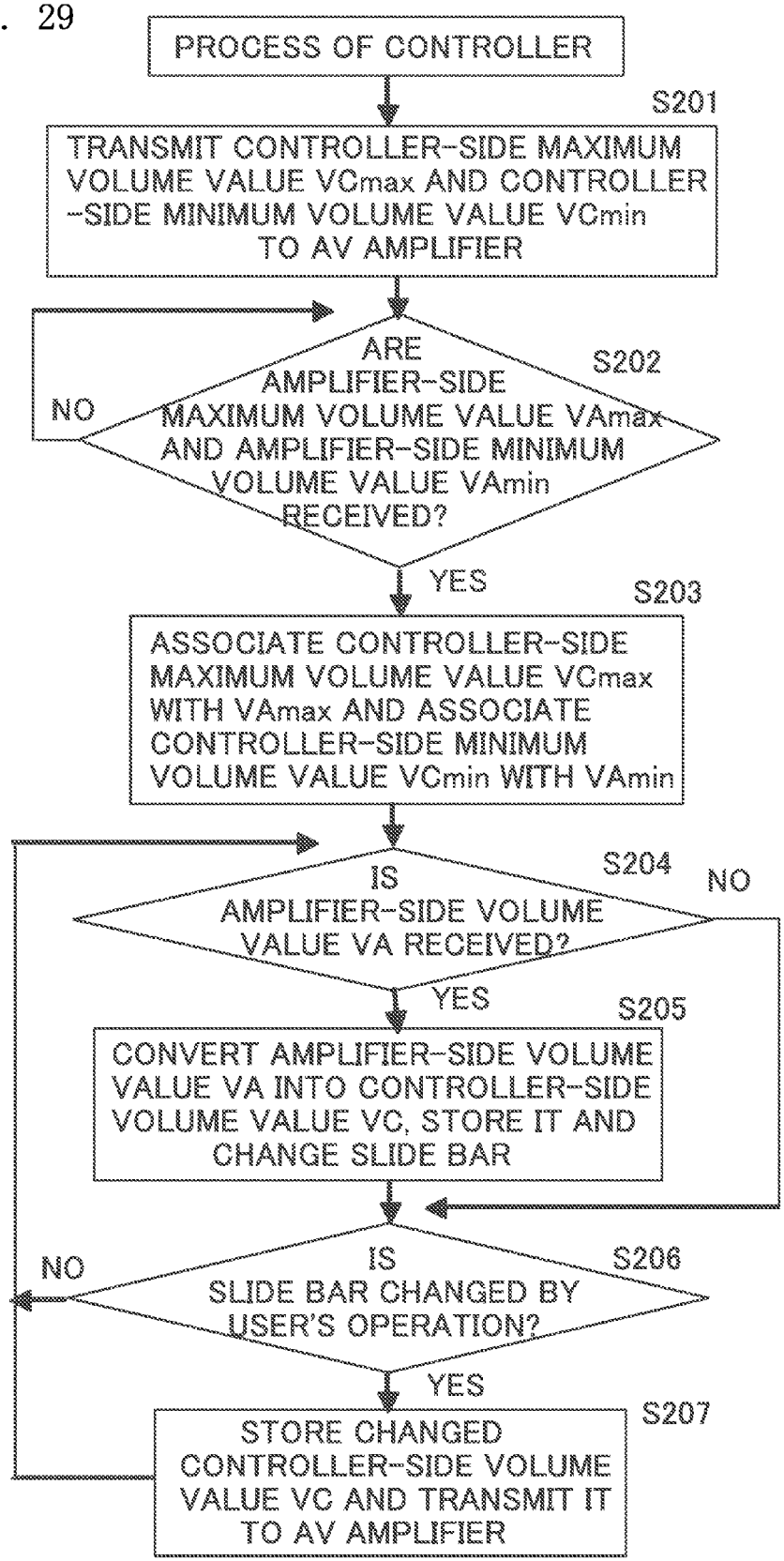
FIG. 29 is a flowchart illustrating a process of the controller.

Still another preferred embodiment of the present invention is described below. In comparison with the first and second embodiments, both the AV amplifier 11 and the controller 3B carry out the conversion between the controller-side volume value VC and the amplifier-side volume value VA in this example. FIG. 28 is a flowchart illustrating a process of the control section 12 of the AV amplifier 11, and FIG. 29 is a flow chart illustrating a process of the controller 3B. When the controller 3B is connected to the AV amplifier 11, the control section 12 of the AV amplifier 11 reads the amplifier-side maximum volume value VAmax (in this example, 0 dB) and the amplifier-side minimum volume value VAmin from the memory 13 and transmits them to the controller 3B (S191).

The controller 3B determines whether or not the amplifier-side maximum volume value VAmax and the amplifier-side minimum volume value VAmin are received (S202). When they are received (YES in S202), the controller 3B associates the amplifier-side maximum volume value VAmax with the controller-side maximum volume value VCmax and associates the amplifier-side minimum volume value VAmin with the controller-side minimum volume value VCmin so as to store them in the memory 4 (S203).

The controller 3B transmits the controller-side maximum volume value VCmax and the controller-side minimum volume value VCmin to the AV amplifier 11 (S201).

The control section 12 of the AV amplifier 11 determines whether or not the controller-side maximum volume value VCmax and the controller-side minimum volume value VCmin are received (S192). When they are received (YES in S192), the control section 12 associates the amplifier-side maximum volume value VAmax with the controller-side maximum volume value VCmax and associates the amplifier-side minimum volume value VAmin with the controller-side minimum volume value VCmin so as to store them in the memory 13 (S193).

The control section 12 of the AV amplifier 11 posts the current amplifier-side volume value VA to the controller 3B (S194). The controller 3B determines whether the amplifier-side volume value VA is received from the AV amplifier 11 (S204). When it is received (YES in S204), the controller 3B converts the received amplifier-side volume value VA into the controller-side volume value VC based on the formula 1, stores it in the memory 4 so as to change the slide bar based on the controller-side volume value VC (S205).

The controller 3B determines whether the slide bar is moved by the user's operation (S206). When it is moved (YES in S206), the controller 3B stores the controller-side volume value VC determined by the position of the moved slide bar in the memory 4, and transmits it to the AV amplifier 11 (S207).

The control section 12 of the AV amplifier 11 determines whether or not the controller-side volume value VC is received (S195). When it is received (YES in S195), the control section 12 converts the received controller-side volume value VC into the amplifier-side volume value VA based on the formula 2, and changes the volume of the volume control section 16 (S196). Thereafter, the control section 12 determines whether or not the volume control knob (or the volume control button of the remote controller) is operated by the user (S197). When it is operated (YES in S197), the control section 12 changes the volume of the volume control section 16 into the amplifier-side volume value VA determined according to the operating position of the volume control knob (S198). The control section 12 posts the changed amplifier-side volume value VA to the controller 3B (S199).

Similarly to the above, the controller 3B determines whether or not the amplifier-side volume value VA is received from the AV amplifier 11 (S204). When it is received (YES in S204), the controller 3B converts the received amplifier-side volume value VA into the controller-side volume value VC based on the formula 1, stores it in the memory 4, and changes the slide bar based on the controller-side volume value VC (S205).

Figure 30:
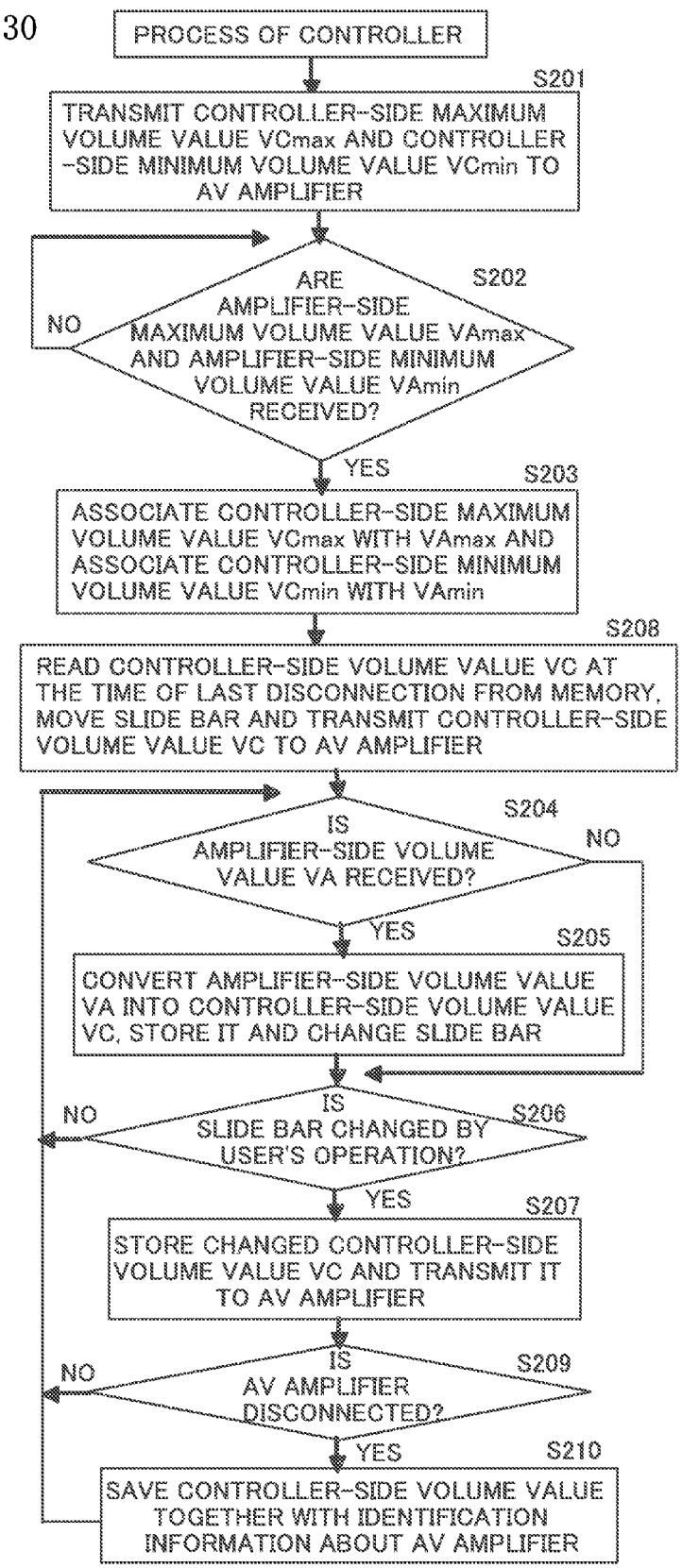
FIG. 30 is a flowchart illustrating a process of the controller.

FIG. 30 is a flowchart illustrating another process of the controller 3B. When the controller 3B determines the disconnection from the AV amplifier 11 (YES in S209), the controller 3B associates the controller-side volume value VC currently stored in the memory 4 with the identification information about the AV amplifier 11 so as to store them in the memory 4 (S210).

When the controller 3B is connected to the AV amplifier 11 next time, the controller 3B acquires the identification information from the AV amplifier 11, and reads the controller-side volume value VC at the time of the last disconnection stored in the memory 4 in association with the acquired identification information from the memory 4. The controller 3B changes the position of the slide bar, and transmits the controller-side volume value VC to the AV amplifier 11 (S208). When the control section 12 of the AV amplifier 11 receives the controller-side volume value VC (YES in S195), the control section 12 converts the controller-side volume value VC into the amplifier-side volume value, and allows the volume control section 16 to change the volume (S196).

Eleventh Embodiment

Figure 31:
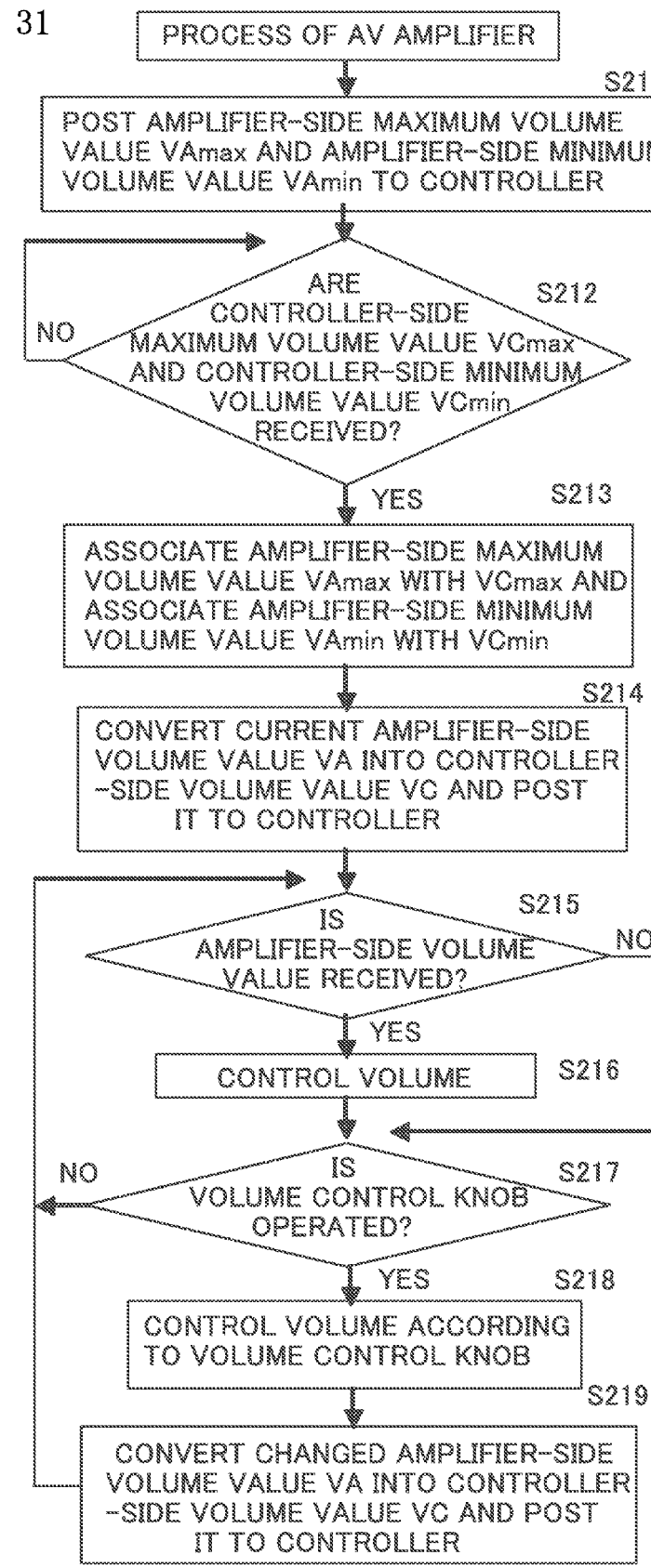
FIG. 31 is a flowchart illustrating a process of a control section of the AV amplifier.
Figure 32:
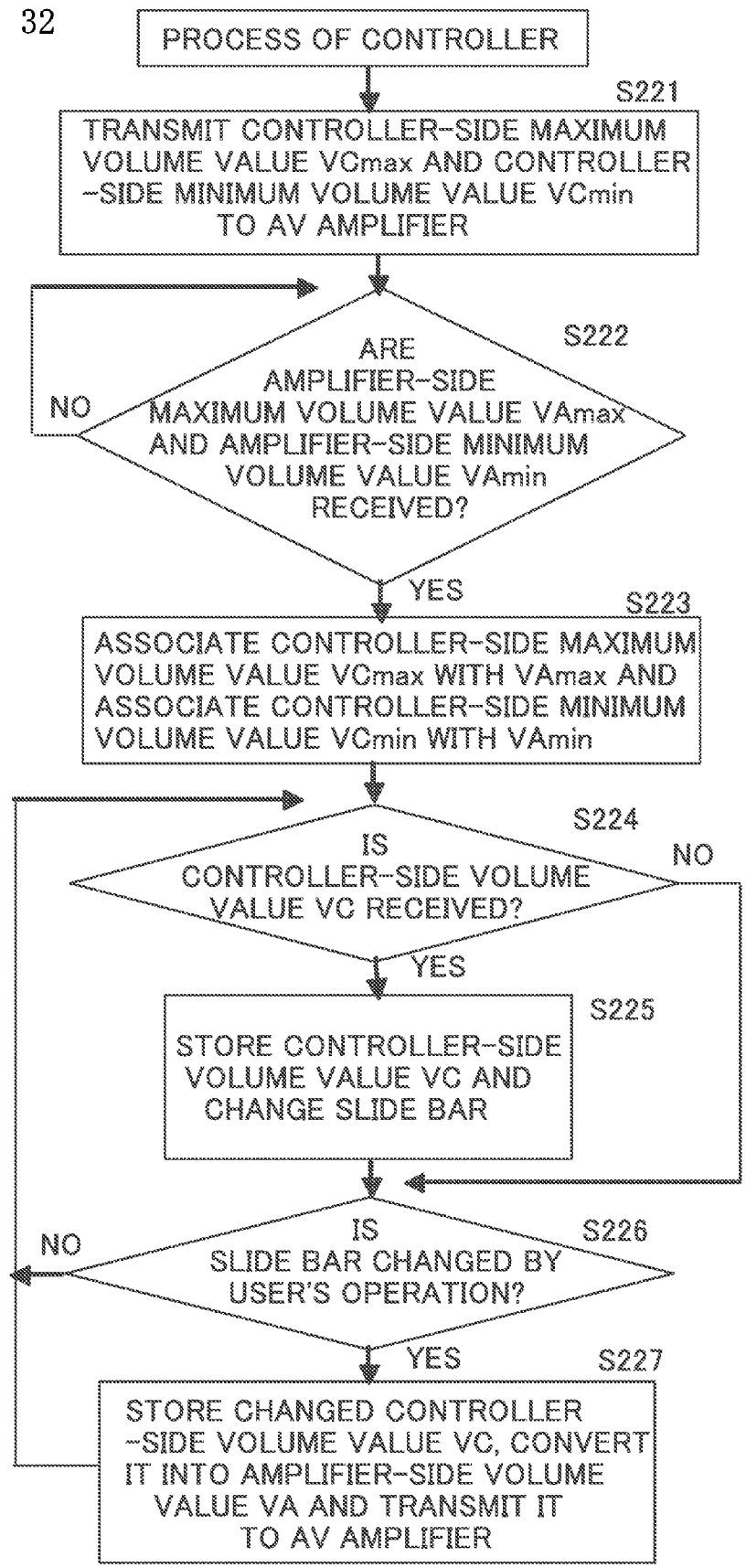
FIG. 32 is a flowchart illustrating a process of the controller.

Still another preferred embodiment of the present invention is described below. In comparison with the first and second embodiments, both the AV amplifier 11 and the controller 3B carry out conversion between the controller-side volume value VC and the amplifier-side volume value VA in this example. FIG. 31 is a flowchart illustrating a process of the control section 12 of the AV amplifier 11, and FIG. 32 is a flowchart illustrating a process of the controller 3B. When the controller 3B is connected to the AV amplifier 11, the control section 12 of the AV amplifier 11 reads the amplifier-side maximum volume value VAmax and the amplifier-side minimum volume value VAmin from the memory 13 and transmits them to the controller 3B (S211).

The controller 3B determines whether or not the amplifier-side maximum volume value VAmax and the amplifier-side minimum volume value VAmin are received (S222). When they are received (YES in S222), the controller 3B associates the amplifier-side maximum volume value VAmax with the controller-side maximum volume value VCmax and associates the amplifier-side minimum volume value VAmin with the controller-side minimum volume value VCmin so as to store them in the memory 4 (S223).

The controller 3B transmits the controller-side maximum volume value VCmax and the controller-side minimum volume value VCmin to the AV amplifier 11 (S221).

The control section 12 of the AV amplifier 11 determines whether or not the controller-side maximum volume value VCmax and the controller-side minimum volume value VCmin are received (S121). When they are received (YES in S212), the control section 12 associates the amplifier-side maximum volume value VAmax with the controller-side maximum volume value VAmax and associates the amplifier-side minimum volume value VAmin with the controller-side minimum volume value VCmin so as to store them in the memory 13 (S213).

The control section 12 of the AV amplifier 11 converts the current amplifier-side volume value VA into the controller-side volume value VC and posts it to the controller 3B (S214). The controller 3B determines whether or not the controller-side volume value VC is received from the AV amplifier 11 (S224). When it is received (YES in S224), the controller 3B stores the received controller-side volume value VC in the memory 4, and changes the slide bar based on the controller-side volume value VC (S225).

Thereafter, the controller 3B determines whether the slide bar is moved by the user's operation (S226). When it is moved (YES in S226), the controller 3B stores the controller-side volume value VC determined by the position of the moved slide bar in the memory 4, and converts it into the amplifier-side volume value VA so as to transmit it to the AV amplifier 11 (S227).

The control section 12 of the AV amplifier 11 determines whether or not the amplifier-side volume value VA is received (S215). When it is received (YES in S215), the control section 12 changes the volume of the volume control section 16 based on the received amplifier-side volume value VA (S216). Thereafter, the control section 12 determines whether or not the volume control knob (or the volume control button of the remote controller) is operated by the user (S217). When it is operated (YES in S217), the control section 12 changes the volume of the volume control section 16 into the amplifier-side volume value VA determined according to the operating position of the volume control knob (S218). The control section 12 changes the changed amplifier-side volume value VA into the controller-side volume value, and posts it to the controller 3B (S219).

Similarly to the above, the controller 3B determines whether or not the controller-side volume value VC is received from the AV amplifier 11 (S224). When it is received (YES in S224), the controller 3B stores the received controller-side volume value VC in the memory 4, and changes the slide bar based on the controller-side volume value VC (S225).

Figure 33:
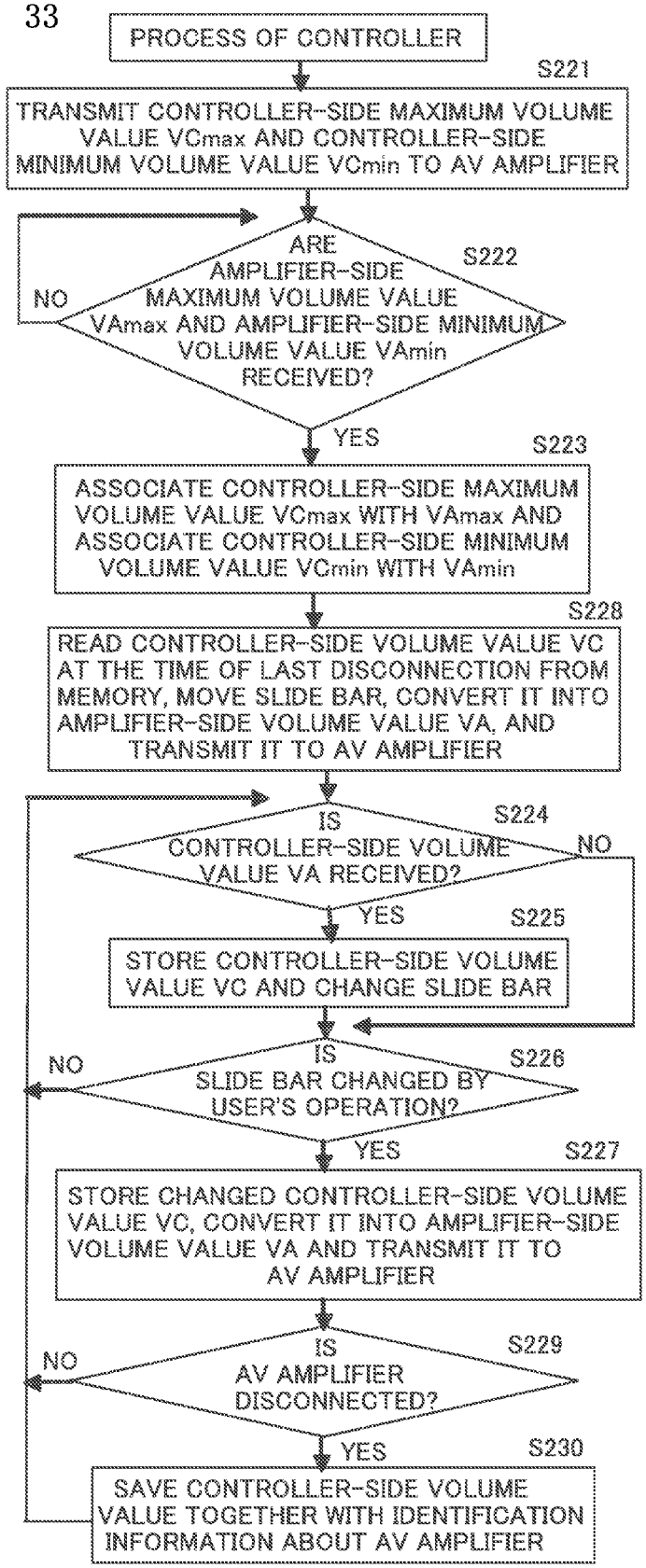
FIG. 33 is a flowchart illustrating a process of the controller.

FIG. 33 is a flowchart illustrating another process of the controller 3B. The controller 3B determines the disconnection from the AV amplifier 11 (YES in S229), the controller 3B associates the controller-side volume value VC currently stored in the memory 4 with the identification information about the AV amplifier 11 so as to store them in the memory 4 (S230).

When the controller 3B is connected to the AV amplifier 11 next time, the controller 3B acquires the identification information from the AV amplifier 11, and reads the controller-side volume value VC at the time of the last disconnection stored in the memory 4 in association with the acquired identification information from the memory 4. The controller 3B changes the position of the slide bar, and converts the controller-side volume value VC into the amplifier-side volume value VA so as to transmit it to the AV amplifier 11 (S228). When the control section 12 of the AV amplifier 11 receives the amplifier-side volume value VA (YES in S215), the control section 12 allows the volume control section 16 to change the volume (S216).

Twelfth Embodiment

Figure 34:
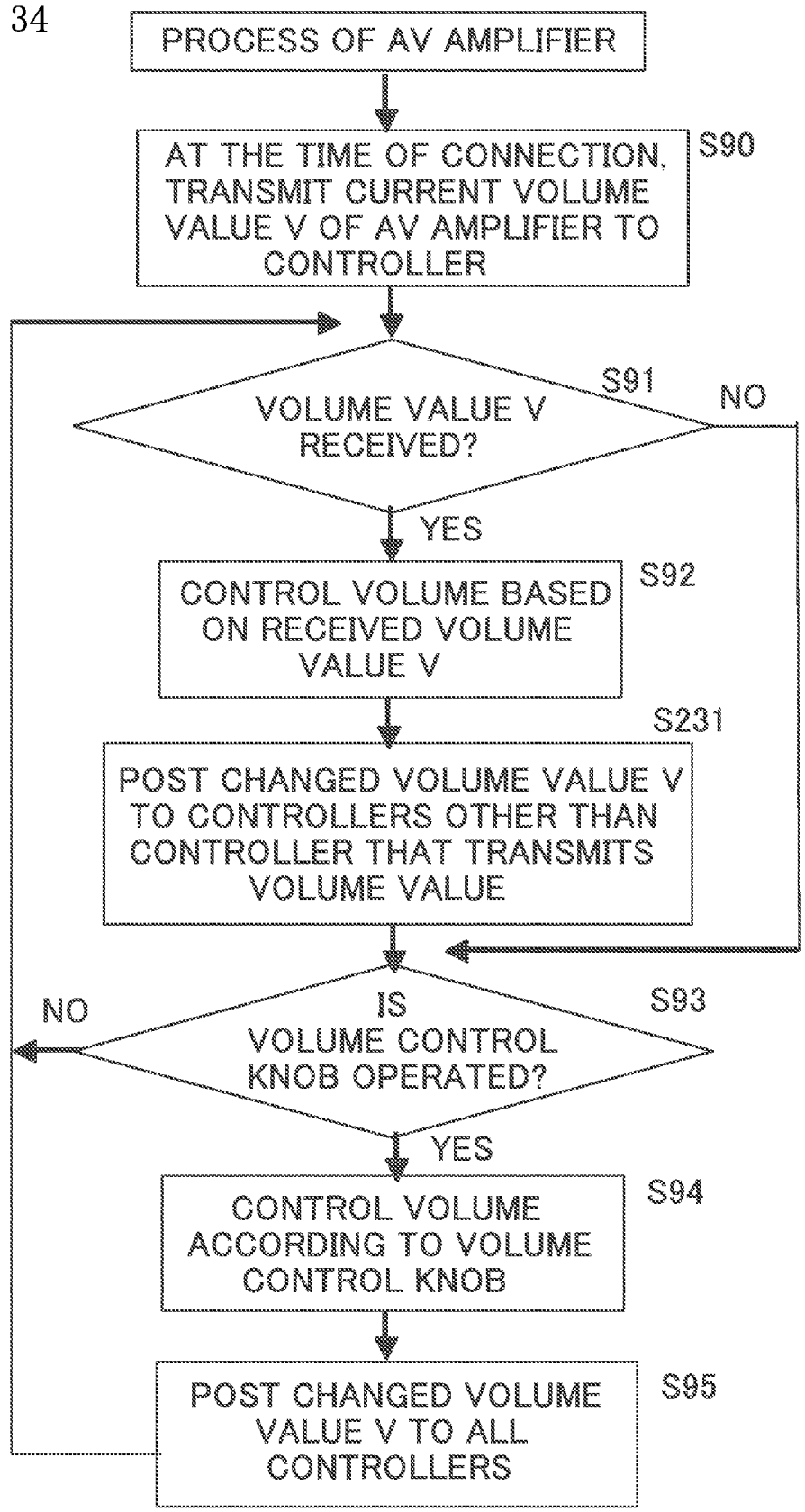
FIG. 34 is a flowchart illustrating a process of a control section of the AV amplifier.
Figure 35:
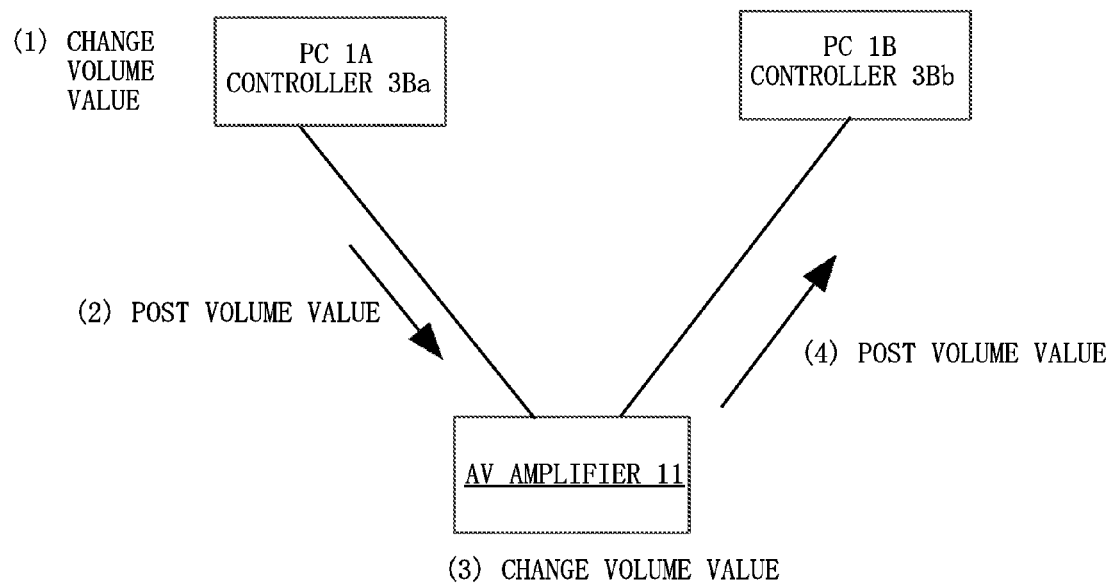
FIG. 35 is a diagram illustrating an operation in the case where a plurality of controllers are connected to the AV amplifier.

In this example, a plurality of controllers 3B (for example, controllers 3Ba and 3Bb) are present, and each controller can control the AV amplifier 11. The following description is based on the seventh embodiment, but may be based on the other embodiments. A process of the AV amplifier 11 is shown in FIG. 34, and processes of the respective controllers are the approximately same as that in FIG. 15. FIG. 35 is a pattern diagram describing the transmission/reception of commands in this example.

In the controller 3Ba, (1) when the slide bar is changed by the user's operation (S103), the controller 3B store the changed volume value VA in the memory and moves the slide bar, and (2) transmits the changed volume value V to the AV amplifier 11 (S104). (3) When the AV amplifier 11 receives the volume value from the controller 3Ba, the AV amplifier 11 changes its own volume value (S91 and S92). Thereafter, (4) the AV amplifier 11 specifies the controller other than the controller that transmits the volume value, and transmits the changed volume value to the controller (3Bb) (S231). The controller 3Bb other than the controller that transmits the volume value receives the volume value from the AV amplifier 11, stores the volume value V in the memory, and moves the slide bar (S101 and S102).

Figure 36:
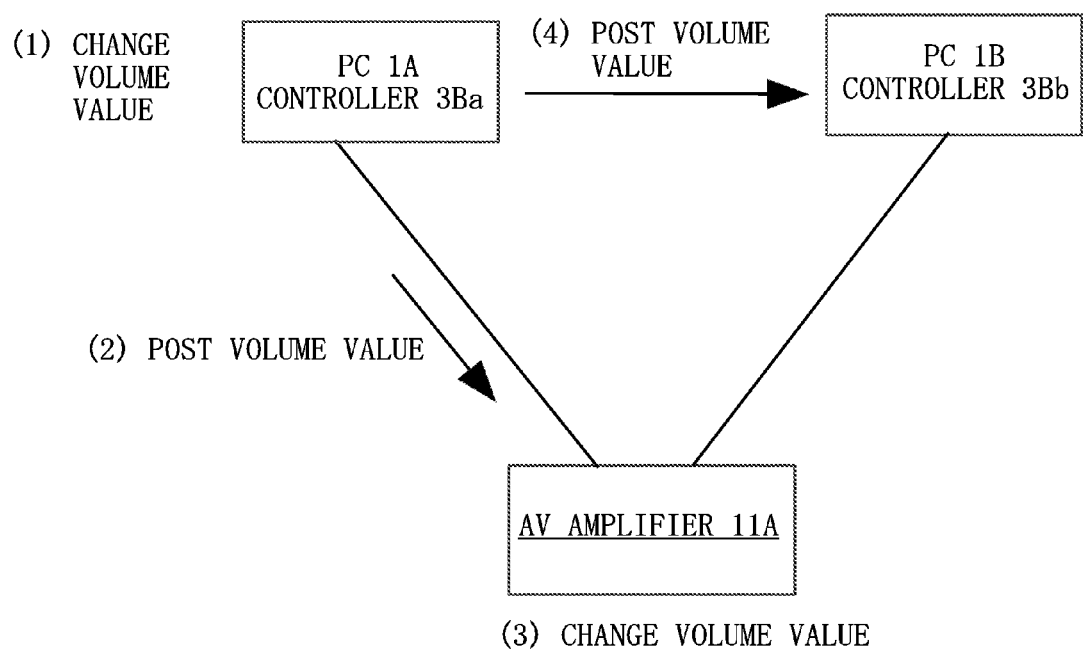
FIG. 36 is a diagram illustrating an operation in the case where a plurality of controllers are connected to the AV amplifier.

In another manner, as shown in FIG. 36, (4) the controller 3Ba may transmit the changed volume value V to the controller 3Bb (S103 and S104), and the controller 3Bb may receive the volume value from the controller 3Ba and stores the volume value V in the memory so as to move the slide bar (S101 and S102).

The above describes the preferred embodiments of the present invention, but the present invention is not limited to these embodiments. In the above embodiments, when the controller 3B changes the volume of the AV amplifier 11, the volume value of the AV amplifier 11 is gradually increased or decreased. As a result, even when the user abruptly changes the slide bar of the controller 3B by mistake, the volume of the AV amplifier 11 only gradually changes. For this reason, while the volume is being changed, the user can again changes the slide bar of the controller 3B to a suitable position. The above controller program 3B or a recording medium in which this computer program is recorded may be provided. A computer program for allowing a computer to operate the AV amplifier or a recording medium in which this computer program is recorded may be provided.

What is claimed is:

1. An amplifying apparatus in a volume control system, the volume control system including the amplifying apparatus and a controller connectable to the amplifying apparatus, the controller having a display section for displaying a controller-side volume value on a display device, a second receiving section for receiving a controller-side volume value from the amplifying apparatus, a changing section for changing the controller-side volume value to be displayed on the display device by the display section into the controller-side volume value received by the second receiving section, a second input section into which an instruction for changing the controller-side volume value to be displayed on the display device by the display section is input by a user's operation, and a second transmitting section for, when the instruction for changing the controller-side volume value to be displayed on the display device by the display section is input by the user's operation, transmitting the changed controller-side volume value to the amplifying apparatus, the amplifying apparatus comprising:

a first receiving section for receiving a controller-side volume value from the controller;

a first converting section for converting the controller-side volume value received by the first receiving section into an amplifier-side volume value;

a first input section into which an instruction for changing the amplifier side-volume value is input by a user's operation;

a second converting section for, when the instruction for changing the amplifier-side volume value is input by the user's operation, converting the changed amplifier-side volume value into the controller-side volume value;

a first transmitting section for transmitting the controller-side volume value converted by the second converting section to the controller; and a volume control section for, when the first receiving section receives the controller-side volume value or the changed amplifier-side volume value is input into the first input section, controlling a volume of the amplifying apparatus based on the amplifier-side volume value, wherein the first converting section converts the controller-side volume value into an amplifier-side volume value based on a controller-side maximum volume value, a controller-side minimum volume value, an amplifier-side maximum volume value as a maximum value of an amplifier-side volume value controllable by the first input section, and an amplifier-side minimum volume value as a minimum value of an amplifier-side volume value controllable by the first input section, the second converting section converts the amplifier-side volume value into the controller-side volume value based on the controller-side maximum volume value, the controller-side minimum volume value, the amplifier-side maximum volume value, and the amplifier-side minimum volume value.

2. An amplifying apparatus in a volume control system, the volume control system including the amplifying apparatus and a controller connectable to the amplifying apparatus, the controller having a display section for displaying a controller-side volume value on a display device, a second receiving section for receiving a controller-side volume value from the amplifying apparatus, a changing section for changing the controller-side volume value to be displayed on the display device by the display section into the controller-side volume value received by the second receiving section, a second input section into which an instruction for changing the controller-side volume value to be displayed on the display device by the display section is input by a user's operation, and a second transmitting section for, when the instruction for changing the controller-side volume value to be displayed on the display device by the display section is input by the user's operation, transmitting the changed controller-side volume value to the amplifying apparatus, the amplifying apparatus comprising:

a first receiving section for receiving a controller-side volume value from the controller;

a first converting section for converting the controller-side volume value received by the first receiving section into an amplifier-side volume value;

a first input section into which an instruction for changing the amplifier side-volume value is input by a user's operation;

a second converting section for, when the instruction for changing the amplifier-side volume value is input by the user's operation, converting the changed amplifier-side volume value into the controller-side volume value;

a first transmitting section for transmitting the controller-side volume value converted by the second converting section to the controller; and a volume control section for, when the first receiving section receives the controller-side volume value or the changed amplifier-side volume value is input into the first input section, controlling a volume of the amplifying apparatus based on the amplifier-side volume value, wherein the first converting section converts the controller-side volume value into the amplifier-side volume value based on a controller-side maximum volume value, a controller-side minimum volume value, an amplifier-side setting maximum volume value that is a maximum value of an amplifier-side volume value controllable by the controller and is smaller than the amplifier-side maximum volume value as the maximum value of the amplifier-side volume value controllable by the first input section, and an amplifier-side setting minimum volume value (or the amplifier-side minimum volume value) that is a minimum value of an amplifier-side volume value controllable by the controller and is larger than the amplifier-side minimum volume value as the minimum value of the amplifier-side volume value controllable by the first input section, the second converting section converts the amplifier-side volume value into the controller-side volume value based on the controller-side maximum volume value, the controller-side minimum volume value, the amplifier-side setting maximum volume value, and the amplifier-side setting minimum volume value (or the amplifier-side minimum volume value).

3. A controller in a volume control system, the volume control system including an amplifying apparatus and the controller connectable to the amplifying apparatus, the amplifying apparatus having a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, and a volume control section for, when the first receiving section receives the amplifier-side volume value or the changed amplifier-side volume value is input into the first input section, controlling a volume value of the amplifying apparatus based on the amplifier-side volume value, the controller comprising:

a display section for displaying a controller-side volume value on a display device;

a second receiving section for receiving the amplifier-side volume value from the amplifying apparatus;

a first changing section for converting the amplifier-side volume value received by the second receiving section into the controller-side volume value;

a changing section for changing the controller-side volume value to be displayed on the display device by the display section into the controller-side volume value converted by the first converting section;

a second input section into which an instruction for changing the controller-side volume value to be displayed on the display device by the display section is input by a user's operation;

a second converting section for, when the instruction for changing the controller-side volume value to be displayed on the display device by the display section is input by the user's operation, converting the changed controller-side volume value into the amplifier-side volume value; and a second transmitting section for transmitting the amplifier-side volume value converted by the second converting section to the amplifying apparatus, wherein the first converting section converts the amplifier-side volume value into the controller-side volume value based on a controller-side maximum volume value, a controller-side minimum volume value, an amplifier-side maximum volume value as a maximum value of an amplifier-side volume value controllable by the first input section, and an amplifier-side minimum volume value as a minimum value of an amplifier-side volume value controllable by the first input section, the second converting section converts the controller-side volume value into the amplifier-side volume value based on the controller-side maximum volume value, the controller-side minimum volume value, the amplifier-side maximum volume value, and the amplifier-side minimum volume value.

4. A controller in a volume control system, the volume control system including an amplifying apparatus and the controller connectable to the amplifying apparatus, the amplifying apparatus having a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, and a volume control section for, when the first receiving section receives the amplifier-side volume value or the changed amplifier-side volume value is input into the first input section, controlling a volume value of the amplifying apparatus based on the amplifier-side volume value, the controller comprising:

a display section for displaying a controller-side volume value on a display device;

a second receiving section for receiving the amplifier-side volume value from the amplifying apparatus;

a first changing section for converting the amplifier-side volume value received by the second receiving section into the controller-side volume value;

a changing section for changing the controller-side volume value to be displayed on the display device by the display section into the controller-side volume value converted by the first converting section;

a second input section into which an instruction for changing the controller-side volume value to be displayed on the display device by the display section is input by a user's operation;

a second converting section for, when the instruction for changing the controller-side volume value to be displayed on the display device by the display section is input by the user's operation, converting the changed controller-side volume value into the amplifier-side volume value; and a second transmitting section for transmitting the amplifier-side volume value converted by the second converting section to the amplifying apparatus, wherein the first converting section converts the amplifier-side volume value into the controller-side volume value based on a controller-side maximum volume value, a controller-side minimum volume value, an amplifier-side setting maximum volume value that is a maximum value of an amplifier-side volume value controllable by the controller and is smaller than an amplifier-side maximum volume value as a maximum value of an amplifier-side volume value controllable by the first input section, and an amplifier-side setting minimum volume value (or the amplifier-side minimum volume value) that is a minimum value of an amplifier-side volume value controllable by the controller and is larger than an amplifier-side minimum volume value as a minimum value of the amplifier-side volume value controllable by the first input section, the second converting section converts the controller-side volume value into the amplifier-side volume value based on the controller-side maximum volume value, the controller-side minimum volume value, the amplifier-side setting maximum volume value, and the amplifier-side setting minimum volume value (or the amplifier-side minimum volume value).

5. A controller in a volume control system, the volume control system including an amplifying apparatus and the controller connectable to the amplifying apparatus, the amplifying apparatus having a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, a volume control section for, when the first receiving section receives the amplifier-side volume value or the changed amplifier-side volume value is input into the first input section, controlling a volume value of the amplifying apparatus based on the amplifier-side volume value, and a second transmitting section for transmitting an amplifier-side maximum volume value as a maximum value of an amplifier-side volume value controllable by the first input section, and an amplifier-side minimum volume value as a minimum value of the amplifier-side volume value controllable by the first input section to the controller, the controller comprising:

a storage section for storing a controller-side volume value in a storage device;

a second receiving section for receiving the amplifier-side volume value, the amplifier-side maximum volume value, and the amplifier-side minimum volume value from the amplifying apparatus;

a display section for changing a controller-side maximum volume value into the amplifier-side maximum volume value and changing a controller-side minimum volume value into the amplifier-side minimum volume value so as to display the amplifier-side volume value instead of the controller-side volume value on a display device;

a changing section for changing the amplifier-side volume value to be displayed on the display device by the display section into the amplifier-side volume value received by the second receiving section;

a second input section into which an instruction for changing the amplifier-side volume value to be displayed on the display device by the display section is input by a user's operation; and a second transmitting section for, when the instruction for changing the amplifier-side volume value to be displayed on the display device by the display section is input by the user's operation, transmitting the changed amplifier-side volume value to the amplifying apparatus.

6. The controller according to claim 5, further comprising:

a second storage section for storing the amplifier-side volume value to be displayed on the display device by the display section at the time of disconnection between the controller and the amplifying apparatus in a storage device, wherein when the controller and the amplifying apparatus are connected to each other, the changing section changes the amplifier-side volume value to be displayed on the display device by the display section into the amplifier-side volume value stored by the second storage section, and the second transmitting section transmits the amplifier-side volume value stored by the second storage section to the amplifying apparatus.

7. A controller in a volume control system, the volume control system including an amplifying apparatus and the controller connectable to the amplifying apparatus, the amplifying apparatus having a first receiving section for receiving an amplifier-side volume value from the controller, a first input section into which an instruction for changing the amplifier-side volume value is input by a user's operation, a first transmitting section for, when the instruction for changing the amplifier-side volume value is input by the user's operation, transmitting the changed amplifier-side volume value to the controller, a volume control section for, when the first receiving section receives the amplifier-side volume value or the changed amplifier-side volume value is input into the first input section, controlling a volume value of the amplifying apparatus based on the amplifier-side volume value, and a second transmitting section for transmitting an amplifier-side setting maximum volume value that is a maximum value of an amplifier-side volume value controllable by the controller and is smaller than an amplifier-side maximum volume value as a maximum value of an amplifier-side volume value controllable by the first input section, and an amplifier-side setting minimum volume value (or the amplifier-side minimum volume value) that is a minimum value of an amplifier-side volume value controllable by the controller and is larger than an amplifier-side minimum volume value as a minimum value of an amplifier-side volume value controllable by the first input section to the controller, the controller comprising:

a storage section for storing a controller-side volume value in a storage device;

a second receiving section for receiving the amplifier-side volume value, the amplifier-side setting maximum volume value, and the amplifier-side setting minimum volume value (or the amplifier-side minimum volume value) from the amplifying apparatus;

a display section for changing a controller-side maximum volume value into the amplifier-side setting maximum volume value and changing a controller-side minimum volume value into the amplifier-side setting minimum volume value (or the amplifier-side minimum volume value) so as to display the amplifier-side volume value instead of the controller-side volume value on a display device;

a changing section for changing the amplifier-side volume value to be displayed on the display device by the display section into the amplifier-side volume value received by the second receiving section;

a second input section into which an instruction for changing the amplifier-side volume value to be displayed on the display device by the display section is input by a user's operation; and a second transmitting section for, when the instruction for changing the amplifier-side volume value to be displayed on the display device by the display section is input by the user's operation, transmitting the changed amplifier-side volume value to the amplifying apparatus.

8. The controller according to claim 7, further comprising:

a second storage section for storing the amplifier-side volume value to be displayed on the display device by the display section at the time of disconnection between the controller and the amplifying apparatus in a storage device, wherein when the controller and the amplifying apparatus are connected to each other, the changing section changes the amplifier-side volume value to be displayed on the display device by the display section into the amplifier-side volume value stored by the second storage section, and the second transmitting section transmits the amplifier-side volume value stored by the second storage section to the amplifying apparatus.

9. A volume control system comprising:

an amplifying apparatus; and a controller connectable to the amplifying apparatus, wherein the amplifying apparatus includes;

a first receiving section for receiving a volume value from the controller, a first input section into which an instruction for changing the volume value is input by a user's operation, a first transmitting section for transmitting the volume value input into the first input section to the controller, and a volume control section for, when the first receiving section receives the volume value or the changed volume value is input into the first input section, controlling a volume value of the amplifying apparatus based on the volume value, the controller includes;

a display section for displaying the volume value on a display device, a second receiving section for receiving the volume value from the amplifying apparatus, a changing section for changing the volume value to be displayed on the display device by the display section into the volume value received by the second receiving section;

a second input section into which an instruction for changing the volume value to be displayed on the display device by the display section is input by a user's operation; and a second transmitting section for, when the instruction for changing the volume value to be displayed on the display device by the display section is input by the user's operation, transmitting the changed volume value to the amplifying apparatus, wherein a plurality of controllers can be connected to the amplifying apparatus, in one of the controllers, when an instruction for changing the volume value to be displayed on the display device by the display section is input by a user's operation, the changed volume value is transmitted to the amplifying apparatus, in the amplifying apparatus, the volume control section controls the volume value of the amplifying apparatus based on the received volume value, and the first transmitting section transmits the volume value to the controllers other than the controller that transmits the volume value, in the controllers other than the controller that transmits the volume value, the changing section changes the volume value to be displayed on the display device by the display section into the volume value received from the amplifying apparatus.

10. A volume control system comprising:

an amplifying apparatus; and a controller connectable to the amplifying apparatus, wherein the amplifying apparatus includes;

a first receiving section for receiving a volume value from the controller, a first input section into which an instruction for changing the volume value is input by a user's operation, a first transmitting section for transmitting the volume value input into the first input section to the controller, and a volume control section for, when the first receiving section receives the volume value or the changed volume value is input into the first input section, controlling a volume value of the amplifying apparatus based on the volume value, the controller includes;

a display section for displaying the volume value on a display device, a second receiving section for receiving the volume value from the amplifying apparatus, a changing section for changing the volume value to be displayed on the display device by the display section into the volume value received by the second receiving section;

a second input section into which an instruction for changing the volume value to be displayed on the display device by the display section is input by a user's operation; and a second transmitting section for, when the instruction for changing the volume value to be displayed on the display device by the display section is input by the user's operation, transmitting the changed volume value to the amplifying apparatus, wherein a plurality of controllers can be connected to the amplifying apparatus, in one of the controllers, when an instruction for changing the volume value to be displayed on the display device by the display section is input by a user's operation, the changed volume value is transmitted to the amplifying apparatus and the other controllers, in the amplifying apparatus, the volume control section controls the volume value of the amplifying apparatus based on the received volume value, in the controllers other than the controller whose volume value is transmitted, the changing section changes the volume value to be displayed on the display device by the display section into the volume value received from the controller.

\* \* \* \* \*